United States Patent
Valcore, Jr. et al.

(10) Patent No.: US 10,325,759 B2
(45) Date of Patent: Jun. 18, 2019

(54) MULTIPLE CONTROL MODES

(71) Applicant: Lam Research Corporation, Fremont, CA (US)

(72) Inventors: John C. Valcore, Jr., Fremont, CA (US); Eric Allen Hudson, Berkeley, CA (US); Ryan Bise, Los Gatos, CA (US)

(73) Assignee: Lam Research Corporation, Fremont, CA (US)

(*) Notice: Subject to any disclaimer, the term of this patent is extended or adjusted under 35 U.S.C. 154(b) by 48 days.

(21) Appl. No.: 15/369,110

(22) Filed: Dec. 5, 2016

(65) Prior Publication Data

US 2017/0084432 A1    Mar. 23, 2017

Related U.S. Application Data

(63) Continuation-in-part of application No. 14/260,051, filed on Apr. 23, 2014, now Pat. No. 10,157,729, and
(Continued)

(51) Int. Cl.
*H01J 37/32* (2006.01)

(52) U.S. Cl.
CPC .... *H01J 37/32935* (2013.01); *H01J 37/3299* (2013.01); *H01J 37/32146* (2013.01);
(Continued)

(58) Field of Classification Search
None
See application file for complete search history.

(56) References Cited

U.S. PATENT DOCUMENTS 4,353,777 A   10/1982   Jacob
4,377,961 A    3/1983   Bode
(Continued)

FOREIGN PATENT DOCUMENTS

CN    101110347 A    1/2008
EP      0363982 A    4/1990
(Continued)

OTHER PUBLICATIONS

"Electromagnetic Waves and Antennas", Sophocles J. Orfanidis, Rutgers University, Aug. 25, 2013, Chapter 10.10.
(Continued)

*Primary Examiner* — Dion Ferguson
*Assistant Examiner* — Srinivas Sathiraju
(74) *Attorney, Agent, or Firm* — Penilla IP, APC

(57) ABSTRACT

Systems and methods for using variables based on multiple states associated with a plasma system are described. A method includes determining whether the state associated with the plasma system is a first, second, or third state and determining a first variable upon determining that the state is the first state. The method further includes determining a second variable upon determining that the state is the second state and determining a third variable upon determining that the state is the third state. The method includes determining whether each of the first variable, the second variable, and the third variable is within a corresponding range from a corresponding threshold. The method includes providing an instruction to change power supplied to a plasma chamber upon determining that the first, second, or third variable is outside the corresponding range from the corresponding threshold.

15 Claims, 25 Drawing Sheets

Related U.S. Application Data a continuation-in-part of application No. 14/184,654, filed on Feb. 19, 2014, now Pat. No. 9,530,620, which is a continuation-in-part of application No. 14/184,639, filed on Feb. 19, 2014, now Pat. No. 9,842,725, and a continuation-in-part of application No. 13/756,390, filed on Jan. 31, 2013, now Pat. No. 9,502,216, said application No. 14/260,051 is a continuation-in-part of application No. 13/666,912, filed on Nov. 1, 2012, now Pat. No. 9,171,699, and a continuation-in-part of application No. 13/620,386, filed on Sep. 14, 2012, now Pat. No. 9,197,196, said application No. 13/666,912 is a continuation-in-part of application No. 13/550,719, filed on Jul. 17, 2012, now Pat. No. 9,368,329, said application No. 13/620,386 is a continuation-in-part of application No. 13/531,491, filed on Jun. 22, 2012, now Pat. No. 9,114,666.

(60) Provisional application No. 61/799,594, filed on Mar. 15, 2013, provisional application No. 61/799,969, filed on Mar. 15, 2013, provisional application No. 61/701,560, filed on Sep. 14, 2012, provisional application No. 61/602,040, filed on Feb. 22, 2012, provisional application No. 61/602,041, filed on Feb. 22, 2012.

(52) U.S. Cl.
CPC .. *H01J 37/32183* (2013.01); *H01J 37/32449* (2013.01); *H01J 37/32816* (2013.01); *H01J 37/32926* (2013.01)

(56) References Cited

U.S. PATENT DOCUMENTS

| | | |
|---|---|---|
| 4,420,790 A | 12/1983 | Golke et al. |
| 4,454,001 A | 6/1984 | Sternheim et al. |
| 4,457,820 A | 7/1984 | Bergeron et al. |
| 4,500,563 A | 2/1985 | Ellenberger et al. |
| 5,474,648 A | 12/1995 | Patrick et al. |
| 5,479,340 A | 12/1995 | Fox et al. |
| 5,556,549 A | 9/1996 | Patrick et al. |
| 5,571,366 A | 11/1996 | Ishii et al. |
| 5,689,215 A | 11/1997 | Richardson et al. |
| 5,694,207 A | 12/1997 | Hung et al. |
| 5,737,177 A | 4/1998 | Mett et al. |
| 5,764,471 A | 6/1998 | Burkhart |
| 5,788,801 A | 8/1998 | Barbee et al. |
| 5,810,963 A | 9/1998 | Tomioka |
| 5,812,361 A | 9/1998 | Jones |
| 5,866,985 A | 2/1999 | Coultas et al. |
| 5,889,252 A | 3/1999 | Williams et al. |
| 5,892,198 A | 4/1999 | Barnes et al. |
| 5,894,400 A | 4/1999 | Graven |
| 5,980,767 A | 11/1999 | Koshimizu et al. |
| 5,989,999 A | 11/1999 | Levine et al. |
| 6,020,794 A | 2/2000 | Wilbur |
| 6,021,672 A | 2/2000 | Lee |
| 6,042,686 A | 3/2000 | Dible et al. |
| 6,048,435 A | 4/2000 | DeOrnellas et al. |
| 6,110,214 A | 8/2000 | Klimasauskas |
| 6,157,867 A | 12/2000 | Hwang et al. |
| 6,198,616 B1 | 3/2001 | Dahimene et al. |
| 6,246,972 B1 | 6/2001 | Klimasauskas |
| 6,441,555 B1 | 8/2002 | Howald et al. |
| 6,472,822 B1 | 10/2002 | Chen et al. |
| 6,522,121 B2 | 2/2003 | Coumou |
| 6,535,785 B2 | 3/2003 | Johnson et al. |
| 6,552,121 B2 | 4/2003 | Grigsby, Jr. |
| 6,597,002 B1 | 7/2003 | Kondo |
| 6,669,783 B2 | 12/2003 | Sexton et al. |
| 6,677,246 B2 | 1/2004 | Scanlan et al. |
| 6,750,711 B2 | 6/2004 | Chawla et al. |
| 6,781,317 B1 | 8/2004 | Goodman |
| 6,823,815 B2 | 11/2004 | Han et al. |
| 6,830,650 B2 | 12/2004 | Roche |
| 6,838,635 B2 | 1/2005 | Hoffman et al. |
| 6,862,557 B2 | 3/2005 | Jones et al. |
| 6,873,114 B2 | 3/2005 | Avoyan et al. |
| 6,972,524 B1 | 12/2005 | Marakhtanov et al. |
| 6,983,215 B2 | 1/2006 | Coumou et al. |
| 7,042,311 B1 | 5/2006 | Hilliker et al. |
| 7,122,965 B2 | 10/2006 | Goodman |
| 7,169,625 B2 | 1/2007 | Davis et al. |
| 7,192,505 B2 | 3/2007 | Roche |
| 7,323,116 B2 | 1/2008 | Guiney et al. |
| 7,359,177 B2 | 4/2008 | Yang et al. |
| 7,361,287 B2 | 4/2008 | Laermer |
| 7,375,038 B2 | 5/2008 | Kumar |
| 7,435,926 B2 | 10/2008 | Jafarian-Tehrani |
| 7,459,100 B2 | 12/2008 | Kiermasz et al. |
| 7,480,571 B2 | 1/2009 | Howald et al. |
| 7,505,879 B2 | 3/2009 | Tomoyasu et al. |
| 7,728,602 B2 | 6/2010 | Valcore et al. |
| 7,764,140 B2 | 7/2010 | Nagarkatti et al. |
| 7,768,269 B2 | 8/2010 | Pipitone et al. |
| 7,858,898 B2 | 12/2010 | Bailey, III et al. |
| 7,967,944 B2 | 6/2011 | Shannon et al. |
| 8,040,068 B2 | 10/2011 | Coumou |
| 8,053,991 B2 | 11/2011 | Kim et al. |
| 8,080,168 B2 | 12/2011 | Cirigliano |
| 8,080,760 B2 | 12/2011 | Dhindsa et al. |
| 8,103,492 B2 | 1/2012 | Brcka |
| 8,264,238 B1 | 9/2012 | El-Chouelry |
| 8,271,121 B2 | 9/2012 | Venugopal et al. |
| 8,368,308 B2 | 2/2013 | Banna et al. |
| 8,404,598 B2 | 3/2013 | Liao et al. |
| 8,501,631 B2 * | 8/2013 | Valcore, Jr. ........ H01J 37/32082 438/729 |
| 8,679,358 B2 | 3/2014 | Nakagawa |
| 8,901,935 B2 | 12/2014 | Valcore et al. |
| 9,295,148 B2 * | 3/2016 | Fong ................ H01J 37/32091 |
| 9,320,126 B2 * | 4/2016 | Valcore, Jr. ............ H05H 1/46 |
| 9,390,893 B2 * | 7/2016 | Valcore, Jr. ........ H01J 37/32183 |
| 9,455,126 B2 * | 9/2016 | Valcore, Jr. ........ H01J 37/32082 |
| 9,620,334 B2 * | 4/2017 | Lyndaker .......... H01J 37/32183 |
| 9,620,337 B2 * | 4/2017 | Valcore, Jr. ........ H01J 37/32917 |
| 9,627,186 B2 * | 4/2017 | Valcore, Jr. ........ H01J 37/32935 |
| 9,673,026 B2 * | 6/2017 | Valcore, Jr. ........ H01J 37/32165 |
| 9,779,196 B2 * | 10/2017 | Valcore, Jr. .......... G06F 17/5063 |
| 9,812,294 B2 * | 11/2017 | Valcore, Jr. ........ H01J 37/32183 |
| 9,831,065 B2 * | 11/2017 | Fong ................ H01J 37/32091 |
| 9,947,513 B2 * | 4/2018 | Valcore, Jr. ........ H01J 37/32165 |
| 9,997,333 B2 * | 6/2018 | Valcore, Jr. ........ H01J 37/32183 |
| 2002/0186001 A1 | 12/2002 | Lee |
| 2003/0082835 A1 | 5/2003 | McChesney et al. |
| 2003/0103793 A1 | 6/2003 | Murakoshi et al. |
| 2003/0119308 A1 | 6/2003 | Geefay et al. |
| 2004/0007326 A1 | 1/2004 | Roche |
| 2004/0028837 A1 | 2/2004 | Fink |
| 2004/0045506 A1 | 3/2004 | Chen et al. |
| 2004/0060660 A1 | 4/2004 | Klimechy et al. |
| 2004/0061448 A1 | 4/2004 | Avoyan et al. |
| 2004/0087047 A1 | 5/2004 | Jaiswal et al. |
| 2004/0107906 A1 | 6/2004 | Collins et al. |
| 2004/0135590 A1 | 7/2004 | Quon |
| 2004/0222184 A1 | 11/2004 | Hayami et al. |
| 2004/0226657 A1 | 11/2004 | Hoffman |
| 2005/0011611 A1 | 1/2005 | Mahoney |
| 2005/0034812 A1 | 2/2005 | Roche |
| 2005/0039852 A1 | 2/2005 | Roche |
| 2005/0057165 A1 | 3/2005 | Goodman |
| 2005/0090118 A1 | 4/2005 | Shannon et al. |
| 2005/0133163 A1 | 6/2005 | Shannon et al. |
| 2005/0134186 A1 | 6/2005 | Brouk et al. |
| 2005/0151479 A1 | 7/2005 | Avoyan et al. |
| 2005/0205532 A1 | 9/2005 | Patrick et al. |
| 2005/0217797 A1 | 10/2005 | Jafarian-Tehrani |
| 2005/0241762 A1 | 11/2005 | Paterson et al. |
| 2005/0242279 A1 | 11/2005 | Verentchikov |
| 2005/0252884 A1 | 11/2005 | Lam et al. |

(56) References Cited

U.S. PATENT DOCUMENTS

| | | | |
|---|---|---|---|
| 2006/0054596 A1 | 3/2006 | Howard | |
| 2006/0065623 A1 | 3/2006 | Guiney et al. | |
| 2006/0065631 A1 | 3/2006 | Cheng et al. | |
| 2006/0065632 A1 | 3/2006 | Cheng et al. | |
| 2006/0088655 A1 | 4/2006 | Collins et al. | |
| 2006/0100824 A1 | 5/2006 | Moriya | |
| 2006/0169582 A1 | 8/2006 | Brown et al. | |
| 2006/0191880 A1 | 8/2006 | Kwon | |
| 2006/0231526 A1 | 10/2006 | Donohue | |
| 2006/0232471 A1 | 10/2006 | Coumou | |
| 2006/0278609 A1 | 12/2006 | Hoffman | |
| 2007/0127188 A1 | 6/2007 | Yang et al. | |
| 2007/0247074 A1 | 10/2007 | Paterson et al. | |
| 2007/0252580 A1 | 11/2007 | Dine et al. | |
| 2007/0262723 A1 | 11/2007 | Ikenouchi | |
| 2008/0081482 A1 | 4/2008 | Brcka | |
| 2008/0179297 A1 | 7/2008 | Bailey | |
| 2008/0241016 A1 | 10/2008 | Kato et al. | |
| 2009/0151871 A1 | 6/2009 | Pease et al. | |
| 2009/0255800 A1 | 10/2009 | Koshimizu | |
| 2009/0284156 A1 | 11/2009 | Banna et al. | |
| 2009/0294061 A1 | 12/2009 | Shannon et al. | |
| 2009/0295296 A1 | 12/2009 | Shannon et al. | |
| 2010/0099266 A1 | 4/2010 | Oswald et al. | |
| 2010/0136793 A1 | 6/2010 | Chen et al. | |
| 2010/0248488 A1 | 9/2010 | Agarwal et al. | |
| 2010/0252417 A1 | 10/2010 | Allen | |
| 2010/0270141 A1 | 10/2010 | Carter et al. | |
| 2010/0332201 A1 | 12/2010 | Albarede et al. | |
| 2011/0031216 A1 | 2/2011 | Liao et al. | |
| 2011/0097901 A1 | 4/2011 | Banna et al. | |
| 2011/0115492 A1 | 5/2011 | Valcore, Jr. et al. | |
| 2011/0118863 A1 | 5/2011 | Valcore, Jr. | |
| 2011/0137446 A1 | 6/2011 | Valcore, Jr. et al. | |
| 2012/0052689 A1 | 3/2012 | Tokashiki | |
| 2012/0073754 A1 | 3/2012 | De la Llera et al. | |
| 2012/0098575 A1 | 4/2012 | Boston | |
| 2012/0187844 A1 | 7/2012 | Hoffman et al. | |
| 2012/0227484 A1 | 9/2012 | Chen et al. | |
| 2012/0262064 A1 | 10/2012 | Nagarkatti et al. | |
| 2013/0180951 A1 | 7/2013 | Indrakanti et al. | |
| 2013/0213934 A1* | 8/2013 | Valcore, Jr. | H01J 37/32091 216/67 |
| 2014/0054268 A1 | 2/2014 | Chen et al. | |
| 2014/0076713 A1* | 3/2014 | Valcore, Jr. | H01J 37/32165 204/164 |
| 2014/0305589 A1 | 10/2014 | Valcore, Jr. et al. | |
| 2015/0002018 A1 | 1/2015 | Lill et al. | |
| 2015/0048740 A1* | 2/2015 | Valcore, Jr. | H01J 37/32183 315/111.21 |
| 2016/0276137 A1* | 9/2016 | Valcore, Jr. | H01J 37/32183 |
| 2017/0084432 A1* | 3/2017 | Valcore, Jr. | H01J 37/32926 |
| 2017/0103872 A1* | 4/2017 | Howald | H01J 37/32183 |
| 2017/0194130 A1* | 7/2017 | Lyndaker | H01J 37/32183 |
| 2018/0053632 A1* | 2/2018 | Fong | H01J 37/32091 |

FOREIGN PATENT DOCUMENTS

| | | |
|---|---|---|
| JP | S57131374 A | 8/1982 |
| JP | H06-338476 A | 12/1994 |
| JP | H07-142400 A | 6/1995 |
| JP | 08-020880 A | 1/1996 |
| JP | H10-041281 A | 2/1998 |
| JP | H10-074730 A | 3/1998 |
| JP | 2000-200771 A | 7/2000 |
| JP | 2001-127045 A | 5/2001 |
| JP | 2002-359232 A | 12/2002 |
| JP | 2004-239211 A | 8/2004 |
| JP | 2004-335594 A | 11/2004 |
| JP | 2005-130198 A | 5/2005 |
| JP | 2009-129398 A | 6/2009 |
| KR | 10-2005-0088438 A | 9/2005 |
| KR | 10-2005-0089995 A | 9/2005 |
| KR | 2005-284046 A | 10/2005 |
| KR | 10-2007-0031915 A | 3/2007 |
| WO | WO 1999/014699 A1 | 3/1999 |
| WO | WO 2000/026956 A1 | 5/2000 |
| WO | WO 2008/002938 A2 | 1/2008 |
| WO | WO 2012/054306 A2 | 4/2012 |
| WO | WO 2014/070838 A2 | 5/2014 |

OTHER PUBLICATIONS

Damon et al., "Synchronous Pulsed Plasma for Silicon Etch Applications", ECS Transactions, 27 (1) pp. 717-723 (2010), Publication by: The Electrochemical Society.

Lars Christoph, Comparison of Applied Materials DPS Chambers used for poly-Si Etch process by Plasma Parameters, Dec. 6, 2000, 2nd workshop on self excited electron plasma resonance spectroscopy, Dredsen Germany.

Christoph Steuer, TOOL Comparison at GC Stack Etch in LAM TCP Using Plasma Parameters (SEERS), Dec. 12, 2000, 2nd workshop on self excited electron plasma resonance spectroscopy, Dredsen Germany.

Blauw et al., "Ion Energy Selection With Pulse-Shaped RF-Bias", XXVIIth ICPIG, Eindhoven University of Technology, the Netherlands, Jul. 18-22, 2005, 4 pages.

Kure T, Gotoh Y, Kawakami H, Tachi S: "Highly Anisotropic Microwave Plasma Etching for High Packing Density Silicon", Jun. 2, 1992, IEEE, pp. 48-49 (2 pages).

\* cited by examiner

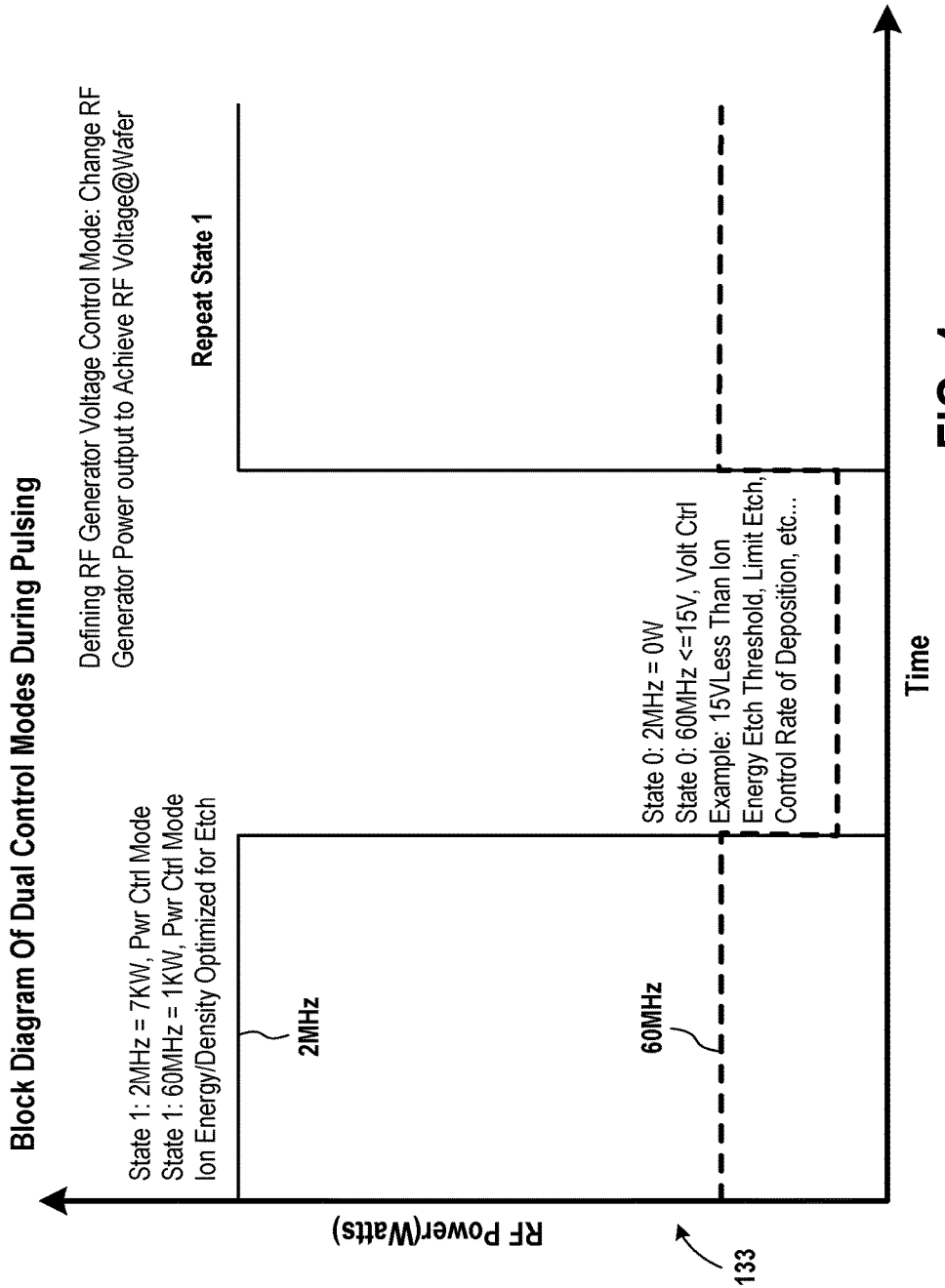

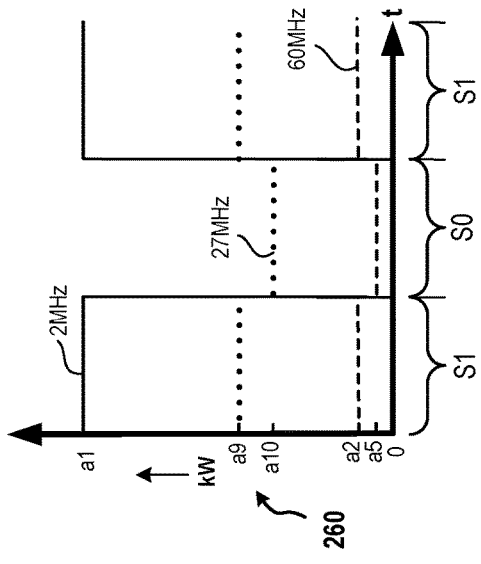
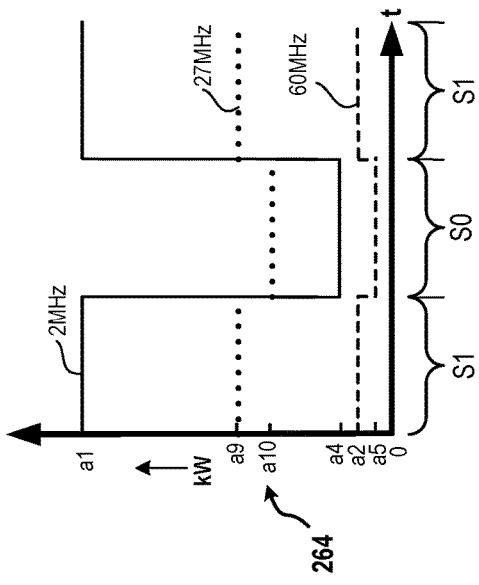
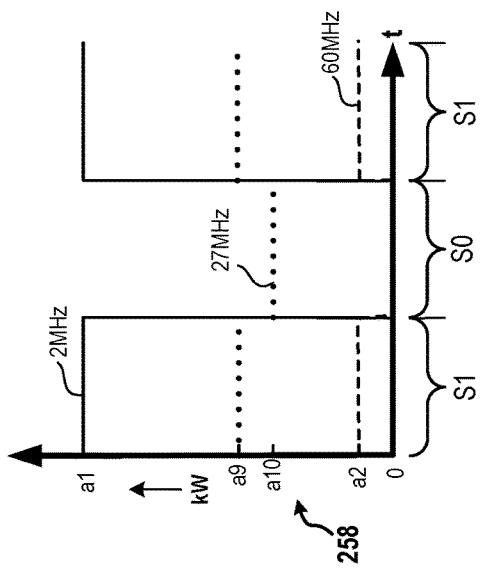
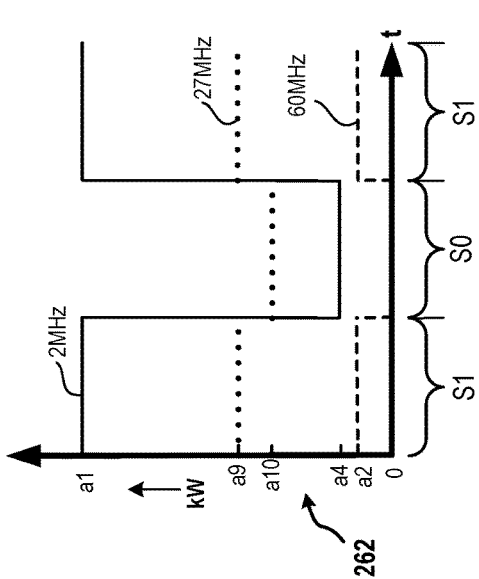
FIG. 6F

MULTIPLE CONTROL MODES

CLAIM OF PRIORITY

This application is a continuation-in-part of and claims the benefit of and priority, under 35 U.S.C. § 120, to application Ser. No. 14/184,654, filed on Feb. 19, 2014, and titled "Dual Control Modes", which claims the benefit of and priority, under 35 U.S.C. § 119(e), to U.S. Provisional Patent Application No. 61/799,594, filed on Mar. 15, 2013, and titled "Dual Control Modes", all of which are hereby incorporated by reference in their entirety.

The application Ser. No. 14/184,654 is a continuation-in-part of and claims the benefit of and priority, under 35 U.S.C. § 120, to application Ser. No. 14/184,639, filed on Feb. 19, 2014, and titled "Using Modeling To Determine Ion Energy Within A Plasma System", which claims the benefit of and priority, under 35 U.S.C. § 119(e), to U.S. Provisional Patent Application No. 61/799,969, filed on Mar. 15, 2013, and titled "Using Modeling To Determine Ion Energy Within A Plasma System", all of which are hereby incorporated by reference in their entirety.

The application Ser. No. 14/184,639 is a continuation-in-part of and claims the benefit of and priority, under 35 U.S.C. § 120, to U.S. patent application Ser. No. 13/756,390, filed on Jan. 31, 2013, and titled "Using Modeling to Determine Wafer Bias Associated With a Plasma System", now issued as U.S. Pat. No. 9,502,216, which is incorporated by reference herein in its entirety for all purposes.

This application is a continuation-in-part of and claims the benefit of and priority, under 35 U.S.C. § 120, to application Ser. No. 14/260,051, filed on Apr. 23, 2014, and titled "Soft Pulsing", which is a continuation-in-part of and claims the benefit of and priority, under 35 U.S.C. § 120, to application Ser. No. 13/666,912, filed on Nov. 1, 2012, and titled "Impedance Based Adjustment of Power and Frequency", now issued as U.S. Pat. No. 9,171,699, which claims the benefit of and priority, under 35 U.S.C. § 119(e), to U.S. Provisional Patent Application No. 61/701,560, filed on Sep. 14, 2012, and titled "Impedance-based Adjustment of Power and Frequency", all of which are incorporated by reference herein in their entirety for all purposes.

The application Ser. No. 13/666,912 is a continuation-in-part of and claims the benefit of and priority, under 35 U.S.C. § 120, to U.S. patent application Ser. No. 13/531,491, filed on Jun. 22, 2012, and titled "Methods and Apparatus For Controlling Plasma In A Plasma Processing System", now issued as U.S. Pat. No. 9,114,666, which is incorporated by reference herein in its entirety for all purposes.

The U.S. patent application Ser. No. 13/531,491 claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency Pulsing", which is incorporated by reference herein in its entirety for all purposes.

The U.S. patent application Ser. No. 13/531,491 claims the benefit of and priority, under 35 U.S.C. § 119(e), to U.S. Provisional Patent Application No. 61/602,041, filed on Feb. 22, 2012, and titled "Methods and Apparatus for Synchronizing RF Pulses In a Plasma Processing System", which is incorporated by reference herein in its entirety for all purposes.

The application Ser. No. 13/666,912 is a continuation-in-part of and claims the benefit of and priority, under 35 U.S.C. § 120, to U.S. patent application Ser. No. 13/550,719, filed on Jul. 17, 2012, and titled "Methods and Apparatus For Synchronizing RF Pulses In A Plasma Processing System", now issued as U.S. Pat. No. 9,368,329, which is incorporated by reference herein in its entirety for all purposes.

The application Ser. No. 14/260,051 is a continuation-in-part of and claims the benefit of and priority, under 35 U.S.C. § 120, to application Ser. No. 13/620,386, filed on Sep. 14, 2012, and titled "State-Based Adjustment of Power and Frequency", now issued as U.S. Pat. No. 9,197,196, which is incorporated by reference herein in its entirety for all purposes.

The application Ser. No. 13/620,386 is a continuation-in-part of and claims the benefit of and priority, under 35 U.S.C. § 120, to U.S. patent application Ser. No. 13/531,491, filed on Jun. 22, 2012, and titled "Methods and Apparatus For Controlling Plasma In A Plasma Processing System", which is incorporated by reference herein in its entirety.

FIELD

The present embodiments relate to using multiple control modes within a plasma system.

BACKGROUND

In a plasma system, a generator provides power to a plasma chamber. The power provided to the plasma chamber is used to clean or etch a substrate within the plasma chamber. To properly clean or etch the substrate, the plasma should be controlled.

It is in this context that embodiments described in the present disclosure arise.

SUMMARY

Embodiments of the disclosure provide apparatus, methods and computer programs for using multiple control modes within a plasma system. It should be appreciated that the present embodiments can be implemented in numerous ways, e.g., a process, an apparatus, a system, a device, or a method on a computer-readable medium. Several embodiments are described below.

In an embodiment, different variables are used to control impedance of plasma within a plasma chamber. For example, a first variable is used to control impedance of plasma during a state S1 and a second variable is used to control impedance of plasma during a state S0. The first variable is different than the second variable. For example, the first variable is radio frequency (RF) power and the second variable is RF voltage. As another example, the first variable is RF power and the second variable is ion energy.

In one embodiment, a method for using different variables based on a state associated with a plasma system is described. The method includes determining whether the state associated with the plasma system is a first state or a second state and determining a first variable upon determining that the state is the first state. The first variable is determined based on a measurement at a communication medium. The communication medium is located between an RF generator and a plasma chamber of the plasma system. The method further includes determining a second variable upon determining that the state is the second state. The second variable is determined based on a measurement at the communication medium. The method includes determining whether the second variable exceeds a first threshold, providing an instruction to reduce power supplied to the plasma chamber upon determining that the second variable exceeds the first threshold, and providing an instruction to increase power supplied to the plasma chamber upon determining that the second variable is below the first threshold. The method is executed by one or more processors.

In an embodiment, a method for using ion energy for states associated with a plasma system is described. The method includes determining whether the state associated with the plasma system is a first state or a second state, determining an ion energy associated with a plasma chamber upon determining that the state is the second state, and determining whether the ion energy matches a first ion energy threshold. The method further includes providing an instruction to change power supplied to the plasma chamber upon determining that the ion energy does not match the first ion energy threshold. The method is executed by one or more processors.

In one embodiment, a plasma system for using different variables based on a state associated with the system is described. The plasma system includes a plasma chamber. The plasma chamber includes a chuck supporting a substrate and an upper electrode located above the chuck. The plasma chamber further includes an impedance matching circuit coupled to the plasma chamber via a first communication medium and an RF generator coupled to the impedance matching circuit via a second communication medium. The plasma system includes a sensor. The sensor is coupled to the first communication medium for generating a first measurement and a second measurement from RF signals transferred via the first communication medium. The plasma system includes a processor coupled to the RF generator. The processor is configured to determine whether the state associated with the plasma system is a first state or a second state and determine a first variable upon determining that the state is the first state. The first variable is determined based on the first measurement. The processor is further configured to determine a second variable upon determining that the state is the second state. The second variable is determined based on the second measurement. The processor is further configured to determine whether the second variable exceeds a first threshold, provide an instruction to reduce power supplied to the plasma chamber upon determining that the second variable exceeds the first threshold, and provide an instruction to increase power supplied to the plasma chamber upon determining that the second variable is below the first threshold.

In an embodiment, a plasma system for using different variables based on a state associated with the system is described. The plasma system includes a plasma chamber. The plasma chamber includes a chuck for supporting a substrate and an upper electrode on top of the chuck. The plasma system further includes an impedance matching circuit coupled to the plasma chamber via a first communication medium. The plasma system includes an RF generator coupled to the impedance matching circuit via a second communication medium. The plasma system includes a sensor. The sensor is used for generating a first measurement and a second measurement from RF signals transferred via the first communication medium. The plasma system includes a processor coupled to the RF generator. The processor is configured to determine whether a state associated with the plasma system is a first state or a second state and determine an ion energy associated with the plasma chamber upon determining that the state is the second state. The ion energy is determined based on the first measurement. The processor is configured to determine whether the ion energy exceeds a first ion energy threshold and provide an instruction to reduce power supplied to the plasma chamber upon determining that the ion energy exceeds the first ion energy threshold. The processor is configured to provide an instruction to increase power supplied to the plasma chamber upon determining that the ion energy is below the first ion energy threshold.

In some embodiments, a method for controlling different variables during different states is described. The method includes determining whether a state associated with a plasma system is a first state, a second state, or a third state. The method further includes determining a first variable in response to determining that the state associated with the plasma system is the first state, determining a second variable in response to determining that the state associated with the plasma system is the second state, and determining a third variable in response to determining that the state associated with the plasma system is the third state. The method includes determining whether the first variable is within a range from a threshold value of the first variable, determining whether the second variable is within a range from a threshold value of the second variable, and determining whether the third variable is within a range from a threshold value of the third variable. The method includes providing an instruction to maintain power supplied by a radiofrequency (RF) generator of the plasma system upon determining that the first variable is within the range from the threshold value of the first variable. The method includes providing an instruction to change the power supplied by the RF generator upon determining that the first variable is outside the range from the threshold value of the first variable.

In some embodiments, a plasma system for using different variables based on a state associated with the plasma system is described. The plasma system includes a plasma chamber. The plasma chamber includes a chuck for supporting a substrate and an upper electrode located above the chuck. The plasma system further includes an impedance matching circuit coupled to the plasma chamber via a first communication medium and an RF generator coupled to the impedance matching circuit via an output and a second communication medium. The plasma system includes a sensor coupled to the output of the RF generator for generating a first measurement during a first state, a second measurement during a second state, and a third measurement during a third state from an RF signal transferred via the first communication medium. The plasma system further includes a processor coupled to the RF generator. The processor determines whether a state associated with the plasma system is the first state, the second state, or the third state. The processor further determines a first variable from the first measurement in response to determining that the state associated with the plasma system is the first state, determines a second variable from the second measurement in response to determining that the state associated with the plasma system is the second state, and determines a third variable from the third measurement in response to determining that the state associated with the plasma system is the third state. The processor determines whether the first variable is within a range from a threshold value of the first variable, determines whether the second variable is within a range from a threshold value of the second variable, and determines whether the third variable is within a range from a threshold value of the third variable. The processor provides an instruction to maintain power supplied by the RF generator upon determining that the first variable is within the range from the threshold value of the first variable. On the other hand, the processor provides an instruction to change power supplied by the RF generator upon determining that the first variable is outside the range from the threshold value of the first variable.

Some advantages of the above-described embodiments include controlling the plasma during the first state by using the first variable than by using the second variable. For example, during the first state, it is less important to control RF power that is provided to the plasma based on a measurement of ion energy or based on a measurement of RF voltage than based on a measurement of RF power. As another example, during the first state, high energy processes, e.g., high rate etching, low rate deposition, a combination of high rate etching and low rate deposition, etc., are performed and to perform the high energy processes, it is more important to control RF power based on measurement of RF power than measurement of ion energy and/or measurement of RF voltage. The RF voltage and/or the ion energy are less relevant in controlling of the high energy processes during the first state than the RF power. As another example, current is more important to be used during the first state than voltage to facilitate performance of the high energy processes. By controlling the plasma impedance during the first state with the first variable than the second variable, the use of voltage in controlling the plasma impedance is deemphasized and the use of current in controlling the plasma impedance is emphasized.

Additional advantages of the above-described embodiments include providing better control of plasma impedance by using, during the second state, the second variable that matters more than the first variable during the second state. For example, during the second state, it is more important to control RF power provided to the plasma chamber based on a measurement of ion energy or a measurement of RF voltage than based on a measurement of RF power. As another example, during the second state, low energy processes, e.g., high rate deposition, low rate etching, a combination of low rate etching and high rate deposition, etc., are performed and to perform the low energy processes, it is more important to control RF power based on a measurement of ion energy and/or RF voltage than based on RF power. As yet another example, current is less important to be used during the second state than voltage to facilitate performance of the low energy processes. By controlling the plasma impedance during the second state with the second variable than the first variable, the use of current in controlling the plasma impedance is deemphasized and the use of voltage in controlling the plasma impedance is emphasized.

Some advantages of the above-described embodiments include controlling the plasma during a state S(n–N–1) state by using an (n–N–1)th variable, controlling the plasma during a state S(n–N) state by using an (n–N)th variable, and controlling the plasma during a state Sn by using an nth variable. For example, during the state S(n–N–1), it is less important to control RF power that is provided to the plasma based on a measurement of RF voltage or based on a signal from an optical sensor than based on a measurement of RF power. Moreover, during the state S(n–N), it is less important to control RF power that is provided to the plasma based on a measurement of RF power or based on a measurement of RF voltage than based on the signal from the optical sensor. Also, during the state n, it is less important to control RF power that is provided to the plasma based on a measurement of RF power or based on a measurement of the signal from the optical sensor than based on a measurement of RF voltage. The RF voltage is less relevant in controlling of the high energy processes and the RF power is less relevant in controlling the low energy processes. The high energy processes occur during the state S(n) and the low energy processes occur during the state S(n–N–1). Moreover, the signal from the optical sensor takes into account pulsing of one or more process gases and of RF power.

As another example, during the state S(n–N–1), it is less important to control RF power that is provided to the plasma based on a measurement of RF power or based on a signal from the optical sensor than based on a measurement of RF voltage. Moreover, during the state S(n–N), it is less important to control RF power that is provided to the plasma based on a measurement of RF power or based on a measurement of RF voltage than based on the signal from the optical sensor. Also, during the state Sn, it is less important to control RF power that is provided to the plasma based on a measurement of RF voltage or based on a measurement of the signal from the optical sensor than based on a measurement of RF power. The RF voltage is less relevant in controlling of the high energy processes and the RF power is less relevant in controlling the low energy processes. The high energy processes occur during the state S(n–N–1) and the low energy processes occur during the state Sn.

Furthermore, advantages of the above-described embodiments include providing better control of plasma impedance by using ion energy. Both RF voltage and direct current (DC) bias potential are used to determine the ion energy. The DC bias potential is a function of voltage and current. When both voltage and current are used to determine an amount of power by which to control plasma impedance, control of the plasma impedance is more accurately done than when voltage is used to control the plasma impedance. Also, when both DC bias and RF voltage are used to determine power to be used to control plasma impedance, the control is more accurately exercised compared to when the DC bias or the RF voltage is used. Hence, the ion energy provides better control of plasma impedance of plasma within the plasma chamber.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 4 is a graph that plots radio frequency (RF) power that is provided by 2 MHz and 60 MHz RF generators to an electrode of a plasma chamber versus time, in accordance with an embodiment described in the present disclosure.

FIG. 6F shows graphs with all three RF signals have varying values, in accordance with an embodiment described in the present disclosure.

DETAILED DESCRIPTION

The following embodiments describe systems and methods for using dual control modes within a plasma system. It will be apparent that the present embodiments may be practiced without some or all of these specific details. In other instances, well known process operations have not been described in detail in order not to unnecessarily obscure the present embodiments.

Figure 1A:
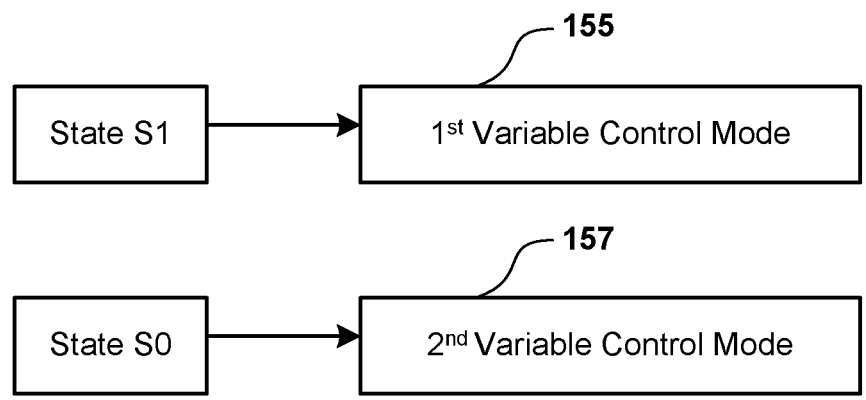
FIG. 1A is a diagram that is used to illustrate systems and methods for using different variables based on a state associated with a plasma system, in accordance with an embodiment described in the present disclosure.

FIG. 1A is a diagram that is used to illustrate systems and methods for using variables based on a state associated with a plasma system. When a state associated with the plasma system is S1, the plasma system is operated in a first variable control mode 155. Examples of the state S1 include a high value, a state having a value of 1, and an on state, etc. During the first variable control mode 155, a first variable associated with plasma of the plasma system is measured and impedance of the plasma is controlled based on one or more values of the first variable. Examples of the first variable include voltage, current, power, impedance, ion energy, bias potential, and a combination thereof.

Moreover, when a state associated with the plasma system is S0, the plasma system is operated in a second variable control mode 157. Examples of the state S0 include a low value, a state having a value of 0, and an off state, etc. The low value is less than the high value. During the second variable control mode 157, a second variable associated with plasma of the plasma system is measured and impedance of the plasma is controlled based on one or more values of the second variable. Examples of the second variable include voltage, current, power, impedance, ion energy, bias potential, and a combination thereof.

In various embodiments, power includes supplied power or reflected power or delivered power. Supplied power is power that is supplied by an RF generator via an impedance matching circuit and an RF transmission line to a plasma chamber. Reflected power is power that is reflected from a plasma chamber via the RF transmission line and an impedance matching circuit to the RF generator. Delivered power is a difference between supplied power and reflected power.

In some embodiments, the second variable is other than the first variable. For example, the second variable is not the same as the first variable. To illustrate, when the first variable is power associated with plasma within the plasma system, the second variable is ion energy associated with the plasma. To further illustrate, when the first variable is power associated with plasma within the plasma system, the second variable is a radio frequency (RF) voltage associated with the plasma. As yet another illustration, when the first variable is RF current associated with plasma within the plasma system, the second variable is RF voltage associated with the plasma or ion energy associated with the plasma. As another illustration, when the first variable is bias potential associated with plasma within the plasma system, the second variable is RF voltage associated with the plasma or ion energy associated with the plasma.

In various embodiments, the first variable is the same as the second variable. For example, both the first and second variables are RF power, RF voltage, or ion energy.

Figure 1B:
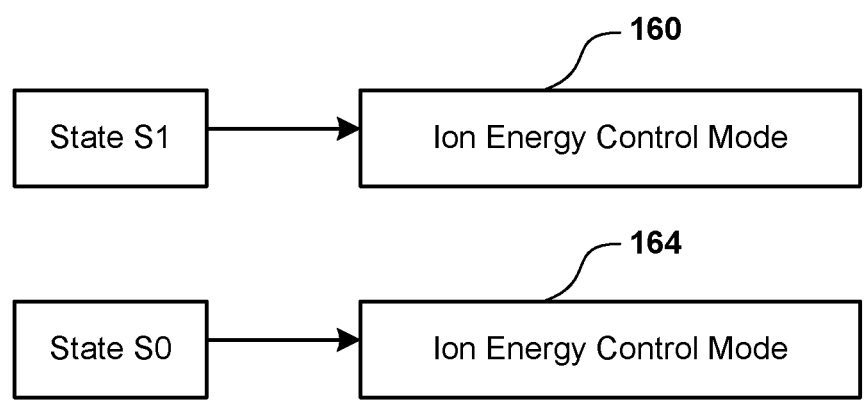
FIG. 1B is a diagram that is used to illustrate systems and methods for using ion energy during both states associated with a plasma system, in accordance with an embodiment described in the present disclosure.

FIG. 1B is a diagram illustrating use of ion energy control modes 160 and 164 during both the states S1 and S0. During each ion energy control mode 160, ion energy associated with plasma within the plasma system is controlled. For example, ion energy associated with plasma within the plasma system is measured or determined and impedance of the plasma is controlled based on one or more values of the ion energy.

Figure 2:
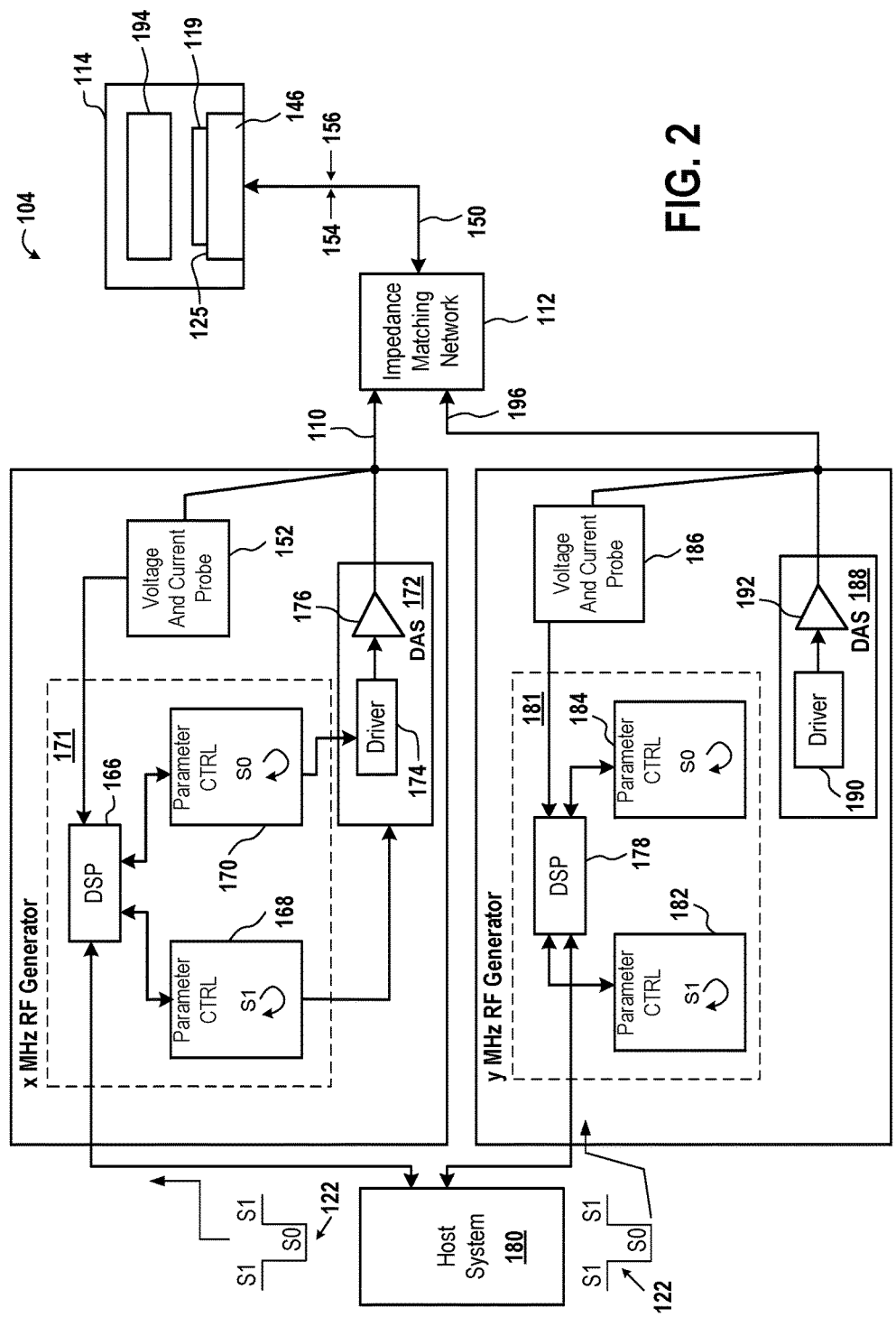
FIG. 2 is a block diagram of an embodiment of a plasma system, in accordance with an embodiment described in the present disclosure.

FIG. 2 is a block diagram of an embodiment of a plasma system 104. The plasma system 104 includes a host system 180 that is coupled to an x MHz RF generator and to a y MHz RF generator. Examples of x MHz include 2 MHz, 27 MHz, and 60 MHz. Examples of y MHz include 2 MHz, 27 MHz, and 60 MHz. In some embodiments, x MHz is different than y MHz. For example, when x MHz is 2 MHz, y MHz is 27 or 60 MHz. As another example, when x MHz is 27 MHz, y MHz is 60 MHz. In some embodiments, instead of the x MHz RF generator, a kilohertz (kHz) RF generator, e.g., a 400 kHz, RF generator is used. In an embodiment, the host system 180 is coupled to any number of RF generators. Examples of the host system 180 include a computing device, e.g., a desktop computer, a laptop computer, a smart phone, a tablet, etc.

The plasma system 104 further includes an impedance matching network 112 and a plasma chamber 114. The impedance matching network 112 includes electric circuit components, e.g., inductors, capacitors, etc. to match an impedance of a load coupled to the impedance matching network 112 with an impedance of a source coupled to the network 112. For example, the impedance matching network 112 matches an impedance of one or more parts, e.g., the plasma chamber 114, an RF transmission line 150, etc., of the plasma system 104 that are coupled to the impedance matching network 112 on one side with one or more parts, e.g., the x MHz RF generator, the y MHz RF generator, communication mediums 110 and 196, etc., of the plasma system 104 that are coupled to the impedance matching network 112 on another side. In one embodiment, the impedance matching network 112 is tuned to facilitate a match between an impedance of the load with an impedance of the source. An impedance match between a load and a source reduces chances of power being reflected from the load towards the source. Examples of a communication medium include an RF rod, a cable, a wire, an RF strap, or any other conductive device that facilitates transfer of an RF signal.

The plasma chamber 114 includes an electrostatic chuck (ESC) 146, an upper electrode 194, and other parts (not shown), e.g., an upper dielectric ring surrounding the upper electrode 194, an upper electrode extension surrounding the upper dielectric ring, a lower dielectric ring surrounding a lower electrode of the ESC 146, a lower electrode extension surrounding the lower dielectric ring, an upper plasma exclusion zone (PEZ) ring, a lower PEZ ring, etc. The upper electrode 194 is located opposite to, on top of, and facing the ESC 146. A work piece 119, e.g., a substrate, etc., is supported on an upper surface 125 of the ESC 146. An example of a substrate includes a semiconductor wafer. Another example of a substrate includes a wafer on which electrical circuitry, e.g., circuitry including transistors, resistors, capacitors, logic gates, etc., is fabricated. Integrated circuits, e.g., application specific integrated circuit (ASIC), programmable logic device (PLD), etc. are developed on the work piece 119 and the integrated circuits are used in a variety of electronic devices, e.g., cell phones, tablets, smart phones, computers, laptops, networking equipment, etc. Each of the upper electrode 194 and the lower electrode is made of a metal, e.g., aluminum, alloy of aluminum, copper, etc.

In one embodiment, the upper electrode 194 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc.

In some embodiments, the upper electrode 194 is grounded.

The ESC 146 is coupled to the x MHz RF generator and the y MHz RF generator via the impedance matching network 112, the RF transmission line 150, and communication mediums 110 and 196. The RF transmission line 150 includes one or more communication mediums, e.g., RF rods, RF straps, cables, wires, connectors, or a combination thereof, etc., to transfer an RF signal between the impedance matching network 112 and the plasma chamber 114.

When the process gas is supplied between the upper electrode 194 and the ESC 146 and when the x MHz RF generator and/or the y MHz RF generator supplies power via the impedance matching network 112 to the ESC 146, the process gas is ignited to generate plasma within the plasma chamber 114.

The host system 180 generates a digital pulsing signal 122 that has two states S1 and S0. In one embodiment, a state associated with the plasma system 104 is the same as the state of the digital pulsing signal 122. As an example, the digital pulsing signal 122 has a 50% duty cycle, one for a state. As another example, the digital pulsing signal 122 has a duty cycle other than 50%. In this example, the higher duty cycle is for one state and the lower duty cycle is for another state. In one embodiment, instead of using the host system 180 to generate the digital pulsing signal 122, a clock source, e.g., an oscillator, is used to generate a clock signal, which is an example of the digital pulsing signal 122.

The digital pulsing signal 122 is sent by the host system 180 to a digital signal processor (DSP) 166 of the x MHz RF generator and to a DSP 178 of the y MHz RF generator. Examples of a processor include an ASIC, a PLD, a microprocessor, a microcontroller, a central processing unit (CPU), etc.

Upon receiving the digital pulsing signal 122, each DSP 166 and 178 determines whether a state of the digital pulsing signal 122 is S1 or S0. For example, the DSP 166 distinguishes between the states S0 and S1. As another example, the DSP 166 determines that the digital pulsing signal 122 has a first magnitude, e.g., the value of 1, the high value, etc., during a first set of time periods and has a second magnitude, e.g., the value of 0, the low value, etc., during a second set of time periods. The DSP 166 determines that the digital pulsing signal 122 has the state S1 during the first set of time periods and has the state S0 during the second set of time periods. As yet another example, the DSP 166 compares a magnitude of the digital pulsing signal 122 with a pre-stored value to determine that the magnitude of the digital pulsing signal 122 is greater than the pre-stored value during the first set of time periods and that the magnitude during the state S0 of the digital pulsing signal 122 is not greater than the pre-stored value during the second set of time periods. In the embodiment in which the clock oscillator is used, the DSP 166 receives an analog clock signal from the clock oscillator, converts the analog signal into a digital form, and then identifies the two states S0 and S1.

When the state associated with the plasma system 104 is S1, the DSP 166 generates a parameter value Px1 and provides the parameter value Px1 to a parameter control 168 of the x MHz RF generator. Examples of a parameter include frequency, power, etc. Moreover, when the state associated with the plasma system 104 is S1, a DSP 178 of the y MHz RF generator generates a parameter value Py1 and provides the parameter value Py1 to a parameter control 182 of the y MHz RF generator.

Similarly, when the state associated with the plasma system 104 is S0, the DSP 166 generates a parameter value Px0 and provides the parameter value Px0 to a parameter control 170 of the x MHz RF generator. Also, when the state associated with the plasma system 104 is S0, the DSP 178 generates a parameter value Py0 and provides the parameter value Py0 to a parameter control 184 of the y MHz RF generator.

It should be noted that in one embodiment, a parameter control of an RF generator is a portion of a computer program that is embodied within a computer-readable medium and that is executed by a DSP of the RF generator. For example, the parameter control 168 and the parameter control 170 are logic blocks, e.g., tuning loops, which are portions of a computer program that is executed by the DSP 166. As another example, the parameter control 182 and the parameter control 184 are logic blocks of a computer program that is executed by the DSP 178.

In some embodiments, a computer program is embodied within a non-transitory computer-readable medium, e.g., a storage device. Examples of a storage device include a read-only memory (ROM), a random access memory (RAM), or a combination thereof. To illustrate, a storage device includes a hard disk, a Flash memory, a redundant array of independent disks, etc.

In an embodiment, a hardware controller, e.g., a microcontroller, an ASIC, a PLD, etc., is used instead of a parameter control. For example, a controller is used instead of the parameter control 168, another controller is used instead of the parameter control 170, yet another controller is used instead of the parameter control 182, and another controller is used instead of the parameter control 184. In some embodiments, a hardware controller includes a processor and storage device.

The parameter control 168, the parameter control 170, and the DSP 166 are parts of a control system 171 and the parameter control 182, the parameter control 184, and the DSP 178 are parts of a control system 181.

During the state S1 associated with the plasma system 104, the parameter control 168 that is coupled to the DSP 166 and to a driver and amplifier system (DAS) 172 of the x MHz RF generator receives the parameter value Px1 from the DSP 166. Based upon the parameter value Px1, the x MHz RF generator generates an RF signal on the communication medium 110 and the RF signal is sent from the x MHz RF generator via the communication medium 110 to the impedance matching network 112. For example, the parameter control 168 looks-up a drive parameter value corresponding to the parameter value Px1 to provide to a driver 174 of the DAS 172. The communication medium 110 couples the x MHz RF generator to the impedance matching network 112.

The driver 174 generates an RF signal having the drive parameter value and provides the RF signal to an amplifier 176 of the DAS 172. In one embodiment, a drive parameter value is the same as the parameter value Px1. The amplifier 176 may amplify the drive parameter value to generate an RF signal having an amplified parameter value, which may be the same as the drive parameter value of an RF signal that is received by the amplifier 176 from the driver 174. The RF signal having the amplified parameter value is supplied by the DAS 172 via the communication medium 110 to the impedance matching network 112.

Similarly, during the state S1 associated with the plasma system 104, a DAS 188 that includes a driver 190 and an amplifier 192 generates an RF signal that is sent via the communication medium 196 to the impedance matching network 112. The communication medium 196 couples the y MHz RF generator to the impedance matching network 112.

The RF signals received from the x MHz RF generator via the communication medium 110 and from the y MHz generator via the communication medium 196 are combined, e.g., added, summed, etc., in the impedance matching network 112 to generate an RF signal 154 during the state S1. In some embodiments, the impedance matching network 112 combines the RF signals received from the x and y MHz RF generators to match an impedance of the load with the source to further generate an RF signal. The RF signal 154 is transferred via the RF transmission line 150 to the ESC 146 to provide RF power to the lower electrode of the ESC 146.

Moreover, during the state S0 associated with the plasma system 104, the parameter control 170 that is coupled to the DSP 166 and to the DAS 172 receives the parameter value Px0 from the DSP 166. Based upon the parameter value Px0, the x MHz RF generator generates an RF signal that is sent from the x MHz RF generator via the communication medium 110 to the impedance matching network 112. For example, the parameter control 170 looks-up a drive parameter value corresponding to the parameter value Px0 to provide to the driver 174. The driver 174 generates an RF signal having a drive parameter value and provides the RF signal to the amplifier 176. In one embodiment, the drive parameter value is the same as the parameter value Px0. The amplifier 176 may amplify the drive parameter value to generate an RF signal having an amplified parameter value, which may be the same as the drive parameter value of an RF signal that is received by the amplifier 176 from the driver 174. The RF signal having the amplified parameter value is supplied by the DAS 172 via the communication medium 196 to the impedance matching network 112.

Similarly, during the state S0 associated with the plasma system 104, the DAS 188 generates an RF signal that is sent via the communication medium 196 to the impedance matching network 112. The RF signals received from the x MHz RF generator and the y MHz RF generator are combined in the impedance matching network 112 to generate an RF signal 156 during the state S0. The RF signal 156 is provided via RF transmission line 150 to lower electrode of the ESC 146 of the plasma chamber 114.

It should be noted that in response to power supplied within the RF signal 154 and the RF signal 156, power is reflected from the plasma chamber 114 towards the x MHz RF generator and the y MHz RF generator. For example, in response to forward power supplied within the RF signals 154 and 156, power is reflected from the plasma chamber 114 via the RF transmission line 150, the impedance matching network 112, and the communication medium 110 to the x MHz RF generator. As another example, in response to supplied power within the RF signals 154 and 156, power is reflected from the plasma chamber 114 via the RF transmission line 150, the impedance matching network 112, and the communication medium 196 to the y MHz RF generator.

In some embodiments, forward power and supplied power are used interchangeably herein.

A voltage and current (VI) probe 152 of the x MHz RF generator senses power, e.g., supplied power, reflected power, delivered power, etc., communicated along the communication medium 110. In some embodiments, the terms probe and sensor are used interchangeably. Similarly, a voltage and current probe 186 of the y MHz RF generator senses power communicated along the communication medium 196.

An example of each voltage and current probe 152 and 186 includes a voltage and current probe that complies with a pre-set formula. An example of the pre-set formula includes a standard that is followed by an Association, which develops standards for sensors. Another example of the pre-set formula includes a National Institute of Standards and Technology (NIST) standard. As an illustration, the voltage and current probe 152 or 186 is calibrated according to NIST standard. In this illustration, the voltage and current probe 152 or 186 is coupled with an open circuit, a short circuit, or a known load to calibrate the voltage and current probe 152 or 186 to comply with the NIST standard. The voltage and current probe 152 or 186 may first be coupled with the open circuit, then with the short circuit, and then with the known load to calibrate the voltage and current probe 152 or 186 based on NIST standard. The voltage and current probe 152 or 186 may be coupled to the known load, the open circuit, and the short circuit in any order to calibrate the voltage and current probe 152 or 186 according to NIST standard. Examples of a known load include a 50 ohm load, a 100 ohm load, a 200 ohm load, a static load, a direct current (DC) load, a resistor, etc. As an illustration, each voltage and current probe 152 or 186 is calibrated according NIST-traceable standards.

Although two RF generators are shown in FIG. 2, in some embodiments, any number of RF generators is used. For example, in addition to a 2 MHz RF generator and a 27 MHz RF generator, a 60 MHz RF generator may be used. As another example, the x MHz RF generator is used without using any other RF generator.

It should further be noted that the RF signal 154 generated during the state S1 and the RF signal 156 generated during the state S0 are portions of a combined RF signal that is transferred via the RF transmission line 150. For example, the RF signal 154 is a portion of the combined RF signal. In this example, the RF signal 154 has a higher amount of power than the RF signal 156, which is another portion of the combined RF signal.

In some embodiments, each of the first variable and the second variable is a modeled variable. For example, a processor of the host system 180 generates a model of one or more parts, e.g., the communication medium 110, the communication medium 196, the impedance matching network 112, the RF transmission line 150, the ESC 146, etc., of the plasma system 104. For example, the processor of the host system 180 generates a model of electrical components, e.g., capacitors, inductors, resistors, etc., of a part of the plasma system 104. As another example, when an inductor of the impedance matching network 112 is connected in series with a capacitor of the impedance matching network 112, an inductor of an impedance matching model is also connected in series with a capacitor of the impedance matching network 112.

In the embodiments in which each of the first variable and the second variable is a modeled variable, a model includes electrical elements, e.g., inductors, capacitors, resistors, etc., and the electrical elements have similar characteristics as that of electrical components of a part of the plasma system 104. For example, the model has the same inductance and/or capacitance and/or resistance as that of a part of the plasma system 104. As another example, an impedance matching model has the same impedance and/or capacitance as that of the impedance matching network 112.

Moreover, in the embodiments in which each of the first variable and the second variable is a modeled variable, a voltage and current probe measures a complex voltage and current at an output of an RF generator. For example, the voltage and current probe 152 measures a complex voltage and current at an output of the x MHz RF generator and the voltage and current probe 186 measures a complex voltage and current at an output of the y MHz RF generator. The output of an RF generator is coupled to an RF cable. For example, the output of the x MHz RF generator is coupled to the communication medium 110 and the output of the y MHz RF generator is coupled to the communication medium 196. As an example, a complex voltage and current includes a voltage magnitude, a current magnitude, and a phase between the voltage and current magnitudes. In various embodiments, a magnitude is a root mean square value or a zero-to-peak value or a peak-to-peak value. The complex voltage and current is provided from the voltage and current probe via a cable, e.g., a serial cable, a parallel cable, a Universal Serial Bus (USB) cable, etc., to the processor of the host system 180.

Furthermore, in the embodiments in which each of the first variable and the second variable is a modeled variable, the complex voltage and current received from the voltage and current probe by the processor of the host system 180 is propagated via elements of one or more models of one or more parts of the plasma system 104. For example, a directional sum of the complex voltage and current received from a voltage and current probe and of a complex voltage and current consumed by elements of a model is calculated to generate a complex voltage and current at a model node. Examples of the model node include a node at an input of a model, or an output of the model, or within the model. For example, a model node is an output of a model of an RF strap of the RF transmission line 150. In this example, the model of the RF strap is connected to a model of an RF rod of the RF transmission line 150. As another example, a model node is a node at an output of a model of the impedance matching network 112. As yet another example, a model node is a node at an input of a model of the ESC 146 or at an output of the model of the ESC 146.

Figure 3:
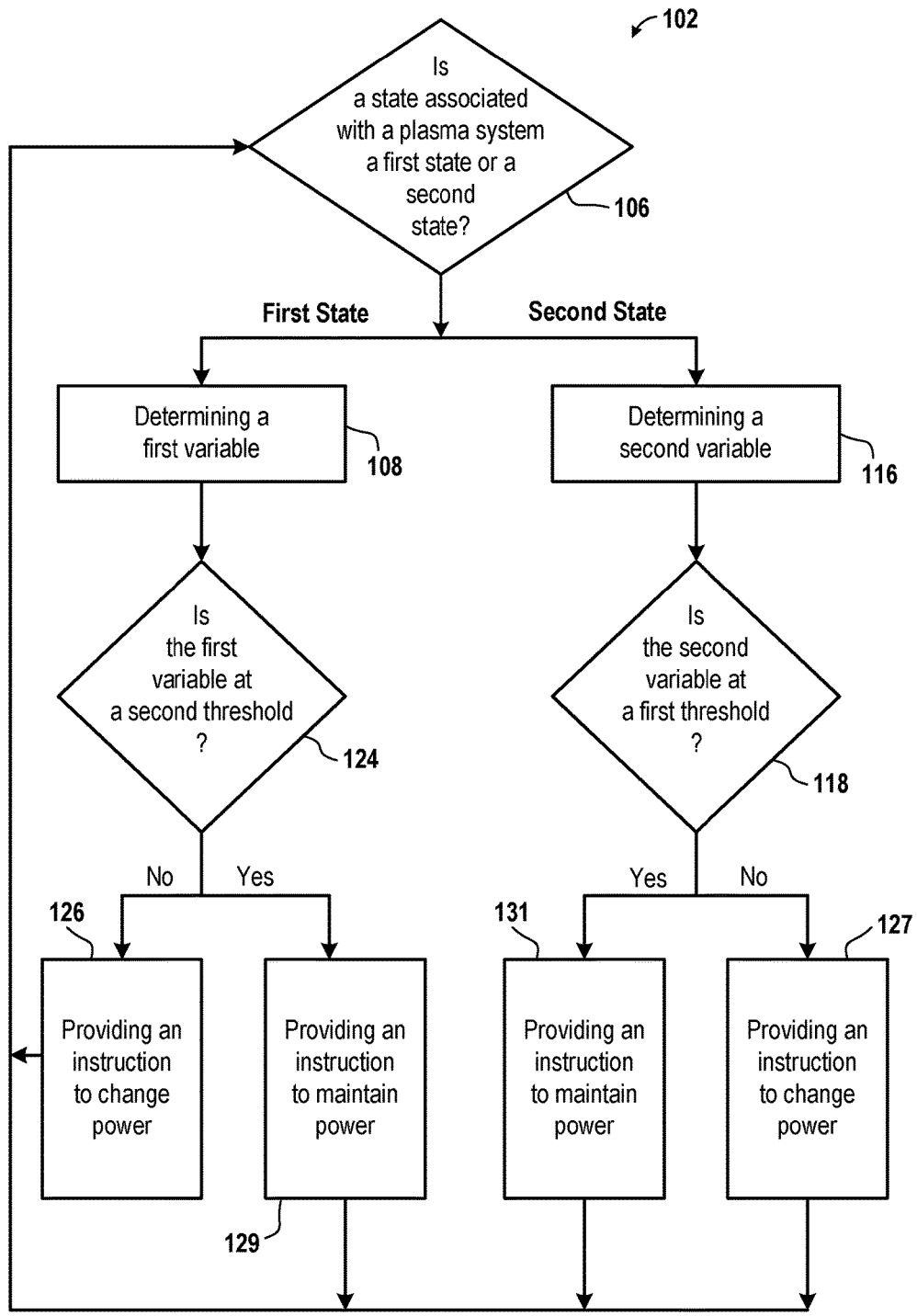
FIG. 3 is a flowchart of an embodiment of a method for using different variables based on a state associated with the plasma system of FIG. 2, in accordance with an embodiment described in the present disclosure.

FIG. 3 is a flowchart of an embodiment of a method 102 for using different variables based on a state associated with the plasma system 104 (FIG. 2). The method 102 is executed by one or more processors, e.g., the processor of the host system 180 (FIG. 2), the DSP 166, the DSP 178 (FIG. 2), a combination of the processor of the host system 180 and the DSP 166, a combination of the processor of the host system 180 and the DSP 178, etc.

In an operation 106, it is determined whether a state associated with the plasma system 104 is a first state, e.g., the state S1, or a second state, e.g., the state S0. For example, as described above, the plasma system 104 is associated with the first state when the digital pulsing signal 122 has the state S1. As another example, as described above, the plasma system 104 is associated with the second state when the digital pulsing signal 122 has the state S0.

Upon determining that the state associated with the plasma system 104 is the first state, in an operation 108, the first variable is determined. The first variable is determined based on a measurement at the communication medium 110 (FIG. 2) when the communication medium is transferring an RF signal during the state S1. For example, the voltage and current probe 152 measures the complex voltage and current at the communication medium 110 when the communication medium 110 is transferring an RF signal during the state S1, and provides the measured complex voltage and current to a processor of the host system 180 (FIG. 2) via the DSP 166 (FIG. 2). As another example, a sensor, similar to the voltage and current probe 152, measures the complex voltage and current at the RF transmission line 150 when the RF transmission line 150 is transferring the RF signal 154, and provides the measured complex voltage and current to the processor of the host system 180 via the DSP 166. Upon receiving the measured complex voltage and current from a voltage and current probe, e.g., the voltage and current probe 152 or the voltage and current probe coupled to the RF transmission line 150, etc., the processor of the host system 180 determines RF power, which is provided by the complex voltage and current. The RF power that is determined is an example of the first variable. As yet another example, the first variable at a model node is determined.

In one embodiment, the RF transmission line 150 is an example of a communication medium.

On the other hand, upon determining that the state associated with the plasma system 104 is the second state, in an operation 116, the second variable is determined. For example, when the RF signal 156 is transferred to the plasma chamber 114, the voltage and current probe 152 measures the complex voltage and current at the communication medium 110 and provides the measured complex voltage and current to a processor of the host system 180 (FIG. 2) via the DSP 166 (FIG. 2). As another example, when the RF signal 156 is transferred to the plasma chamber 114, a sensor, similar to the voltage and current probe 152 (FIG. 2), measures the complex voltage and current at the RF transmission line 150 and provides the measured complex voltage and current to the processor of the host system 180 via the DSP 166. Upon receiving the measured complex voltage and current from a voltage and current probe, e.g., the voltage and current probe 152 or the voltage and current probe coupled to the RF transmission line 150, the processor of the host system 180 determines an RF voltage, which is the same as the measured complex voltage. In some embodiments, the processor of the host system 180 ignores the measured current upon receiving the measured complex current and voltage during the second state. As another example, upon receiving the measured complex voltage and current from a voltage and current probe, the processor of the host system 180 determines an ion energy, which is a function of an RF voltage and a direct current (DC) bias potential. To illustrate, the ion energy is calculated using an equation:

$$Ei = C1 \cdot Vdc + C2 \cdot Vpeak \quad (1)$$

where "C1" is a coefficient, e.g., (−½), C2 is a coefficient, e.g., ½, Vdc is a wafer bias, and Vpeak is a peak magnitude of a voltage, etc.

In various embodiments, a determination of the ion energy is performed by a processor of the plasma system 104. For example, the ion energy is calculated as a sum of the coefficient "C1" multiplied by a wafer bias, e.g., modeled bias, etc., at a model node and the coefficient "C2" multiplied by a peak magnitude of a voltage. Examples of the coefficient "C1" include a negative real number and of the coefficient "C2" include a positive real number.

In various embodiments, wafer bias and DC bias potential are used interchangeably herein.

In various embodiments, the coefficient "C1" is a positive real number. In various embodiments, the coefficient "C2" is a negative real number. The coefficients "C1" and "C2", the wafer bias, and the peak magnitude used to determine the ion energy are stored in a storage device of the plasma system 104. Examples of the peak magnitude used to determine the ion energy include a peak-to-peak magnitude and a zero-to-peak magnitude.

In some embodiments, the peak magnitude used to determine the ion energy is extracted by a processor of the plasma system 104 from a complex voltage and current determined at a model node.

In various embodiments, the peak magnitude used to calculate the ion energy is measured by a voltage and current probe that is coupled to an input or an output of a part of the plasma system 104 at one end and to a processor of the plasma system 104 at another end. The voltage and current probe coupled to the input or output at one end and to a processor of the plasma system 104 at another end is capable of distinguishing between frequencies of two or more RF generators.

In some embodiments, both the peak magnitude and wafer bias used to determine the ion energy is at a model node. For example, the peak magnitude used to determine the ion energy is extracted from a complex voltage and current at a model node, and the wafer bias used to determine the ion energy is calculated at the model node. As another example, the peak magnitude used to determine the ion energy is extracted from complex voltage and current at a model node of a model of the ESC 146, and the wafer bias used to determine the ion energy is calculated at the model node.

In a variety of embodiments, the peak magnitude used to determine the ion energy is extracted from a complex voltage and current at a first model node and wafer bias used to determine the ion energy is determined at a second model node, other than the first model node. For example, the peak magnitude used to determine the ion energy is extracted from complex voltage and current at a model node at an output of the ESC 146, and the wafer bias used to determine the ion energy is calculated at a model node at an input of the ESC 146.

The ion energy calculated using a model node removes a need to use an expensive voltage and current probe to measure the peak magnitude and also removes a need to use a bias compensation circuit to measure the wafer bias. An example of the bias compensation circuit includes a silicon carbide pin.

In some embodiments, instead of the peak magnitude used to determine the ion energy, a root mean square magnitude is used.

In various embodiments, when multiple RF generators are on, the peak magnitude used to determine the ion energy is a peak voltage of a statistical value, e.g., median, mean, etc., of peak RF voltages of the RF generators that are on. For example, the Vpeak is an average of peak magnitudes that are measured by the voltage and current probes 152 and 186 at the outputs of the x and y MHz RF generators.

In one embodiment, the DC bias potential applied in the equation (1) is measured using the bias compensation circuit, e.g., a DC sensor, etc. For example, the bias compensation circuit may be immersed in the plasma of the plasma chamber 114 (FIG. 2) to measure the DC bias potential. In various embodiments, the DC sensor is coupled to the communication medium 110 or the RF transmission line 150 to measure the DC bias potential.

In embodiments in which the x MHz RF generator is operational, e.g., is on, is not malfunctioning, is functioning, etc., and the y MHz RF generator is inoperational, e.g., is off, is malfunctioning, is not operating, etc., the DC bias potential, applied in the equation (1), is determined by a processor of the plasma system 104 according to an equation:

$$ax*Vx+bx*Ix++cx*\text{sqrt}(Px)+dx \qquad (2)$$

where "*" represents multiplication, "sqrt" is a square root, "Vx" represents a voltage magnitude at a model node, "Ix" represents a current magnitude at the model node, "Px" represents a magnitude of power at the model node, "ax" is a coefficient, "bx" is a coefficient, "cx" is a coefficient, and "dx" represents a constant value. In some embodiments, a power magnitude used to determine the wafer bias at a model node is a product of a voltage magnitude at the model node, a current magnitude at the model node, and a cosine of a phase between the voltage magnitude and the current magnitude. In various embodiments, a power magnitude is a magnitude of delivered power, which includes a difference between forward power and reflected power. The coefficients ax, bx, and cx, and the constant dx are stored within a storage device of the host system 180 (FIG. 2).

In embodiments in which the x MHz RF generator is operational and the y MHz RF generator is operational, the DC bias potential, applied in the equation (1), is determined by a processor of the plasma system 104 according to an equation:

$$axy*Vx+bxy*Ix+cxy*\text{sqrt}(Px)+dxy*Vy+exy*Iy+\\ fxy*\text{sqrt}(Py)+gxy \qquad (3)$$

where "*" represents multiplication, "Vx" represents a voltage magnitude at a model node, "Ix" represents a current magnitude at the model node, "Px" represents a magnitude of power at the model node, "Vy" represents a voltage magnitude at the model node, "Iy" represents a current magnitude at the model node, "Py" represents a magnitude of power at the model node, and each of "axy", "bxy", "cxy", "dxy", "exy", "fxy" is a coefficient, and "gxy" is a constant. In some embodiments, the voltage Vy at the model node is a result of propagating a complex voltage and current measured by the voltage and current probe 186 of the y MHz RF generator via a model of the communication medium 196 and via a model of a branch of the impedance matching network 112 that is coupled to the communication medium 196. It should be noted that in various embodiments, Py is a product of Vy, Iy, and a cosine of a phase between Vy and Iy. The coefficients axy, bxy, cxy, dxy, exy, fxy, and the constant gxy are stored within a storage device of the host system 180 (FIG. 2).

In embodiments in the x MHz RF generator, the y MHz RF generator, and a z MHz RF generator are operational, the DC bias potential, applied in the equation (1), is determined by a processor of the plasma system 104 according to an equation:

$$axyz*Vx+bxyz*Ix+cxyz*\text{sqrt}(Px)+dxyz*Vy+exyz*Iy+\\ fxyz*\text{sqrt}(Py)+gxyz*Vz+hxyz*Iz+ixyz*\text{sqrt}(Pz)+\\ jxyz \qquad (4)$$

where "*" represents multiplication, "Vx" represents a voltage magnitude at a model node, "Ix" represents a current magnitude at the model node, "Px" represents a magnitude of power at the model node, "Vy" represents a voltage magnitude at the model node, "Iy" represents a current magnitude at the model node, "Py" represents a magnitude of power at the model node, "Vz" represents a voltage magnitude at the model node, "Iz" represents a current magnitude at the model node, "Pz" represents a magnitude of power at the model node, each of "axyz", "bxyz", "cxyz", "dxyz", "exyz", "fxyz", "gxyz", "hxyz", "ixyz" is a coefficient, and "jxyz" is a constant. In some embodiments, the voltage Vz at the model node is a result of propagating a complex voltage and current measured by a voltage and current probe of the z MHz RF generator via a model of an RF cable that is connected to the z MHz RF generator and via a model of a branch of the impedance matching network 112 that is coupled to the RF cable. It should be noted that in various embodiments, Pz is a product of Vz, Iz, and a cosine of a phase between Vz and Iz. The coefficients axyz, bxyz, cxyz, dxyz, exyz, fxyz, gxyz, hxyz, ixyz, and the constant jxyz are stored within a storage device of the host system 180 (FIG. 2).

In a number of embodiments, the voltage magnitudes, the current magnitudes, and the power magnitudes, e.g., Vx, Ix, Px, Vy, Iy, Py, Vz, Iz, Pz, etc., used to determine a wafer bias are not modeled and instead are measured, by a number of voltage and current probes at a node within the plasma system 104 (FIG. 2), e.g., an output of the impedance matching network 112 (FIG. 2), an output of the RF transmission line 150 (FIG. 2), at a point within the RF transmission line 150, at the ESC 146 (FIG. 2), etc., to determine the wafer bias at the node of the plasma system 104. For example, a voltage and current probe is coupled to the output of the RF transmission line 150 to measure current and voltage at the output, is coupled to the point within the RF transmission line 150 to measure current and voltage at the point, or the ESC 146 to measure current and voltage at the ESC 146.

In an operation 118, it is determined whether the second variable meets a first threshold. For example, it is determined whether the second variable exceeds the first threshold or is lower than the first threshold. The first threshold is stored within a storage device, e.g., a storage device of the host system 180 (FIG. 2) or any other storage device of the plasma system 104. It should be noted that the first threshold is an ion energy threshold when the second variable is ion energy and that the first threshold is an RF voltage threshold when the second variable is RF voltage.

Upon determining that the second variable exceeds the first threshold, in an operation 127, an instruction is provided to change power of the RF signal 156 (FIG. 2). For example, upon determining that the second variable exceeds the first threshold, in an operation 120, an instruction is provided to reduce power of the RF signal 156. As an illustration, the processor of the host system 180 provides an instruction to the DSP 166 (FIG. 2) to reduce power from the power value Px0 to a power value at which the second variable does not exceed the first threshold. Upon receiving an instruction to reduce power, the DSP 166 decreases the parameter value Px0, e.g., a power value Px0, etc., to a power value "Px0−1" lower than the power value Px0 and provides the lowered power value to the parameter control 170 (FIG. 2). In some embodiments, the processor of the host system 180 performs the task of decreasing the power value Px0 to the lowered power value "Px0−1".

The parameter control 170 generates a drive power value based on the lowered power value "Px0−1" in a manner similar to that described above of generating a drive parameter value from the parameter value Px0. The parameter control 170 provides the drive power value generated based on the received power value "Px0−1" to the DAS 172. The DAS 172 generates an RF signal based on the drive power value that is based on the lowered power value "Px0−1" in a similar manner to that described above for generating an RF signal from a drive power value that is based on the power value Px0 and provides an RF signal via the impedance matching network 112 (FIG. 2) to the lower electrode of the ESC 146 (FIG. 2).

The operations 106, 116, 118, and 127 are iteratively repeated until the power value Px0 is reduced to a value at which the second variable does not exceed the first threshold. To illustrate, after reducing the power value from Px0 to the power value "Px0−1", the second variable is determined based on a voltage at a model node or an RF voltage that is measured at the communication medium 110 or at the RF transmission line 150. It is determined whether the second variable corresponding to the power value "Px0−1" exceeds the first threshold. Upon determining that the second variable corresponding to the power value "Px0−1" exceeds the first threshold, the power value "Px0−1" is further reduced to a power value "Px0−2" and the operations 106, 116, and 118 are repeated.

It should be noted that in an embodiment, to iteratively determine the power value at which the second variable does not exceed the first threshold, the operation 106 is not repeated. Rather, the operations 116, 118, and 127 are iteratively repeated.

On the other hand, upon determining that the second variable does not exceed and does not meet the first threshold, in the operation 118, it is further determined whether the second variable is less than the first threshold. Upon determining that the second variable is less than the first threshold, in the operation 127, an instruction is provided by the processor of the host system 180 to change, e.g., increase, the power value Px0. For example, the processor of the host system 180 provides an instruction to the DSP 166 to increase power from the power value Px0 and the DSP 166 increases the power value Px0 to a power value "Px0+1". In one embodiment, the processor of the host system 180 increases the power value Px0 to the power value "Px0+1" and provides the power value "Px0+1" to the DSP 166.

The DSP 166 provides the power value "Px0+1" to the parameter control 170. The parameter control 170 generates a drive power value based on the power value "Px0+1" in a manner similar to that described above of generating the drive power value from the power value Px0. The parameter control 170 provides the drive power value to the DAS 172. Upon receiving the drive power value the DAS 172 generates an RF signal based on the drive power value in a manner similar to that described above of generating the RF signal 156 from a drive power value that is based on the power value Px0 and provides the RF signal via the impedance matching network 112 (FIG. 2) to the lower electrode of the ESC 146 (FIG. 2).

The operations 106, 116, 118, and 127 are iteratively repeated until the power value Px0 is increased to a value at which the second variable is not lower than the first threshold. To illustrate, after increasing the power value from Px0 to the power value "Px0+1", the second variable is determined based on an RF voltage that is measured at the communication medium 110 or at the RF transmission line 150. It is determined whether the second variable corresponding to the power value "Px0+1" is less than the first threshold. Upon determining that the second variable corresponding to the power value "Px0+1" is less than the first threshold, the power value "Px0+1" is further increased to a power value "Px0+2" and the operations 106, 116, 118, and 127 are repeated.

It should be noted that in an embodiment, to iteratively determine the power value at which the second variable is not less than the first threshold, the operation 106 is not repeated. Rather, the operations 116, 118 and 127 are repeated. The method 102 is repeated after the operation 127.

On the other hand, upon determining that the second variable matches the first threshold, e.g., is not less than the first threshold and does not exceed the first threshold, in an operation 131, an instruction is provided to maintain the power value Px0. For example, the processor of the host system 180 provides an instruction to the DSP 166 to continue to provide the power value Px0 to the parameter control 170. In one embodiment, the processor of the host system 180 provides the power value Px0 to the DSP 166 and the DSP 166 provides the power value Px0 to the parameter control 170. The method 102 repeats after the operation 131.

In an operation 124, it is determined whether the first variable meets a second threshold. For example, it is determined whether the first variable exceeds the second threshold. The second threshold is stored within a storage device, e.g., a storage device of the host system 180 or any other storage device of the plasma system 104. It should be noted that the second threshold is a power threshold. The second threshold is of a different variable than that of the first threshold. For example, the second threshold is a power value and the first threshold is an RF voltage value or an ion energy value.

Upon determining that the first variable exceeds the second threshold, in an operation 126, an instruction is provided to change power of the RF signal 154 (FIG. 2). For example, upon determining that the first variable exceeds the second threshold, in an operation 126, an instruction is provided to reduce power of the RF signal 154. As an illustration, the processor of the host system 180 provides an instruction to the DSP 166 (FIG. 2) to reduce power from the parameter value Px1, e.g. a power value Px1, etc., to a power value at which the first variable does not exceed the second threshold. Upon receiving an instruction to reduce power, the DSP 166 decreases the power value Px1 to a power value "Px1−1" lower than the power value Px1 and provides the lowered power value to the parameter control 168 (FIG. 1). In some embodiments, the processor of the host system 180 performs the task of decreasing the power value Px1 to the lowered power value "Px1−1". The parameter control 168 generates a drive power value based on the lowered power value "Px1−1" in a manner similar to that described above of generating a drive power value from the power value Px1. The parameter control 168 provides the drive power value generated based on the received power value "Px1−1" to the DAS 172. The DAS 172 generates an RF signal based on the drive power value that is based on the lowered power value "Px1−1" in a similar manner to that described above for generating an RF signal from a drive power value that is based on the power value Px1 and provides an RF signal via the impedance matching network 112 (FIG. 2) to the lower electrode of the ESC 146 (FIG. 2).

The operations 106, 108, 124, and 126 are iteratively repeated until the power value Px1 is reduced to a value at which the first variable does not exceed the second threshold. To illustrate, after reducing the power value from Px1 to the power value "Px1−1", the first variable is determined based on an RF voltage that is measured at the communication medium 110 or at the RF transmission line 150. It is determined whether the first variable corresponding to the power value "Px1−1" exceeds the second threshold. Upon determining that the first variable corresponding to the power value "Px1−1" exceeds the second threshold, the power value "Px1−1" is further reduced to a power value "Px1−2" and the operations 106, 108, and 124 are repeated.

It should be noted that in an embodiment, to iteratively determine the power value at which the first variable does not exceed the second threshold, the operation 106 is not repeated. Rather, the operations 108, 124, and 126 are iteratively repeated.

On the other hand, upon determining that the first variable does not exceed the second threshold, in the operation 124, it is determined whether the first variable is less than the second threshold. Upon determining that the first variable is less than the second threshold, in the operation 126, an instruction is provided by the processor of the host system 180 to increase the power value Px1. For example, the processor of the host system 180 provides an instruction to the DSP 166 to increase power from the power value Px1 and the DSP 166 increases the power value Px1 to a power value "Px1+1". In one embodiment, the processor of the host system 180 increases the power value Px1 to the power value "Px1+1" and provides the power value "Px1+1" to the DSP 166.

The DSP 166 provides the power value "Px1+1" to the parameter control 168. The parameter control 168 generates a drive power value based on the power value "Px1+1" in a manner similar to that described above of generating the drive parameter value from the parameter value Px1. The parameter control 168 provides the drive power value to the DAS 172. Upon receiving the drive power value the DAS 172 generates an RF signal based on the drive power value in a manner similar to that described above of generating an RF signal from a drive power value that is based on parameter power value Px1 and provides an RF signal via the impedance matching network 112 (FIG. 2) to the lower electrode of the ESC 146 (FIG. 2).

The operations 106, 108, 124, and 126 are iteratively repeated until the power value Px1 is increased to a value at which the first variable is not lower than the second threshold. To illustrate, after increasing the power value from Px1 to the power value "Px1+1", the first variable is determined based on a current at a model node or an RF current that is measured at the communication medium 110 or at the RF transmission line 150. It is determined whether the first variable corresponding to the power value "Px1+1" is less than the second threshold. Upon determining that the first variable corresponding to the power value "Px1+1" is less than the second threshold, the power value "Px1+1" is further increased to a power value "Px1+2" and the operations 106, 108, 124, and 126 are repeated.

It should be noted that in an embodiment, to iteratively determine the power value at which the first variable is not less than the second threshold, the operation 106 is not repeated. Rather, the operations 108, 124, and 126 are repeated. The method 102 is repeated after the operation 126.

On the other hand, upon determining that the first variable matches the second threshold, e.g., is not less than the second threshold and does not exceed the second threshold, etc., in an operation 129, an instruction is provided to maintain the power value Px1. For example, the processor of the host system 180 provides an instruction to the DSP 166 to continue to provide the power value Px1 to the parameter control 168. In one embodiment, the processor of the host system 180 provides the power value Px1 to the DSP 166 and the DSP 166 provides the power value Px1 to the parameter control 168. The method 102 repeats after the operation 129.

It should be noted that the first state is associated with a first use of the plasma system 104 and the second state is associated with a second use of the plasma system 104. For example, when the substrate 119 is to be etched, the operations 108, 124, and 126 or the operations 108, 124, and 129 are performed during the state S1 to facilitate etching of the substrate 119. A decision whether the substrate 119 is to be etched may be provided as an input by a user via an input device of the host system 180. The input device is described below. As another example, when the substrate 119 is to be etched at a rate higher than a rate at which the substrate 119 is to be etched during the state S0, the operations 108, 124, and 126 or the operations 108, 124, and 129 are performed during the state S1 to facilitate etching of the substrate 119 at the higher rate. As another example, when material, e.g., a polymer, a semiconductor, a conductor, etc., is to be deposited on the substrate 119 at a rate lower than a rate at which material is to be deposited on the substrate 119 during the state S0, the operations 116, 118, and 127 or the operations 116, 118, and 131 are performed during the state S1 to facilitate deposition on the substrate 119 at the lower rate.

It should be noted that in some embodiments, a deposition is a passive deposition. For example, passive deposition is a byproduct of etching. To further illustrate, when a substrate, e.g., a semiconductor wafer, etc., is etched, material that is etched away deposits itself onto a surface of the substrate.

In a number of embodiments, a process of depositing is active deposition. For example, a process gas is provided to the plasma chamber 114 to be deposited on a surface of a substrate. As another example, a metal is bombarded with ions to deposit the metal onto a surface of a substrate.

As yet another example, when ion energy within the plasma chamber 114 is to be enhanced compared to that during the state S0, the operations 108, 124, and 126 or the operations 108, 124, and 129 are performed during the state S1.

As another example, when a layer of material is to be deposited on the substrate 119, the operations 116, 118, and 131 or the operations 116, 118, and 127 are performed during the state S0 to facilitate deposition on the substrate 119. As another example, when the substrate 119 is to be etched at the lower rate, the operations 116, 118, and 131 or the operations 116, 118, and 127 are performed during the state S0 to facilitate etching of the substrate 119 at the lower rate. As yet another example, when material is to be deposited on the substrate 119 at the higher rate than a rate at which material is to be deposited on the substrate 119 during the state S1, the operations 116, 118, and 131 or the operations 116, 118, and 127 are performed during the state S0 to facilitate deposition on the substrate 119 at the higher rate. As yet another example, when ion energy within the plasma chamber 114 is to be neutralized, e.g., reduced, etc., the operations 116, 118, and 131 or the operations 116, 118, and 127 are performed during the state S0.

FIG. 4 is a graph 133 that plots RF power that is provided by 2 MHz and 60 MHz RF generators to an electrode, e.g., the lower electrode, the upper electrode, etc., of a plasma chamber, e.g., the plasma chamber 114 (FIG. 2), versus time. In a state 1, e.g., the state S1, RF power of an RF signal that is generated by the 2 MHz RF generator is greater than RF power of an RF signal that is generated by the 60 MHz RF generator. For example, RF power of the RF signal generated by the 2 MHz RF generator is 7 kilowatts (kW) and RF power of the RF signal generated by the 60 MHz RF generator is 1 kW. Also, during the state 1, both the RF generators are operated in a power control mode, which is an example of the first variable control mode 155 (FIG. 1A). Moreover, during the state 1, etching is performed on a substrate, e.g., the substrate 119 (FIG. 2), and the method operations 108, 124, and 126 or the operations 108, 124, and 129 are performed during the state S1 to optimize, e.g., increase, etc., ion energy and density of plasma within the plasma chamber 114. The optimization facilitates the etching.

In a state 0, e.g., the state S0, RF power of an RF signal that is generated by the 2 MHz RF generator is less than RF power of an RF signal that is generated by the 60 MHz RF generator. For example, RF power of the RF signal generated by the 2 MHz RF generator is 0 kW and RF power of the RF signal generated by the 60 MHz RF generator is less than 15 watts. Also, during the state 0, both the RF generators are operated in the second variable control mode 157 (FIG. 1A). Moreover, during the state 0, deposition is performed on a substrate, e.g., the substrate 119 (FIG. 2), and the method operations 116, 118, and 131 or the operations 116, 118, and 127 are performed during the state S0 to limit, e.g., neutralize, ion energy and density of plasma within the plasma chamber. The state 1 repeats after the state 0.

Figure 5A:
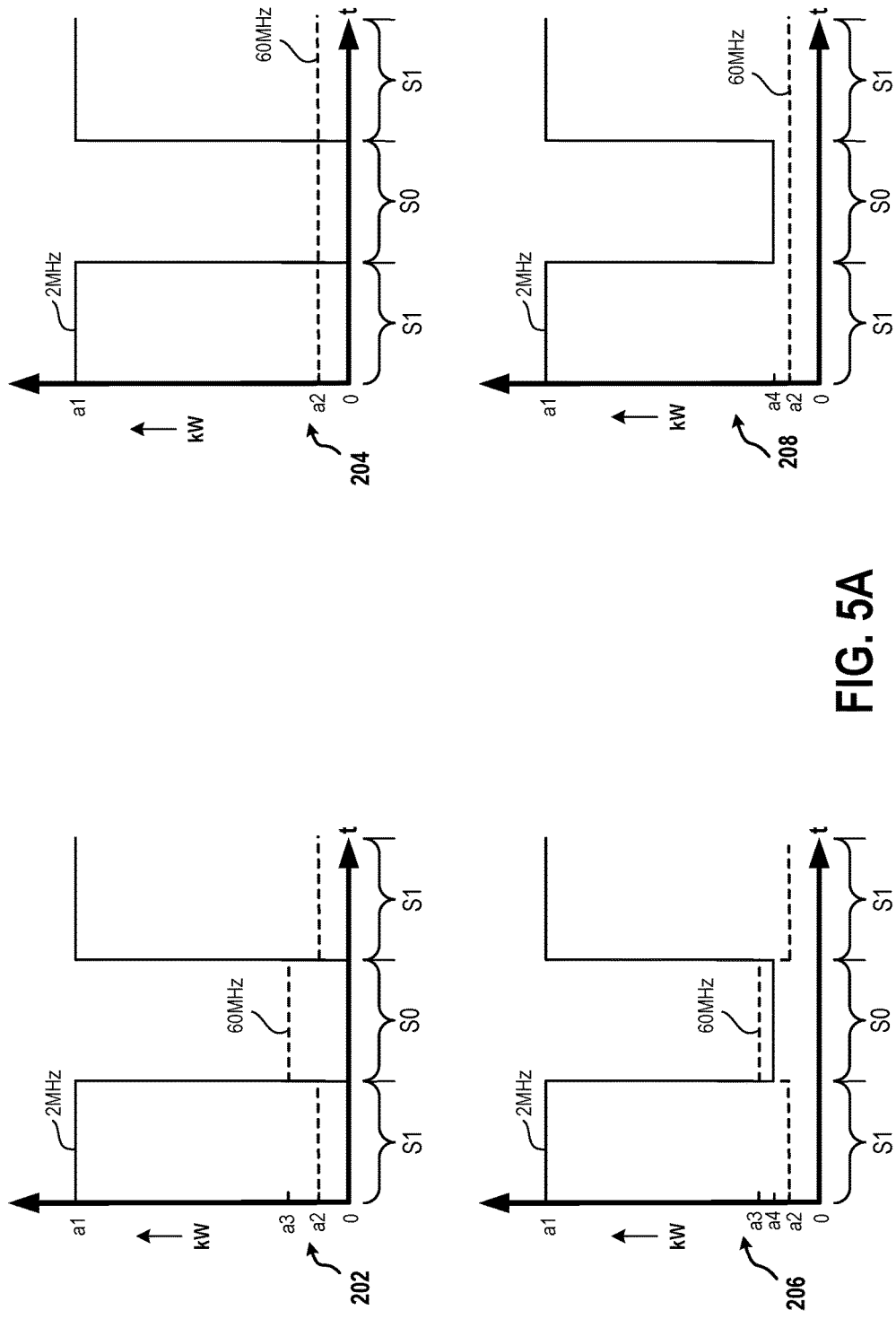
FIG. 5A shows embodiments of graphs to illustrate various power values of a 2 MHz RF signal and a 60 MHz RF signal, in accordance with an embodiment described in the present disclosure.

FIG. 5A shows embodiments of graphs 202, 204, 206, and 208 to illustrate various power values of a 2 MHz RF signal and a 60 MHz RF signal. Each graph 202, 204, 206, and 208 plots power values in kilowatts (kW) as a function of time t. As indicated in graph 202, the 2 MHz power signal, which is a power signal generated by a 2 MHz DAS has a power value of a1 during the state S1 and has a power value of 0 during the state S0. Also, a 60 MHz power signal, which is a power signal supplied by a 60 MHz DAS has a power value of a2 during the state S1 and has a power value of a3 during the state S0.

As indicated in the graph 204, the 60 MHz power signal has the power value a2 during states S1 and S0. Moreover, as indicated in graph 206, the 2 MHz signal has a power value of a4 during the state S0. As indicated in graph 208, the 60 MHz signal has the power value of a2 when the 2 MHz signal has the power value of a4.

Figure 5B:
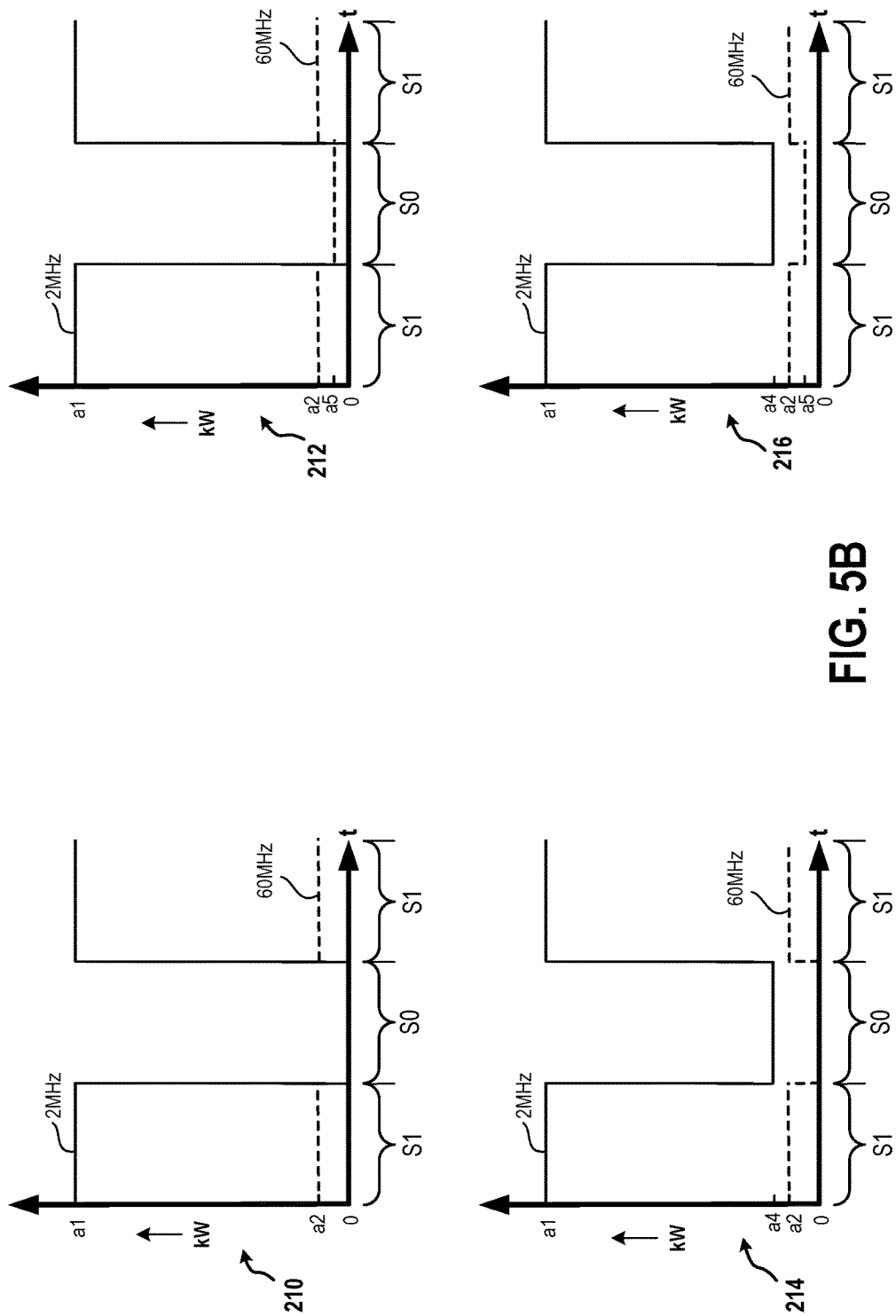
FIG. 5B shows graphs with two RF signals in which both the RF signals have varying values, in accordance with an embodiment described in the present disclosure.

FIG. 5B shows embodiments of graphs 210, 212, 214, and 216. Each graph 210, 212, 214, and 216 plots power values in kilowatts as a function of time t. As shown in graph 210, instead of the 60 MHz signal transitioning from the power value of a2 to the power value of a3 (FIG. 5A), the 60 MHz signal transitions from the power value of a2 to a power value of zero.

Moreover, as shown in graph 212, the 60 MHz signal transitions from the power value of a2 to a power value of a5. As shown in graph 214, the 60 MHz signal has the power value of zero during the state S0 when the 2 MHz signal has a non-zero power value of a4. As shown in graph 216, the 60 MHz power signal has a non-zero power value of a5 during the state S0 when the 2 MHz signal has a non-zero power value of a4.

Figure 6A:
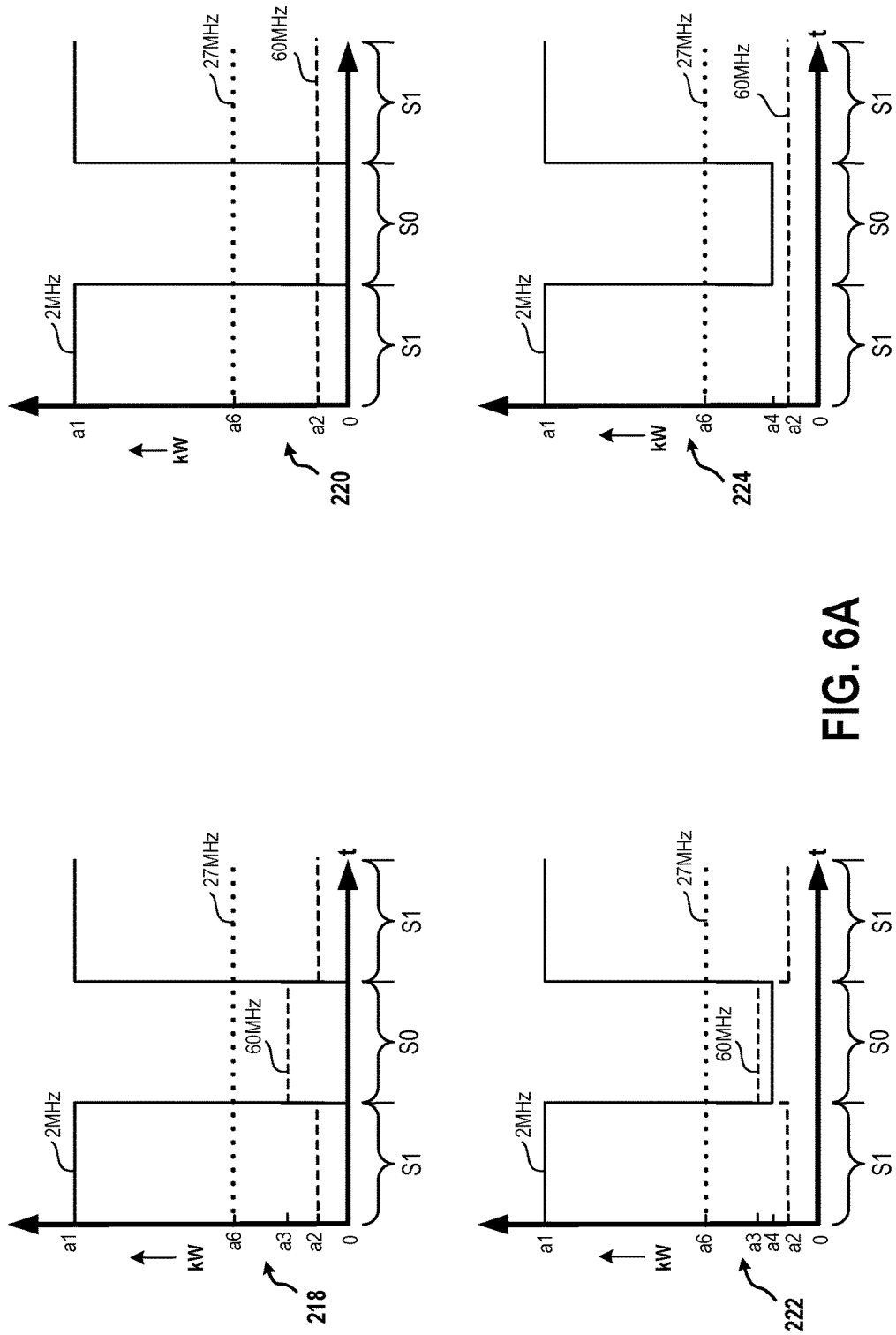
FIG. 6A shows graphs with three RF signals in which one of the RF signals has a constant value and another one of the RF signals has a constant value or varying values, in accordance with an embodiment described in the present disclosure.

FIG. 6A shows embodiments of graphs 218, 220, 222, and 224. Each graph 218, 220, 222, and 224 plots power values in kilowatts as a function of time t. Graph 218 is similar to graph 202 (FIG. 5A), graph 220 is similar to graph 204 (FIG. 5A), graph 220 is similar to graph 206 (FIG. 5A), and graph 222 is similar to graph 208 (FIG. 5A) except that the graphs 218, 220, 222, and 224 include a plot of a 27 MHz signal. The 27 MHz signal is generated from a 27 MHz DAS of a 27 MHz RF generator. The 27 MHz signal is an RF signal having a power value of a6 during both states S1 and S0.

Figure 6B:
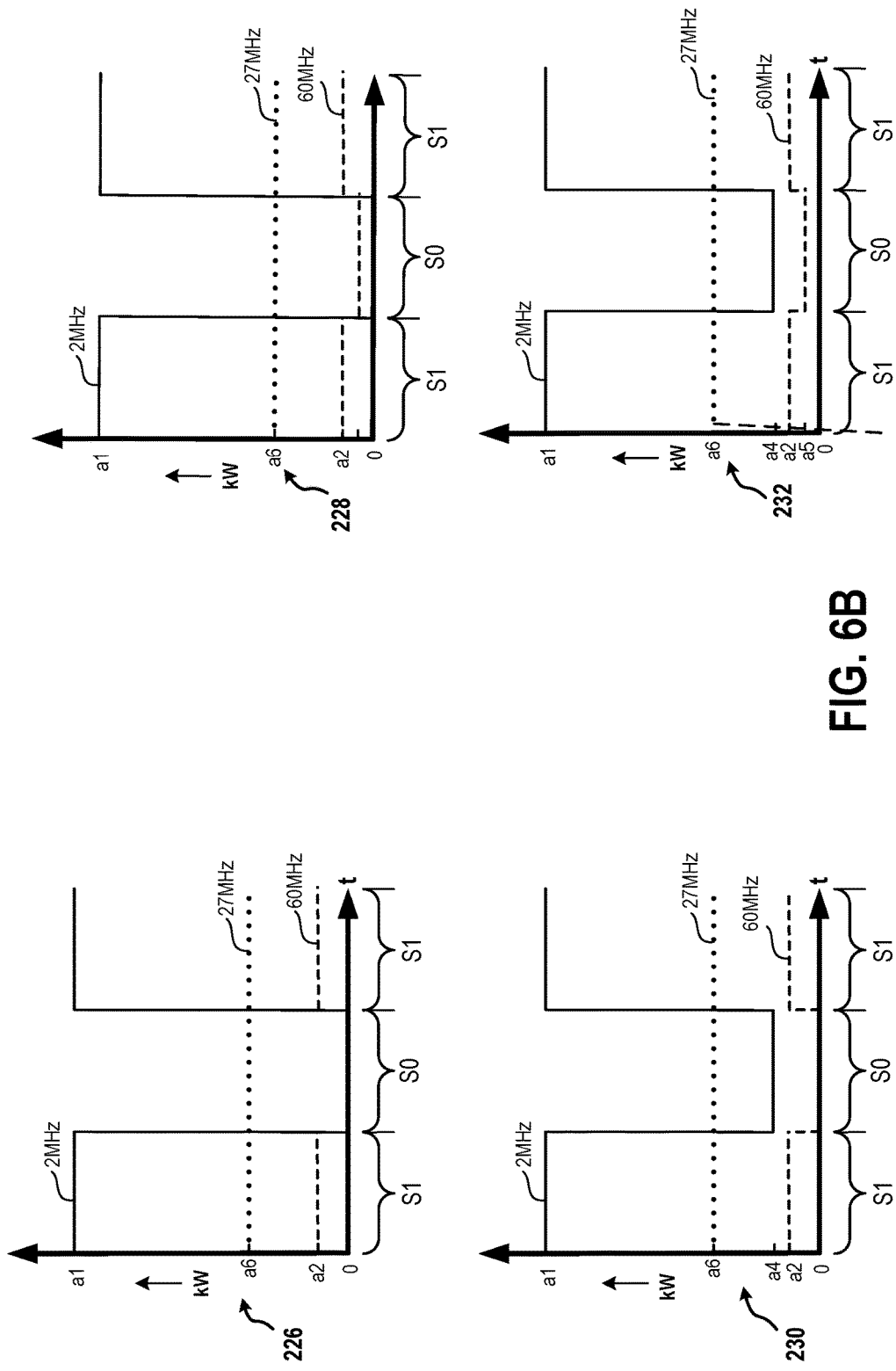
FIG. 6B shows graphs with three RF signals in which one of the RF signals a constant value and the remaining two RF signals have varying values, in accordance with an embodiment described in the present disclosure.

FIG. 6B shows embodiments of graphs 226, 228, 230, and 232. Each graph 226, 228, 230, and 232 plots power values in kilowatts as a function of time t. Graph 226 is similar to graph 210 (FIG. 5B), graph 228 is similar to graph 212 (FIG. 5B), graph 230 is similar to graph 214 (FIG. 5B), and graph 232 is similar to graph 216 (FIG. 5B) except that the graphs 226, 228, 230, and 232 include a plot of a 27 MHz signal that has the power value of a6.

Figure 6C:
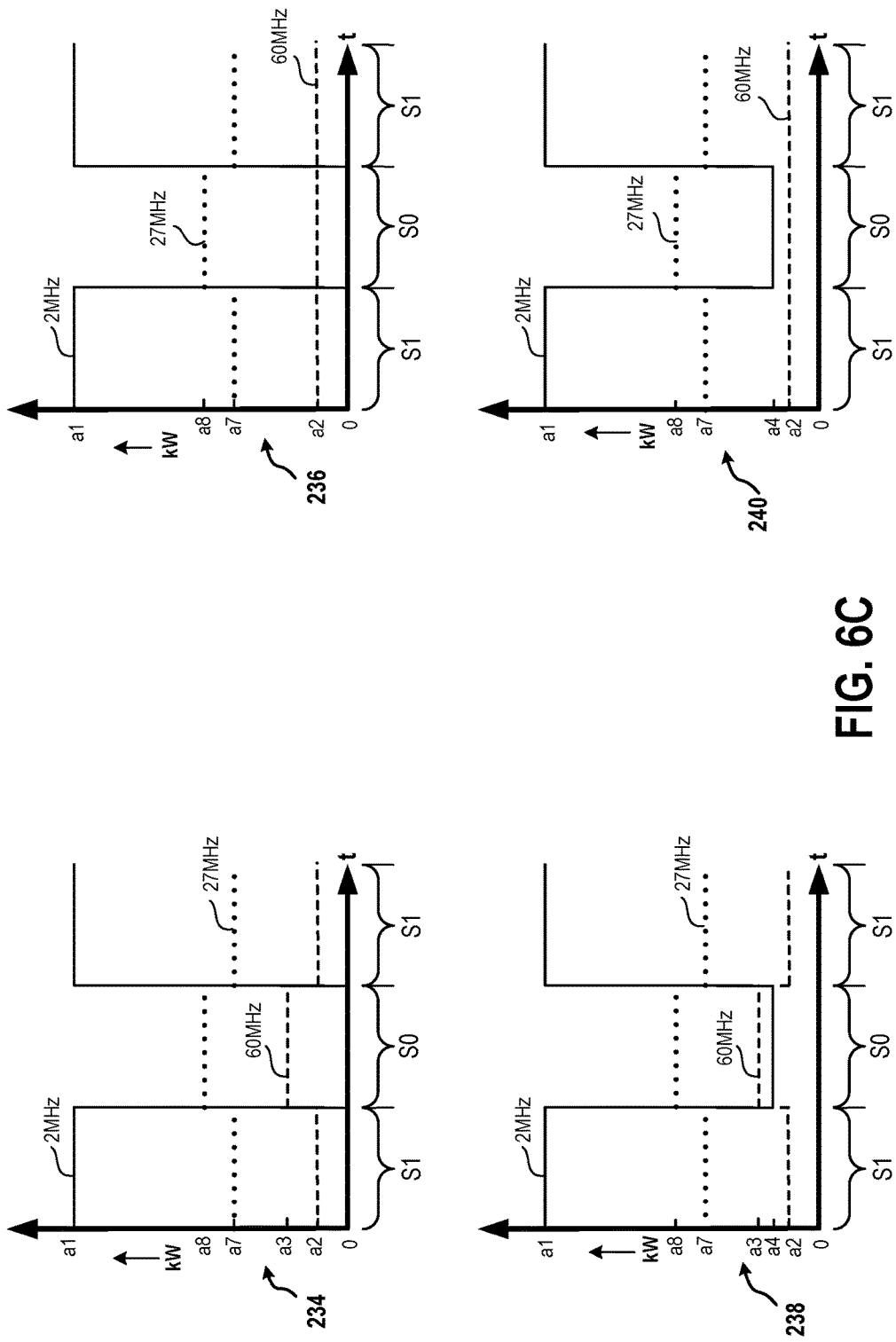
FIG. 6C shows graphs with three RF signals in which one of the RF signals has a constant value or varying values and the remaining two RF signals have varying values, in accordance with an embodiment described in the present disclosure.

FIG. 6C shows embodiments of graphs 234, 236, 238, and 240. Each graph 234, 236, 238, and 240 plots power values in kilowatts as a function of time t. Graph 234 is similar to graph 202 (FIG. 5A), graph 236 is similar to graph 204 (FIG. 5A), graph 238 is similar to graph 206 (FIG. 5A), and graph 240 is similar to graph 208 (FIG. 5A) except that the graphs 234, 236, 238, and 240 include a plot of a 27 MHz signal. The 27 MHz signal transitions from having a power value of a7 during the state S1 to having a power value of a8 during the state S0. The power value a7 is less than the power value a8.

Figure 6D:
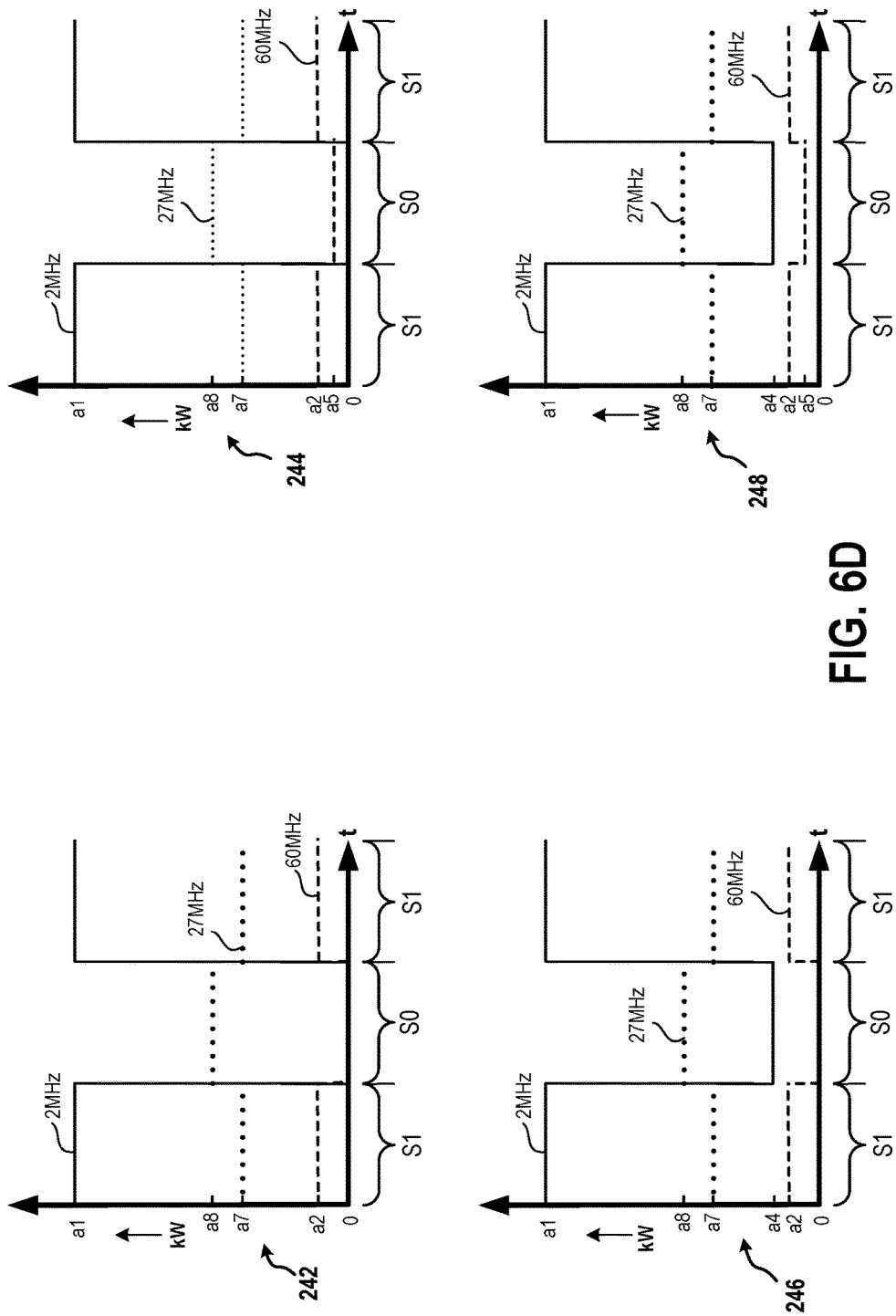
FIG. 6D shows graphs with all three RF signals have varying values, in accordance with an embodiment described in the present disclosure.

FIG. 6D shows embodiments of graphs 242, 244, 246, and 248. Each graph 242, 244, 246, and 248 plots power values in kilowatts as a function of time t. Graph 242 is similar to graph 210 (FIG. 5B), graph 244 is similar to graph 212 (FIG. 5B), graph 246 is similar to graph 214 (FIG. 5B), and graph 248 is similar to graph 216 (FIG. 5B) except that the graphs 242, 244, 246, and 248 include a plot of a 27 MHz signal that has the power values of a7 and a8.

Figure 6E:
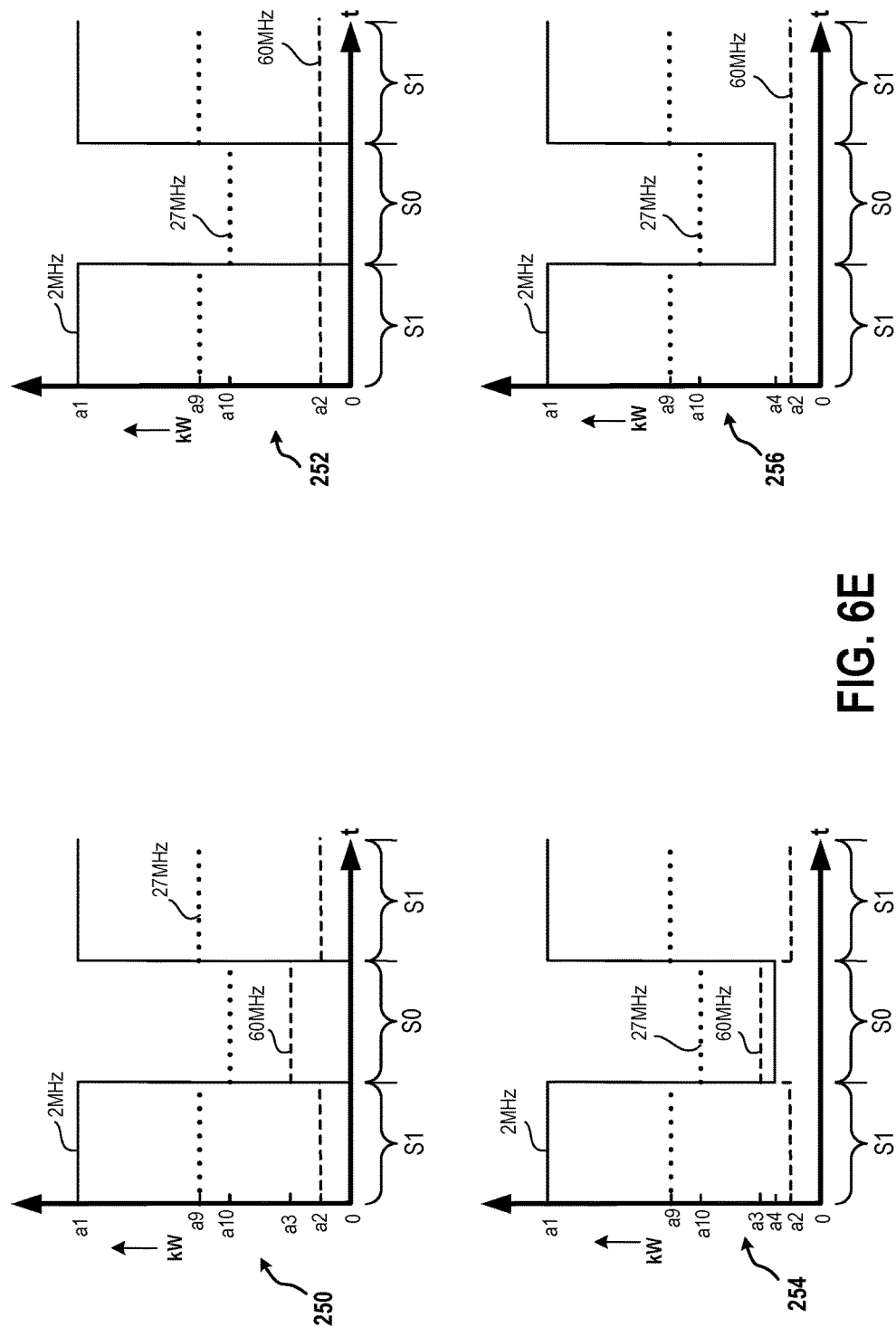
FIG. 6E shows graphs with three RF signals in which one of the RF signals has a constant value or varying values and the remaining RF signals have varying values, in accordance with an embodiment described in the present disclosure.

FIG. 6E shows embodiments of graphs 250, 252, 254, and 256. Each graph 250, 252, 254, and 256 plots power values in kilowatts as a function of time t. Graph 250 is similar to graph 202 (FIG. 5A), graph 252 is similar to graph 204 (FIG. 5A), graph 254 is similar to graph 206 (FIG. 5A), and graph 256 is similar to graph 208 (FIG. 5A) except that the graphs 250, 252, 254, and 256 include a plot of a 27 MHz signal. The 27 MHz signal transitions from having a power value of a9 during the state S1 to having a power value of a10 during the state S0. The power value a9 is greater than the power value a10.

FIG. 6F shows embodiments of graphs 258, 260, 262, and 264. Each graph 258, 260, 262, and 264 plots power values in kilowatts as a function of time t. Graph 258 is similar to graph 210 (FIG. 5B), graph 260 is similar to graph 212 (FIG. 5B), graph 262 is similar to graph 214 (FIG. 5B), and graph 264 is similar to graph 216 (FIG. 5B) except that the graphs 258, 260, 262, and 264 include a plot of a 27 MHz signal that has the power values of a9 and a10.

It should be noted that in the graphs 202, 204, 206, 208, 210, 212, 214, 216, 218, 220, 222, 224, 226, 228, 230, 232, 234, 236, 238, 240, 242, 244, 246, 248, 250, 252, 254, 256, 258, 260, 262, and 264 shown above, the 2 MHz signal is shown as a solid line, the 60 MHz signal is shown as a dashed line, and the 27 MHz signal is shown as a dotted line.

In some embodiments, each graph of FIGS. 4, 5A, 5B, 5C, 6A, 6B, 6C, 6D, 6E, and 6F plots root mean square (RMS)

values of power of an RF signal as having the state S0 and the state S1. The states S0 and S1 recur periodically. Each state is associated with a combination of an RMS value of power of an RF generator, a frequency of the RF generator, a current of the RF generator, a voltage of the RF generator, a pressure within a plasma chamber 114, a gap between the upper electrode 194 and the ESC 146 of the plasma chamber 114, and a rate of flow of one or more process gases within the plasma chamber 114. For example, a first combination of frequency, an RMS value of power, pressure, gap, and a rate of flow of chemistry is used during the state S0 and a second combination of frequency, an RMS value of power, pressure, gap, and a rate of flow of chemistry is used during the state S1. In some embodiments, a chemistry includes one or more process gases. To further illustrate, in the first combination, a first frequency value, an RMS value of power, pressure, gap, and a rate of flow of chemistry are used and in the second combination, a second frequency value, and the same RMS value of power, the same amount of pressure, the same amount of gap, and the same rate of flow of the same chemistry as in the first combination are used. As another illustration, in the first combination, the first frequency value, a first RMS power value, pressure, gap, and a rate of flow of chemistry are used and in the second combination, the second frequency value, a second RMS power value, and the same amount of pressure, the same amount of gap, and the same rate of flow of the same chemistry as that in the first combination are used. In some embodiments, pressure within the plasma chamber 114 is wafer area pressure (WAP).

In some embodiments, instead of RMS values of power of an RF signal, any other statistical measure, e.g., mean values, peak-to-peak amplitude, zero-to-peak amplitude, median values, etc., of power is used in a graph and plotted versus time.

Figure 7:
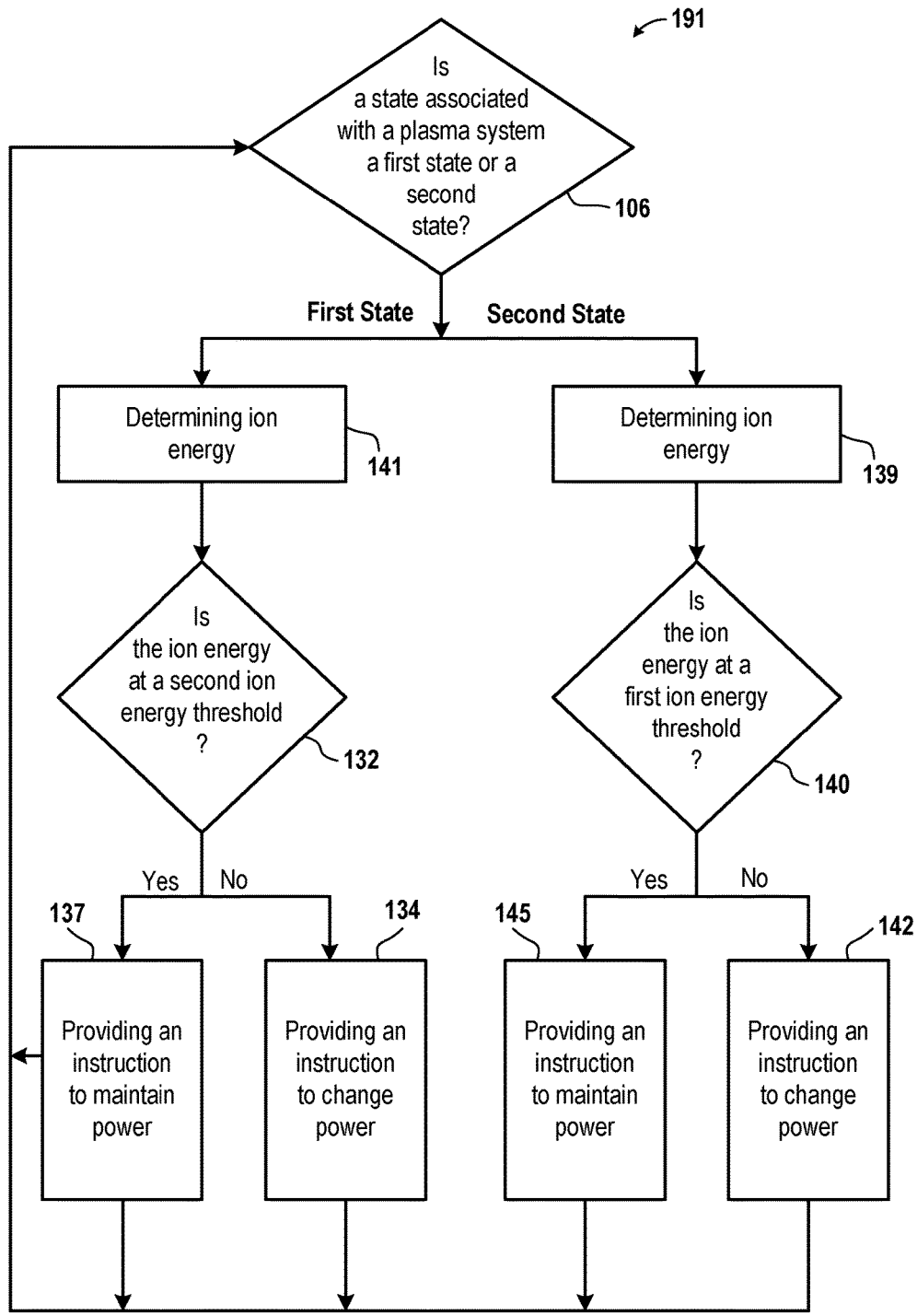
FIG. 7 is a flowchart of an embodiment of a method for using ion energy for states associated with the plasma system of FIG. 2, in accordance with an embodiment described in the present disclosure.

FIG. 7 is a flowchart of an embodiment of a method 191 for using ion energy for states associated with the plasma system 104 (FIG. 2). The method 191 is described with reference to FIG. 2. The method 191 is executed by one or more processors, e.g., a processor of the host system 180 (FIG. 2), or the DSP 166, or the DSP 178 (FIG. 2), or a combination of the processor of the host system 180 and the DSP 166, or a combination of the processor of the host system 180 and the DSP 178, etc.

The operation 106 is performed. Upon determining that the state associated with the plasma system 104 is the first state, in an operation 131, ion energy within the plasma chamber 114 is determined. The ion energy within the plasma chamber 114 during the first state is determined in a manner similar to determining ion energy within the plasma chamber 114 during the second state. For example, when the RF signal 154 (FIG. 2) is transferred to the plasma chamber 114, the voltage and current probe 152 (FIG. 2) measures the complex voltage and current at the communication medium 110 and provides the measured complex voltage and current to a processor of the host system 180 (FIG. 2) via the DSP 166 (FIG. 2). The complex voltage and current is propagated via one or more models of one or more parts of the plasma system 104 to calculate a complex voltage and current at a model node, e.g., an output of the one or more models, an input of a model, within a model etc. Based on the complex voltage and current at the model node, the processor of the host system 180 determines an ion energy. In this example, the processor determines the ion energy using the equation (1).

On the other hand, upon determining that the state associated with the plasma system 104 is the second state, in an operation 139, ion energy is determined. The ion energy is determined in the operation 139 in a manner similar to determining the second variable during the operation 116 (FIG. 3) except that the second variable is ion energy. For example, the equation (1) is used to determine the ion energy.

Moreover, in an operation 140, it is determined whether the ion energy determined during the operation 139 meets a first ion energy threshold. For example, it is determined whether the ion energy determined during the operation 139 exceeds the first ion energy threshold. The operation 140 is similar to the operation 118 (FIG. 3) except that the second variable is ion energy and the first threshold of the operation 118 is the first ion energy threshold. For example, it is determined whether the ion energy determined during the operation 139 exceeds the first ion energy threshold. The first ion energy threshold is stored within a storage device, e.g., a storage device of the host system 180 or any other storage device of the plasma system 104.

Upon determining that the ion energy determined during the operation 139 exceeds the first ion energy threshold, in an operation 142, an instruction is provided to change power of the RF signal 156 (FIG. 2). For example, upon determining that the ion energy determined during the operation 139 exceeds the first ion energy threshold, in the operation 142, an instruction is provided to reduce power of the RF signal 156. The operation 142 is similar to the operation 127 (FIG. 3) except that the operation 142 is performed with respect to ion energy and the first ion energy threshold. For example, the processor of the host system 180 provides an instruction to the DSP 166 (FIG. 2) to reduce power from the power value Px0 to a power value at which the ion energy determined during the operation 139 does not exceed the first ion energy threshold. As another example, the operations 106, 139, 140, and 142 are iteratively repeated until the power value Px0 is reduced to a value at which the ion energy determined during the operation 139 does not exceed the first ion energy threshold. As a further example, to iteratively determine the power value at which the ion energy determined during the operation 139 does not exceed the first ion energy threshold, the operation 106 is not repeated. Rather, the operations 139, 140, and 142 are iteratively repeated.

On the other hand, upon determining that the ion energy determined during the operation 139 does not exceed the first ion energy threshold, in the operation 140, it is determined whether the ion energy determined during the operation 139 is less than the first ion energy threshold. Upon determining that the ion energy determined during the operation 139 is less than the first ion energy threshold, in the operation 142, an instruction is provided by the processor of the host system 180 to increase the power value Px0. For example, the processor of the host system 180 provides an instruction to the DSP 166 to increase power from the power value Px0 and the DSP 166 increases the power value Px0 to the power value "Px0+1". As another example, the operations 106, 139, 140, and 142 are iteratively repeated until the power value Px0 is increased to a value at which the ion energy determined during the operation 139 is not lower than the first ion energy threshold. As a further example, to iteratively determine the power value at which the ion energy determined during the operation 139 is not less than the first ion energy threshold, the operation 106 is not repeated. Rather, the operations 139, 140, and 142 are repeated. The method 191 is repeated after the operation 142.

On the other hand, upon determining that the ion energy determined during the operation 139 is not less than the first ion energy threshold and does not exceed the first ion energy threshold, in an operation 145, an instruction is provided to maintain the power value Px0 in a manner similar to that described above with reference to the operation 141 (FIG. 3). The method 191 repeats after the operation 145.

In an operation 132, it is determined whether the ion energy determined during the operation 141 meets a second ion energy threshold. For example, it is determined whether the ion energy determined during the operation 141 exceeds the second ion energy threshold. The second ion energy threshold is stored within a storage device, e.g., a storage device of the host system 180 or any other storage device of the plasma system 104.

Upon determining that the ion energy determined during the operation 141 exceeds the second ion energy threshold, in an operation 134, an instruction is provided to change power of the RF signal 154 (FIG. 2). For example, upon determining that the ion energy determined during the operation 141 exceeds the second ion energy threshold, in the operation 134, an instruction is provided to reduce power of the RF signal 154. The operation 134 is similar to the operation 126 (FIG. 3) except that the operation 134 is performed with respect to the second ion energy threshold and is performed with respect to the determined ion energy of operation 141. For example, processor of the host system 180 provides an instruction to the DSP 166 (FIG. 2) to reduce power from the power value Px1 to a power value at which the ion energy determined during the operation 141 does not exceed the second ion energy threshold. As another example, the operations 106, 141, 132, and 134 are iteratively repeated until the power value Px1 is reduced to a value at which the ion energy determined during the operation 141 does not exceed the second ion energy threshold. As a further example, to iteratively determine the power value at which the ion energy determined during the operation 141 does not exceed the second ion energy threshold, the operation 106 is not repeated. Rather, the operations 141, 132, and 134 are iteratively repeated.

On the other hand, upon determining that the ion energy determined during the operation 141 does not exceed the second ion energy threshold, in the operation 132, it is determined whether the ion energy determined during the operation 141 is less than the second ion energy threshold. Upon determining that the ion energy determined during the operation 141 is less than the second ion energy threshold, in the operation 134, an instruction is provided by the processor of the host system 180 to increase the power value Px1. The operation 134 is similar to the operation 126 (FIG. 3) except that the operation 134 is performed with respect to the second ion energy threshold and with respect to the determined ion energy of operation 141. For example, the processor of the host system 180 provides an instruction to the DSP 166 to increase power from the power value Px1 and the DSP 166 increases the power value Px1 to the power value "Px1+1". As another example, the operations 106, 141, 132, and 134 are iteratively repeated until the power value Px1 is increased to a value at which the ion energy determined during the operation 141 is not lower than the second ion energy threshold. As a further example, to iteratively determine the power value at which the ion energy determined during the operation 141 is not less than the second ion energy threshold, the operation 106 is not repeated. Rather, the operations 141, 132, and 134 are repeated. The method 191 is repeated after the operation 134.

On the other hand, upon determining that the ion energy determined during the operation 141 is not less than the second ion energy threshold and does not exceed the second ion energy threshold, in an operation 137, an instruction is provided to maintain the power value Px1. For example, the processor of the host system 180 provides an instruction to the DSP 166 to continue to provide the power value Px1 to the parameter control 168. In one embodiment, the processor of the host system 180 provides the power value Px1 to the DSP 166 and the DSP 166 provides the power value Px1 to the parameter control 168. The method 191 repeats after the operation 137.

The use of ion energy in various embodiments of the present disclosure results in a low measured time between failures (MTBF).

Figure 8:
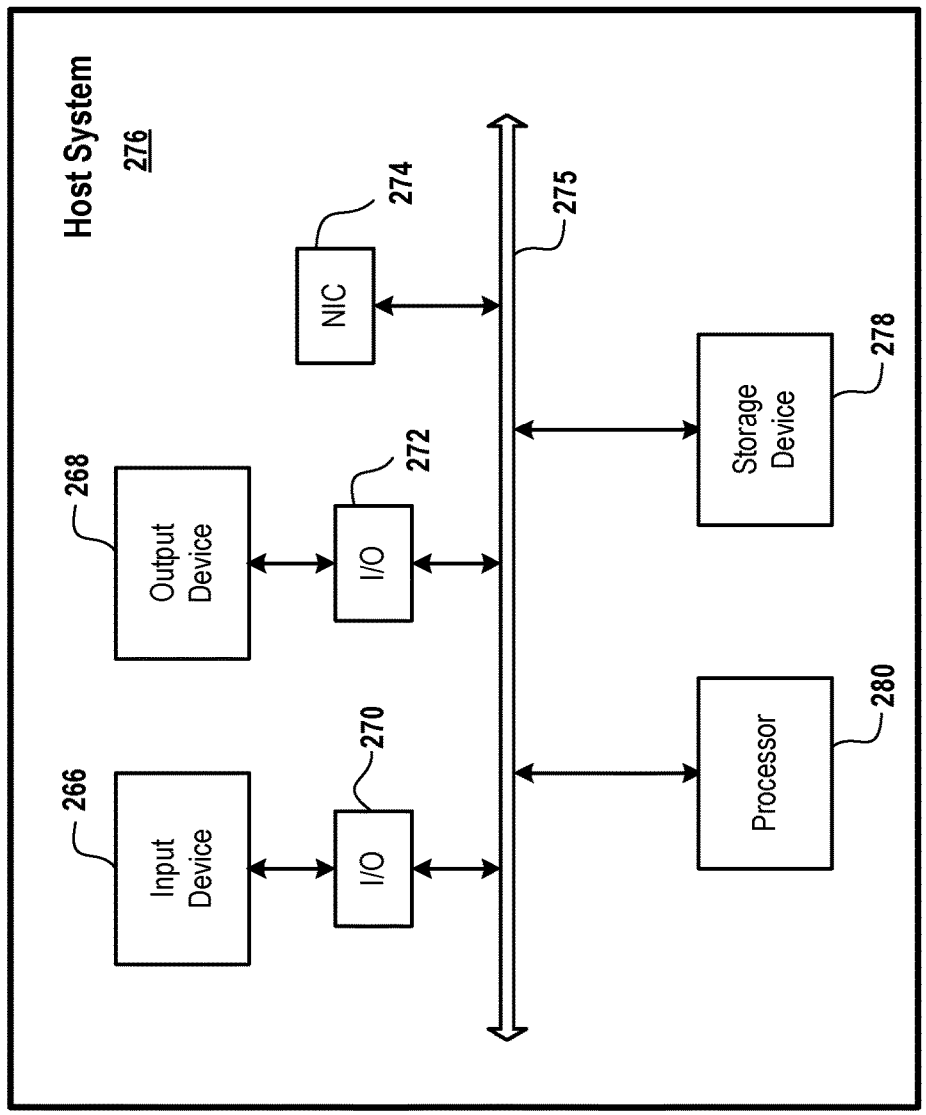
FIG. 8 is a block diagram of an embodiment of a host system that is used to execute the methods of FIGS. 3 and 7, in accordance with one embodiment described in the present disclosure.

FIG. 8 is a block diagram of an embodiment of the host system 276, which is an example of the host system 180 (FIG. 1). The host system 276 includes a processor 280, a storage device 278, an input device 266, an output device 268, an input/output (I/O) interface 270, an I/O interface 272, a network interface controller (NIC) 274, and a bus 275. The processor 280, the storage device 278, the input device 266, the output device 268, the I/O interface 270, the I/O interface 272, and the NIC 274 are coupled with each other via the bus 275. Examples of the input device 266 include a mouse, a keyboard, a stylus, etc. Examples of the output device 268 include a display, a speaker, or a combination thereof. The display may be a liquid crystal display, a light emitting diode display, a cathode ray tube, a plasma display, etc. Examples of the NIC 274 include a network interface card, a network adapter, etc.

Examples of an I/O interface include an interface that provides compatibility between pieces of hardware coupled to the interface. For example, the I/O interface 270 converts a signal received from the input device 266 into a form, amplitude, and/or speed compatible with the bus 275. As another example, the I/O interface 272 converts a signal received from the bus 275 into a form, amplitude, and/or speed compatible with the output device 268.

Figure 9A:
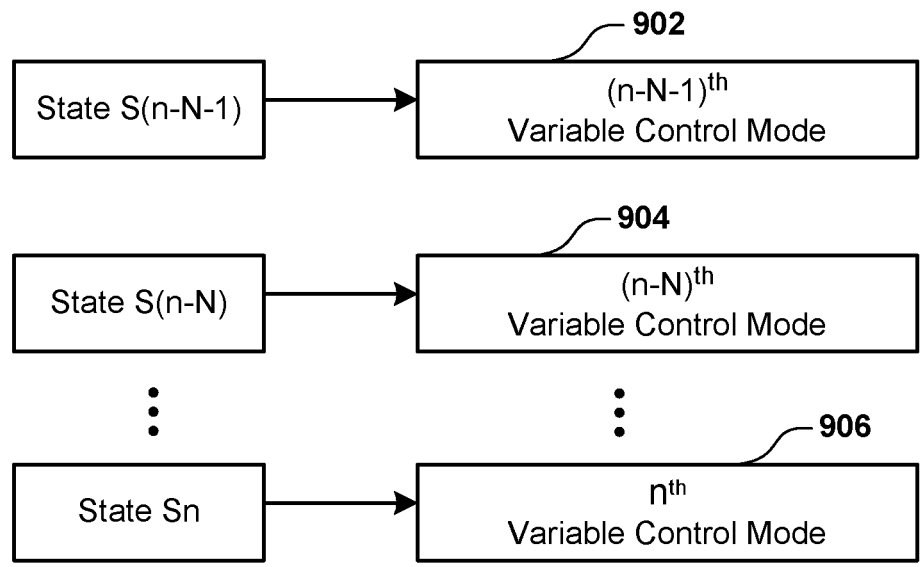
FIG. 9A is a diagram to illustrate systems and methods for using variables based on three or more states associated with a plasma system.

FIG. 9A is a diagram that is used to illustrate systems and methods for using variables based on three or more states associated with a plasma system. When a state associated with the plasma system is S(n−N−1), the plasma system is operated in a variable control mode 902, where each of n and N is an integer, n is greater than N and equal to or greater than 3, and N is equal to or greater than one. Examples of the state S(n−N−1) include a state S1. During the variable control mode 902, an (n−N−1)th variable associated with plasma of the plasma system is measured and impedance of the plasma is controlled based on one or more values of the (n−N−1)th variable. Examples of the (n−N−1)th variable include voltage, current, power, impedance, ion energy, bias potential, or a combination of two or more thereof.

Moreover, when a state associated with the plasma system is S(n−N), the plasma system is operated in an (n−N)th variable control mode 904. Examples of the state S(n−N) include a state S2. During the (n−N)th variable control mode 904, an (n−N)th variable associated with plasma of the plasma system is measured and impedance of the plasma is controlled based on one or more values of the (n−N)th variable. Examples of the (n−N)th variable are the same as that of the (n−N−1)th variable.

Also, when a state associated with the plasma system is Sn, the plasma system is operated in an nth variable control mode 906. Examples of the state Sn include a state S3. During the nth variable control mode 904, an nth variable associated with plasma of the plasma system is measured and impedance of the plasma is controlled based on one or more values of the nth variable. Examples of the nth variable are the same as that of the n−N−1th variable.

In some embodiments, the (n−N)th variable is other than, e.g., different from, not the same as, etc., the (n−N−1)th variable and is other than the nth variable. For example, the (n−N)th variable is not the same as the (n−N−1)th variable and not the same as the nth variable. To illustrate, when the (n−N)th variable is power associated with plasma within the plasma system, the (n−N−1)th variable is ion energy associated with the plasma and the nth variable is voltage associated with the plasma. To further illustrate, when the (n−N)th variable is power associated with plasma within the plasma system, the (n−N−1)th variable is RF voltage associated with the plasma and the nth variable is RF current associated with the plasma. As another illustration, when the (n−N)th variable is bias potential associated with plasma within the plasma system, the (n−N−1)th variable is RF voltage associated with the plasma, and the nth variable is RF current or ion energy associated with the plasma.

In various embodiments, the (n−N−1)th variable is the same as the nth variable and is different from the (n−N)th variable. In some embodiments, the (n−N−1)th variable is the same as the (n−N)th variable but is different from the nth variable.

In some embodiments, the state Sn is consecutive to the state S(n−N), which is consecutive to the state S(n−N−1). For example, the state (n−N−1) is immediately followed by the state S(n−N), which is immediately followed by the state n, which is followed by a repetition of the states S(n−N−1), S(n−N), and Sn.

In various embodiments, there are multiple states between the states S(n−N) and Sn. For example, when the state S(n−N) is a state S2, the state Sn is a state S5. There are two states S3 and S4 between the states S2 and S5. The state S5 is consecutive to the state S4, which is consecutive to the state S3, which is consecutive to the state S2. The state S2 is consecutive to the state S1. As another example, when the state S(n−N) is a state S2, the state Sn is a state S6. There are three states S3, S4, and S5 between the states S2 and S5. The state S6 is consecutive to the state S5, the state S5 is consecutive to the state S4, which is consecutive to the state S3, which is consecutive to the state S2. The state S2 is consecutive to the state S1.

Figure 9B:
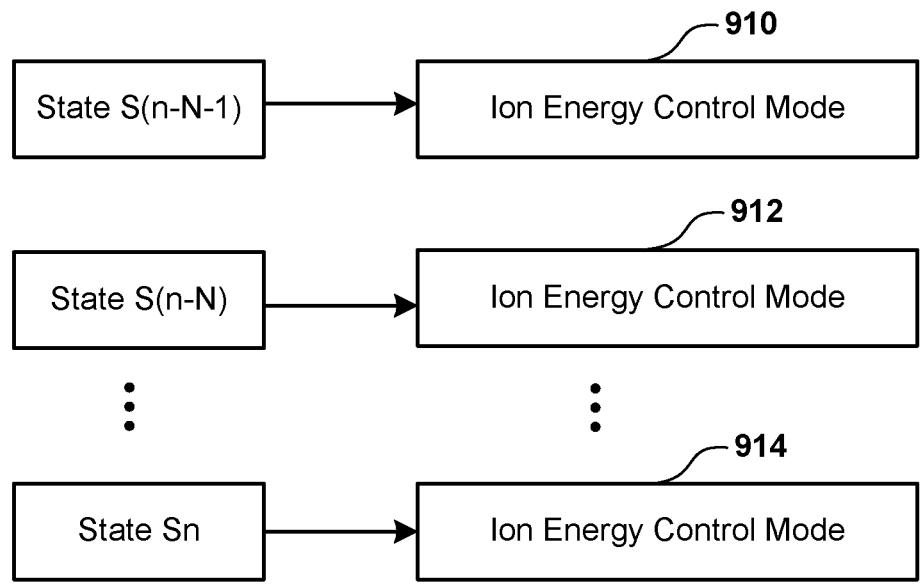
FIG. 9B is a diagram illustrating use of ion energy control modes during the states.

FIG. 9B is a diagram illustrating use of ion energy control modes 910, 912, and 914 during the states S(n−N−1), S(n−N), and Sn. During each ion energy control mode 910, 912, and 914, ion energy associated with plasma within the plasma system is controlled. For example, during each of the states S(n−N−1), S(n−N), and Sn, ion energy associated with plasma within the plasma system is measured or determined and impedance of the plasma is controlled based on one or more values of the ion energy.

In various embodiments, the same variable, e.g., voltage, power, etc., is controlled during each of the states S(n−N−1), S(n−N), and Sn.

Figure 10A:
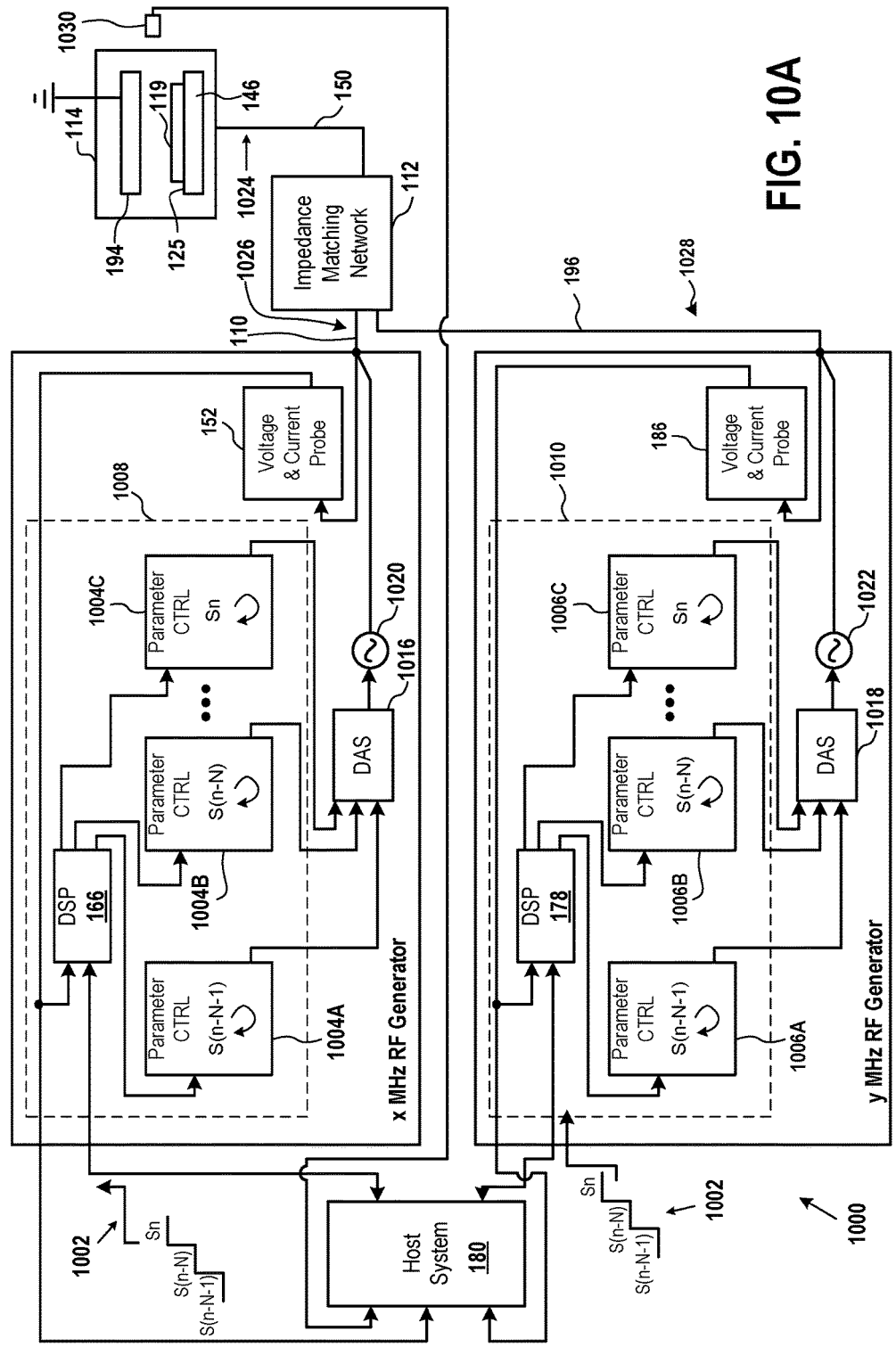
FIG. 10A is a block diagram of an embodiment of a plasma system.

FIG. 10A is a block diagram of an embodiment of a plasma system 1000. The plasma system 1000 includes the host system 180 that is coupled to an x MHz RF generator and to a y MHz RF generator. Examples of x MHz and y MHz are provided above.

The host system 180 generates a digital pulsing signal 1002, e.g., a transistor-transistor logic (TTL) signal, that has the states S(n−N−1), S(n−N), and Sn. In one embodiment, a state associated with the plasma system 1000 is the same as the state of the digital pulsing signal 1002. In some embodiments, the states S(n−N−1), S(n−N), and Sn occur during a clock cycle of a clock signal. In various embodiments, the states S(n−N−1), S(n−N), and Sn occur during multiple clock cycles. The clock signal is generated by a clock source, e.g., an oscillator, within the host system 180 or outside of the host system 180.

The digital pulsing signal 1002 is sent by the host system 180 to the DSP 166 of the x MHz RF generator and to the DSP 178 of the y MHz RF generator. Upon receiving the digital pulsing signal 1002, each DSP 166 and 178 determines whether a state of the digital pulsing signal 112 is S(n−N−1), S(n−N), or Sn. For example, the DSP 166 distinguishes between the states S(n−N−1), S(n−N), and Sn. As another example, the DSP 166 determines that the digital pulsing signal 122 has a first magnitude during a first portion of the clock cycle of the clock signal, a second magnitude during a second portion of the clock cycle, and a third magnitude during a third portion of the clock cycle. In various embodiments, the clock source provides the clock signal to the DSP 166. The DSP 166 determines that the digital pulsing signal 1002 has the state S(n−N−1) during the first portion of the clock cycle, has the state S(n−N) during the second portion of the clock cycle, and the state Sn during the third portion of the clock cycle. As yet another example, the DSP 166 compares a magnitude of the digital pulsing signal 122 with a pre-stored range to determine that the magnitude of the digital pulsing signal 122 is greater than the pre-stored range during the first portion of the clock cycle, is within the pre-stored range during the second portion of the clock cycle, or is lower than the pre-stored range during the third portion of the clock cycle. Upon determining that the magnitude is less than the pre-stored range during the first portion of the clock cycle, the DSP 166 determines that the digital pulsing signal has the state S(n−N−1) during the first portion of the clock cycle. Similarly, upon determining that the magnitude is within the pre-stored range during the second portion of the clock cycle, the DSP 166 determines that the digital pulsing signal has the state S(n−N) during the second portion of the clock cycle. Moreover, upon determining that the magnitude is greater the pre-stored range during the third portion of the clock cycle, the DSP 166 determines that the digital pulsing signal has the state Sn during the third portion of the clock cycle.

When the state of the digital pulsing signal 1002 is S(n−N−1), the DSP 166 generates a parameter value Px(n−N−1) and provides the parameter value Px(n−N−1) to a parameter control 1004A of the x MHz RF generator. Similarly, when the state associated with the plasma system 102 is S(n−N−1), the DSP 178 of the y MHz RF generator generates a parameter value Py(n−N−1) and provides the parameter value Py(n−N−1) to a parameter control 1006A of the y MHz RF generator.

Moreover, when the state of the digital pulsing signal 1002 is S(n−N), the DSP 166 generates a parameter value Px(n−N) and provides the parameter value Px(n−N) to a parameter control 1004B of the x MHz RF generator. Similarly, when the state associated with the plasma system 102 is S(n−N), the DSP 178 of the y MHz RF generator generates a parameter value Py(n−N) and provides the parameter value Py(n−N) to a parameter control 1006B of the y MHz RF generator.

Furthermore, when the state of the digital pulsing signal 1002 is Sn, the DSP 166 generates a parameter value Pxn and provides the parameter value Pxn to a parameter control 1004C of the x MHz RF generator. Similarly, when the state associated with the plasma system 102 is Sn, the DSP 178 of the y MHz RF generator generates a parameter value Pyn and provides the parameter value Pyn to a parameter control 1006C of the y MHz RF generator.

It should be noted that in one embodiment, a parameter control of an RF generator is a portion of a computer program that is embodied within a computer-readable medium and that is executed by a DSP of the RF generator. For example, the parameter controls 1004A, 1004B, and 1004C are logic blocks, e.g., tuning loops, which are portions of a computer program that is executed by the DSP 166. As another example, the parameter controls 1006A, 1006B, and 1006C are logic blocks of a computer program that is executed by the DSP 178.

In an embodiment, a hardware controller, e.g., a microcontroller, an ASIC, a PLD, etc., is used instead of a parameter control. For example, a controller is used instead of the parameter control 1004A, another controller is used instead of the parameter control 1004B, yet another controller is used instead of the parameter control 1004C, a controller is used instead of the parameter control 1006A, another controller is used instead of the parameter control 1006B, and yet another controller is used instead of the parameter control 1006C.

The parameter control 1004A, the parameter control 1004B, the parameter control 1004C and the DSP 166 are parts of a control system 1008. Similarly, the parameter control 1006A, the parameter control 1006B, the parameter control 1006C and the DSP 178 are parts of a control system 1010.

During the state S(n–N–1) associated with the plasma system 1000, the parameter control 1004A that is coupled to the DSP 166 and to the DAS 172 of the x MHz RF generator receives the parameter value Px(n–N–1) from the DSP 166. Based upon the parameter value Px(n–N–1), the x MHz RF generator generates an RF signal 1026 on the communication medium 110 and the RF signal is sent from the x MHz RF generator via the communication medium 110 to the impedance matching network 112. For example, the parameter control 1004A looks-up a drive parameter value corresponding to, e.g., having a one-to-one mapping with, linked to, etc., the parameter value Px(n–N–1) to provide to a driver, e.g., one or more transistors, of a DAS 1016 of the x MHz RF generator. In some embodiments, a DAS includes a driver that is coupled to an amplifier.

Moreover, in various embodiments, the parameter values Px(n–N–1), Px(n–N), and Pxn are received from the processor of the host system 180 by the DSP 166. For example, during the state S(n–N–1), the parameter value Px(n–N–1) is received by the DSP 166. Moreover, during the state S(n–N), the parameter value Px(n–N) is received by the DSP 166 and during the state Sn, the parameter value Pxn is received by the DSP 166. Similarly, in these embodiments, the parameter values Py(n–N–1), Py(n–N), and Pyn are received from the processor of the host system 180 by the DSP 178.

The driver of the DAS 1016 generates a drive signal having the drive parameter value and provides the RF signal to an amplifier of the DAS 1016. The amplifier of the DAS 1016 amplifies the drive signal to generate an amplified signal. The amplifier of the DAS 1016 provides the amplified signal to an RF power supply 1020 that is coupled to the DAS 1016. An example of an RF power supply includes an RF oscillator. Upon receiving the amplified signal, the RF power supply 1020 generates the RF signal 1026 having the parameter value Px(n–N–1) that is sent via an output 1012 of the x MHz RF generator and the communication medium 110 to the impedance matching network 112. The output 1012 of the x MHz RF generator is coupled to the communication medium 110.

Similarly, during the state S(n–N–1) associated with the plasma system 1000, a DAS 1018 of the y MHz RF generator generates an amplified signal, which is provided to an RF power supply 1022 of the y MHz RF generator. Upon receiving the amplified signal, the RF power supply 1022 generates an RF signal 1028 having the parameter value Py(n–N–1) that is sent via an output 1014 of the y MHz RF generator and the communication medium 196 to the impedance matching network 112. The output 1014 of the y MHz RF generator is coupled to the communication medium 196.

During the state S(n–N–1), the impedance matching network 112 combines the RF signals 1026 and 1028 received from the x and y MHz RF generators and matches an impedance of the load with the source to further generate a modified RF signal 1024. The modified RF signal 1024 is transferred via the RF transmission line 150 to the ESC 146 to provide RF power to the lower electrode of the ESC 146.

Moreover, during the state S(n–N) associated with the plasma system 1000, the parameter control 1004B that is coupled to the DSP 166 and to the DAS 1016 receives the parameter value Px(n–N) from the DSP 166. Based upon the parameter value Px(n–N), the x MHz RF generator generates the RF signal 1026 that is sent from the x MHz RF generator via the communication medium 110 to the impedance matching network 112. For example, the parameter control 1004B looks-up a drive parameter value corresponding to the parameter value Px(n–N) to provide to the driver of the DAS 1016. The driver of the DAS 1016 generates a drive signal and provides the signal to the amplifier of the DAS 1016. The amplifier of the DAS 1016 amplifies the drive parameter value to generate an amplified signal. The amplified signal is supplied from the amplifier of the DAS 1016 to the RF power supply 1020 to generate the RF signal 1026 having the parameter value Px(n–N) during the state S(n–N). The RF signal generated during the state S(n–N) is provided from the RF power supply 1020 via the output 1012 and the communication medium 110 to the impedance matching network 112.

Similarly, during the state S(n–N) associated with the plasma system 1000, the DAS 1018 of the y MHz RF generator generates an amplified signal, which is provided to the RF power supply 1022 of the y MHz RF generator. Upon receiving the amplified signal, the RF power supply 1022 generates the RF signal 1028 having the parameter value Py(n–N) that is sent via the output 1014 of the y MHz RF generator and the communication medium 196 to the impedance matching network 112.

During the state (n–N), the RF signals 1026 and 1028 received from the x MHz RF generator and the y MHz RF generator are combined in the impedance matching network 112 to generate the modified RF signal 1024. The modified RF signal 1024 is provided via the RF transmission line 150 to the lower electrode of the ESC 146 of the plasma chamber 114.

Furthermore, during the state Sn associated with the plasma system 1000, the parameter control 1004C that is coupled to the DSP 166 and to the DAS 1016 receives the parameter value Pxn from the DSP 166. Based upon the parameter value Pxn, the x MHz RF generator generates the RF signal 1026 that is sent from the x MHz RF generator via the communication medium 110 to the impedance matching network 112. For example, the parameter control 1004C looks-up a drive parameter value corresponding to the parameter value Pxn to provide to the driver of the DAS 1016. The driver of the DAS 1016 generates a drive signal and provides the signal to the amplifier of the DAS 1016. The amplifier of the DAS 1016 amplifies the drive parameter value to generate an amplified signal. The amplified signal is supplied from the amplifier of the DAS 1016 to the RF power supply 1020 to generate an RF signal having the parameter value Pxn during the state Sn. The RF signal 1026 generated during the state Sn is provided from the RF power supply 1020 via the output 1012 and the communication medium 110 to the impedance matching network 112.

Similarly, during the state Sn associated with the plasma system 1000, the DAS 1018 generates an amplified signal, which is provided to the RF power supply 1022 of the y MHz RF generator. Upon receiving the amplified signal, the RF power supply 1022 generates the RF signal having 1028 the parameter value Pyn that is sent via the output 1014 of the y MHz RF generator and the communication medium 196 to the impedance matching network 112.

During the state n, the RF signals 1026 and 1028 received from the x MHz RF generator and the y MHz RF generator are combined in the impedance matching network 112 to generate the modified RF signal 1024. The modified RF signal 1024 is provided via the RF transmission line 150 to the lower electrode of the ESC 146 of the plasma chamber 114.

It should be noted that in response to power supplied within the RF signal 1026 and the RF signal 1028, power is reflected from the plasma chamber 114 towards the x MHz RF generator and the y MHz RF generator. For example, in response to forward power supplied within the RF signal 1024, power is reflected from the plasma chamber 114 via the RF transmission line 150, the impedance matching network 112, the communication medium 110, and the output 1012 to the x MHz RF generator. As another example, in response to supplied power within the RF signal 1028, power is reflected from the plasma chamber 114 via the RF transmission line 150, the impedance matching network 112, the communication medium 196, and the output 1014 to the y MHz RF generator.

During each of the states S(n−N−1), S(n−N), and Sn, the VI probe 152 of the x MHz RF generator senses the (n−N−1)th variable, e.g., complex voltage and current, etc., communicated at the output 1012. The variable that is sensed by the VI probe 152 is provided to the DSP 166. During the state S(n−N−1), the DSP 166 controls, e.g., changes, increases, decreases, etc., the parameter value Px(n−N−1) so that the (n−N−1)th variable sensed during the state S(n−N−1) matches a pre-determined threshold value of the (n−N−1)th variable. Similarly, during the state S(n−N), the DSP 166 controls the parameter value Px(n−N) so that the (n−N)th variable sensed during the state S(n−N) matches a pre-determined threshold value of the (n−N)th variable. Moreover, during the state Sn, the DSP 166 controls the parameter value Pxn so that the nth variable sensed during the state Sn matches a pre-determined threshold value of the nth variable.

Similarly, during each of the states S(n−N−1), S(n−N), and Sn, the VI probe 186 of the y MHz RF generator senses a variable communicated at the output 1014. The variable that is sensed by the VI probe 186 is provided to the DSP 178. During the state S(n−N−1), the DSP 178 controls the parameter value Py(n−N−1) so that the (n−N−1)th variable sensed by the VI probe 186 during the state S(n−N−1) matches a pre-determined threshold value of the (n−N−1)th variable. Similarly, during the state S(n−N), the DSP 178 controls the parameter value Py(n−N) so that the (n−N)th variable sensed by the VI probe 186 during the state S(n−N) matches a pre-determined threshold value of the (n−N)th variable. Moreover, during the state Sn, the DSP 178 controls the parameter value Pyn so that the nth variable sensed during the state Sn matches a pre-determined threshold value of the nth variable.

In some embodiments, during each of the states S(n−N−1), S(n−N), and Sn, the DSP 166 receives a value of a variable measured by the VI probe 152 and calculates another variable from the value of the variable received from the VI probe 152. For example, the DSP 166 calculates complex impedance as a ratio of complex voltage and complex current received from and measured by the VI probe 152. As another example, the DSP 166 calculates complex power as a product of complex voltage and complex current received from and measured by the VI probe 152. As yet another example, the DSP 166 calculates wafer bias from the complex voltage and current in a manner described above. As another example, the DSP 166 calculates ion energy from the complex voltage and current in a manner described above in equation (1). During the state S(n−N−1), the DSP 166 controls the parameter value Px(n−N−1) so that the other variable calculated during the state S(n−N−1) matches a pre-determined threshold value of the other variable. Similarly, during the state S(n−N), the DSP 166 controls the parameter value Px(n−N) so that the other variable calculated during the state S(n−N) matches a pre-determined threshold value of the other variable. Moreover, during the state Sn, the DSP 166 controls the parameter value Pxn so that the other variable calculated during the state Sn matches a pre-determined threshold value of the other variable.

Similarly, during each of the states S(n−N−1), S(n−N), and Sn, the DSP 178 receives a value of a variable from the VI probe 186 and calculates another variable from the value of the variable received from the VI probe 186. During each of the states S(n−N−1), S(n−N), and Sn, the DSP 178 controls the corresponding parameter values Py(n−N−1), Py(n−N), and Pyn so that the other variable calculated during the state matches a pre-determined threshold of the other variable for the state.

In various embodiments, instead of the DSP 166 calculating the other variable, the other variable is calculated by the processor of the host system 180 and communicated to the DSP 166. Similarly, in some embodiments, instead of the DSP 178 calculating the other variable, the other variable is calculated by the processor of the host system 180 and communicated to the DSP 178.

The plasma system 1000 further includes an optical sensor 1030, e.g., a photodiode, a high-speed photodiode, a high-speed photodetector, an optical spectrometer, etc., that is directed towards a window of the plasma chamber 114. The optical sensor 1030 is coupled to the processor of the host system 180. During each of the states S(n−N−1), S(n−N), and Sn, the optical sensor 130 measures values of a variable, e.g., intensity values of plasma, voltage of plasma, etc., and provides the values to the processor of the host system 180. The processor of the host system 180 provides the values of the variable received from the optical sensor 1030 to the DSP 166 and the DSP 178. The DSP 166 determines based on a value of the (n−N−1)th variable measured by the optical sensor 1030 during the state S(n−N−1) whether the value matches a pre-determined threshold value of the (n−N−1)th variable. Upon determining that the value of the (n−N−1)th variable measured by the optical sensor during the state S(n−N−1) does not match the pre-determined threshold value of the (n−N−1)th variable, the DSP 166 changes the parameter value Px(n−N−1). Similarly, the DSP 166 determines based on a value of the (n−N)th variable measured by the optical sensor 1030 during the state S(n−N) whether the value matches a pre-determined threshold value of the (n−N)th variable. Upon determining that the value of the (n−N)th variable measured by the optical sensor during the state S(n−N) does not match the pre-determined threshold value of the (n−N)th variable, the DSP 166 changes the parameter value Px(n−N). Moreover, the DSP 166 determines based on a value of the nth variable measured by the optical sensor 1030 during the state Sn whether the value matches a pre-determined threshold value of the nth variable. Upon determining that the value of the nth variable measured by the optical sensor during the state Sn does not match the pre-determined threshold value of the nth variable, the DSP 166 changes the parameter value Pxn.

Although two RF generators are shown in FIG. 10A, in some embodiments, any number of RF generators is used. For example, in addition to a 2 MHz RF generator and a 27 MHz RF generator, a 60 MHz RF generator may be used. As another example, the x MHz RF generator is used without using any other RF generator.

In some embodiments, instead of a VI probe, a power and complex gamma probe is used in an RF generator. For example, the power and complex gamma probe is coupled to the output 1012. The power and complex gamma probe measures complex supplied power and gamma, which in some embodiments, is a ratio of complex reflected power at the output 1012 to complex supplied power at the output 1012.

Figure 10B:
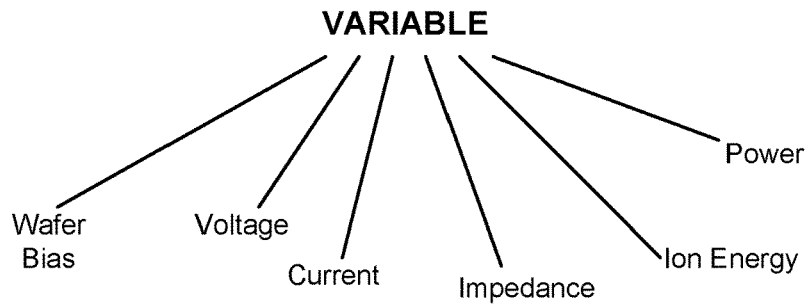
FIG. 10B is a diagram to illustrate different types of a variable.

FIG. 10B is a diagram to illustrate different types of a variable. Examples of the types of the variable include a wafer bias, a complex voltage, a complex current, complex impedance, complex power, and an ion energy. Each type of variable illustrated in FIG. 10B is an example of the (n−N−1)th variable, or the (n−N)th variable, or the nth variable. The complex voltage and the complex current are measured by a VI probe. Moreover, the complex impedance is calculated by either a DSP or the processor of the host system 180 from the complex voltage and the complex current as a ratio of the complex voltage and complex current. Furthermore, the complex power is calculated by either a DSP or the processor of the host system 180 as a product of the complex voltage and complex current. The wafer bias is calculated by either a DSP or the processor of the host system 180 by applying the equations (2), (3), or (4) from a magnitude of the complex voltage and a magnitude of the complex current. The ion energy is calculated by either a DSP or the processor of the host system 180 by applying the equation (1) from the wafer bias and a peak voltage, which is determined from the complex voltage.

It should be noted that in some embodiments, when a value of a variable is calculated during a state by the processor of the host system 180, the calculated value is provided from the host system 180 to a DSP of an RF generator via a cable, e.g., a cable for a serial transfer of data, a cable for a parallel transfer of data, a USB cable, etc., for changing a parameter. The DSP compares the calculated value with a pre-determined threshold value of the variable to determine whether to change the parameter, and provides the changed parameter to a parameter control for the state so that an RF signal generated by the RF generator has the changed parameter.

In various embodiments, when a value of a variable is calculated during a state by the processor of the host system 180, the processor of the host computer system 180 compares the calculated value with a pre-determined threshold value of the variable to determine whether to change a parameter, and provides the changed parameter to a DSP of an RF generator. Upon receiving the changed parameter for the state, the DSP provides the changed parameter to a parameter control for the state so that an RF signal generated by the RF generator has the changed parameter.

Figure 10C:
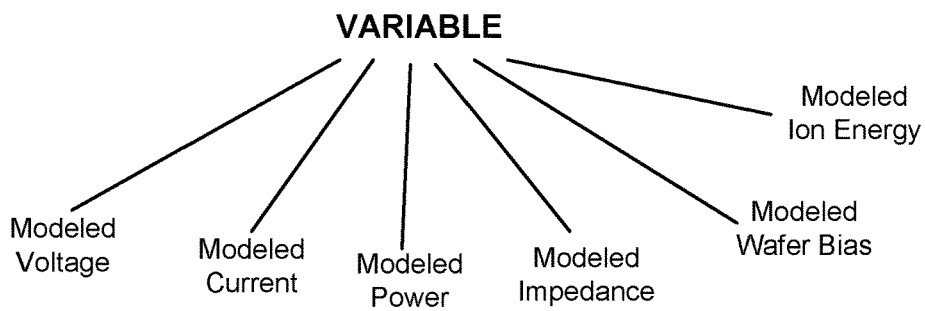
FIG. 10C is a diagram to illustrate different types of a modeled variable.

FIG. 10C is a diagram to illustrate different types of a modeled variable. Examples of the modeled variable include modeled complex voltage, modeled complex current, modeled complex power, modeled complex impedance, modeled wafer bias, and modeled ion energy. Each type of modeled variable illustrated in FIG. 10C is an example of the (n−N−1)th variable, or the (n−N)th variable, or the nth variable.

The processor of the host system 180 generates a model of one or more parts, e.g., the communication medium 110, the communication medium 196, the impedance matching network 112, the RF transmission line 150, the ESC 146, etc., of the plasma system 1000 of FIG. 10A. To illustrate, the processor of the host system 180 generates a model of electrical components, e.g., capacitors, inductors, resistors, etc., of a part of the plasma system 1000. As another example, when an inductor of the impedance matching network 112 is connected in series with a capacitor of the impedance matching network 112, an inductor of an impedance matching model is also connected in series with a capacitor of the impedance matching network 112.

In some embodiments, the model is a computer-generated model that includes electrical elements, e.g., inductors, capacitors, resistors, etc., and the electrical elements have similar characteristics as that of electrical components of a part of the plasma system 1000. For example, the model has the same inductance and/or capacitance and/or resistance as that of a part of the plasma system 1000. As another example, an impedance matching model has the same impedance and/or capacitance as that of the impedance matching network 112.

During each of the states S(n−N−1), S(n−N), and Sn, a VI probe measures a complex voltage and current at an output of an RF generator. For example, the VI probe 152 (FIG. 10A) measures a complex voltage and current at the output 1012 of the x MHz RF generator and the VI probe 186 measures a complex voltage and current at the output 1014 of the y MHz RF generator. Furthermore, the complex voltage and current received from a VI probe by the processor of the host system 180 is propagated via elements of one or more models of one or more parts of the plasma system 1000 to generate a complex voltage and current at a model node. For example, the complex voltage and current received from a VI probe by the processor of the host system 180 is propagated via an input of the model of the impedance matching network 112 to generate a value of the complex voltage and current at the model node. To illustrate, a directional sum of the complex voltage and current received from a voltage and current probe and of a complex voltage and current consumed by elements of a model is calculated to generate a complex voltage and current at the model node. Examples of the model node include an output of the model of the impedance matching network 112, a node within the model of the impedance matching network 112, a node at an output of the model of the RF transmission line 150, a node within the model of the RF transmission line 150, a node at an input of the model of the ESC 146, and a node at an output of the model of the ESC 146. An input of the model of the RF transmission line 150 is coupled to the output of the model of the impedance matching network 112. Moreover, the input of the model of the ESC 146 is coupled to the output of the model of the RF transmission line 150.

As an illustration of the propagation, during the state S(n–N–1), S(n–N), or and Sn, a directional sum of the complex voltage and current received from a voltage and current probe and of a complex voltage and current consumed by elements of the model of the impedance matching network 112 is calculated to determine a complex voltage and current at the output of the model of the impedance matching network 112. As another illustration of the propagation, during the state S(n–N–1), S(n–N), or and Sn, a directional sum of the complex voltage and current received from a voltage and current probe and of a complex voltage and current consumed by elements of the model of the impedance matching network 112 and of a complex voltage and current consumed by elements of the model of the RF transmission line 150 is calculated to determine a complex voltage and current at the output of the model of the RF transmission line 150. As yet another illustration of the propagation, during the state S(n–N–1), S(n–N), or and Sn, a directional sum of the complex voltage and current received from a voltage and current probe and of a complex voltage and current consumed by elements of the model of the impedance matching network 112 and of a complex voltage and current consumed by elements of the model of the RF transmission line 150 and of a complex voltage and current consumed by elements of the model of the ESC 146 is calculated to determine a complex voltage and current at the output of the model of the ESC 146.

Moreover, the modeled complex impedance is calculated by the processor of the host system 180 from the modeled complex voltage and the modeled complex current as a ratio of the modeled complex voltage and modeled complex current. Furthermore, the modeled complex power is calculated by the processor of the host system 180 as a product of the modeled complex voltage and modeled complex current. The modeled wafer bias is calculated by the processor of the host system 180 by applying the equations (2), (3), or (4) from a magnitude of the modeled complex voltage and a magnitude of the modeled complex current. The modeled ion energy is calculated by the processor of the host system 180 by applying the equation (1) from the modeled wafer bias and a modeled peak voltage, which is determined from the modeled complex voltage.

Figure 10D:
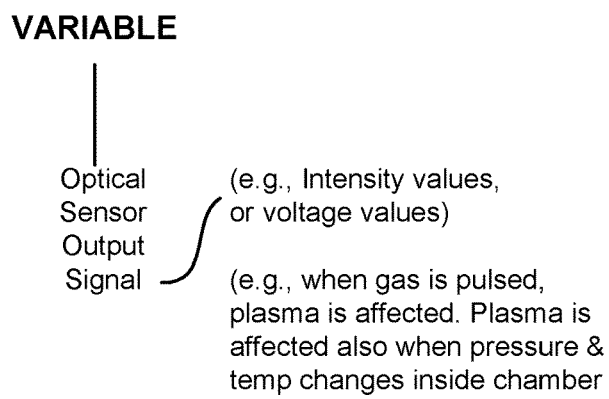
FIG. 10D is a diagram to illustrate that a sensor output signal provided by an optical sensor includes values of a variable.

FIG. 10D is a diagram to illustrate that a sensor output signal, which is an electrical signal provided by the optical sensor 1030 (FIG. 10A) includes values of a variable, e.g., intensity, voltage, etc. When a process gas is pulsed in addition to an RF signal that is generated by an RF generator, changes to impedance of plasma within the plasma chamber 114 are monitored by the optical sensor 1030. The changes to the impedance are indicated in values of the variable within the sensor output signal. It should be noted that the optical sensor signal provides a measure of changes to the impedance of plasma when temperature and/or pressure within the plasma chamber 114 changes.

Figure 10E:
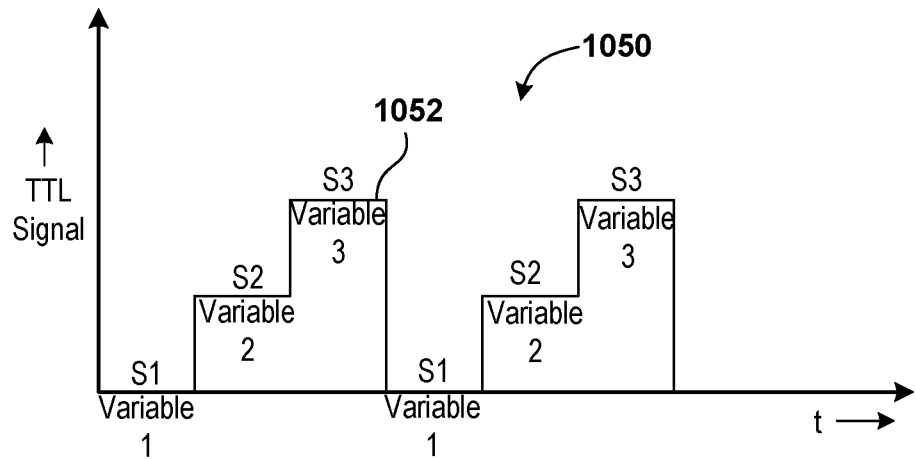
FIG. 10E is an embodiment of a graph to illustrate a digital pulsed signal having three states.

FIG. 10E is an embodiment of a graph 1050 to illustrate a digital pulsed signal 1052, e.g., a TTL signal, having three states S1, S2, and S3. The digital pulsed signal 1052 is an example of the digital pulsed signal 1002 (FIG. 10A). The graph 1050 plots the three states versus time t. Each of the states is a logic level of the digital pulsed signal 1052. During the state S1, a variable 1 is measured or calculated and a parameter is controlled based on the variable 1. Moreover, during the state S2, another variable 2 is measured or calculated and the parameter is controlled based on the variable 2. Furthermore, during the state S3 yet another variable 3 is measured or calculated and the parameter is controlled based on the variable 3. The variable 1 is different from the variable 2, and the variable 3 is different from the variables 1 and 2. For example, the variable 1 is voltage, the variable 2 is current, and the variable 3 is ion energy. As another example, the variable 1 is modeled voltage, the variable 2 is current, and the variable 3 is modeled ion energy.

In some embodiments, the states S1 through S3 repeat over the clock cycle.

In various embodiments, it is determined during a state by a DSP or the processor of the host system 180 whether a variable changes less than a pre-determined limit over multiple clock cycles. Upon determining that the variable changes less than the pre-determined limit over the multiple clock cycles, the processor of the host system 180 or the DSP determines to change a parameter for the state so that the variable changes greater than the pre-determined limit or matches the pre-determined limit. For example, upon determining, during a state, that a voltage is less than a pre-determined threshold value over multiple clock cycles, power supplied by an RF generator during the state is changed to increase or decrease the voltage. The power is changed to increase the voltage to be above the pre-determined threshold value or to decrease the voltage to be below the pre-determined threshold value or to match the voltage to the pre-determined threshold value.

Figure 10F:
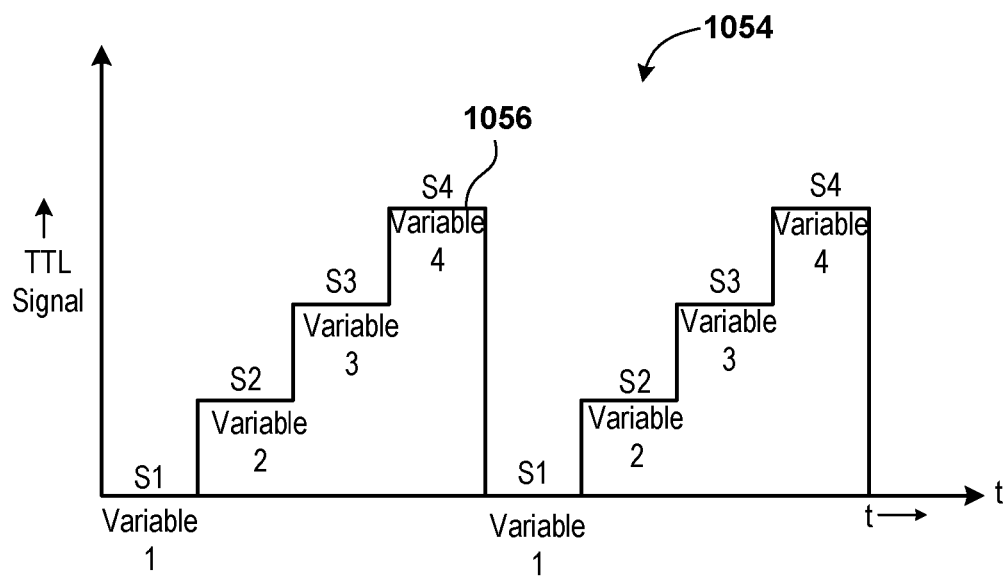
FIG. 10F is an embodiment of a graph to illustrate a digital pulsed signal having four states.

FIG. 10F is an embodiment of a graph 1054 to illustrate a digital pulsed signal 1056 having four states S1, S2, S3, and S4. The digital pulsed signal 1056 is an example of the digital pulsed signal 1002 (FIG. 10A). The graph 1054 plots logic levels of the digital pulsed signal 1056 versus the time t. The states S1, S2, and S3 are described above with reference to FIG. 10E. Moreover, during the state S4, a variable 4 is measured or calculated and a parameter is controlled based on the variable 4. The variable 4 is different from each of the variables 1, 2, and 3.

In some embodiments, the states S1 through S4 repeat over the clock cycle.

Figure 10G:
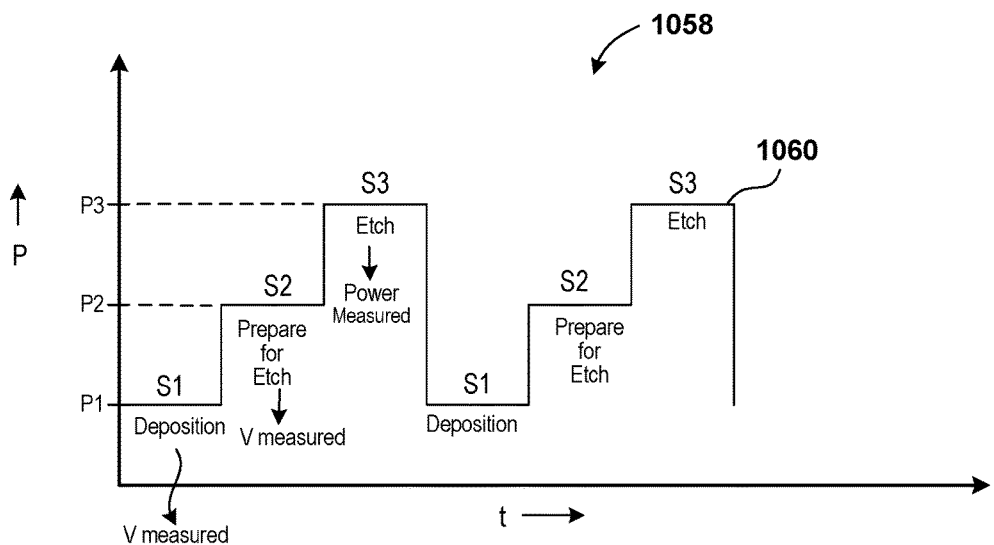
FIG. 10G is an embodiment of a graph to illustrate a pulsed RF signal having the three states.

FIG. 10G is an embodiment of a graph 1058 to illustrate a pulsed RF signal 1060 having the three states S1 through S3. The pulsed RF signal 1060 is generated by an RF generator. For example, the pulsed RF signal 1060 is an example of the RF signal 1024 (FIG. 10A). The graph 1058 plots power level of the pulsed RF signal 1060 versus time t. During the state S1, a voltage is measured and based on the voltage measured, a power level of the pulsed RF signal 1060 is controlled by an RF generator to be at a level P1. In the state S1, one or more materials are to be deposited on the work piece 119 (FIG. 10A). When the power level is at P1, the voltage measured is at a pre-determined threshold value for the state S1. Moreover, during the state S2, the work piece 119 is prepared for an etch operation. During the state S2, the voltage is measured and a power level of the pulsed RF signal 1060 generated by the RF generator is at P2. In the state S2, the voltage measured is at a pre-determined threshold value for the state S2. Furthermore, in the state S3, the etch operation is performed on the work piece 119. During the state S3, a power level of the pulsed RF signal 1060 generated by the RF generator is maintained at P3. When the power level is at P3, a power calculated is at a pre-determined threshold value. The power level P3 is greater than the power level P2, which is greater than the power level P1.

Figure 10H:
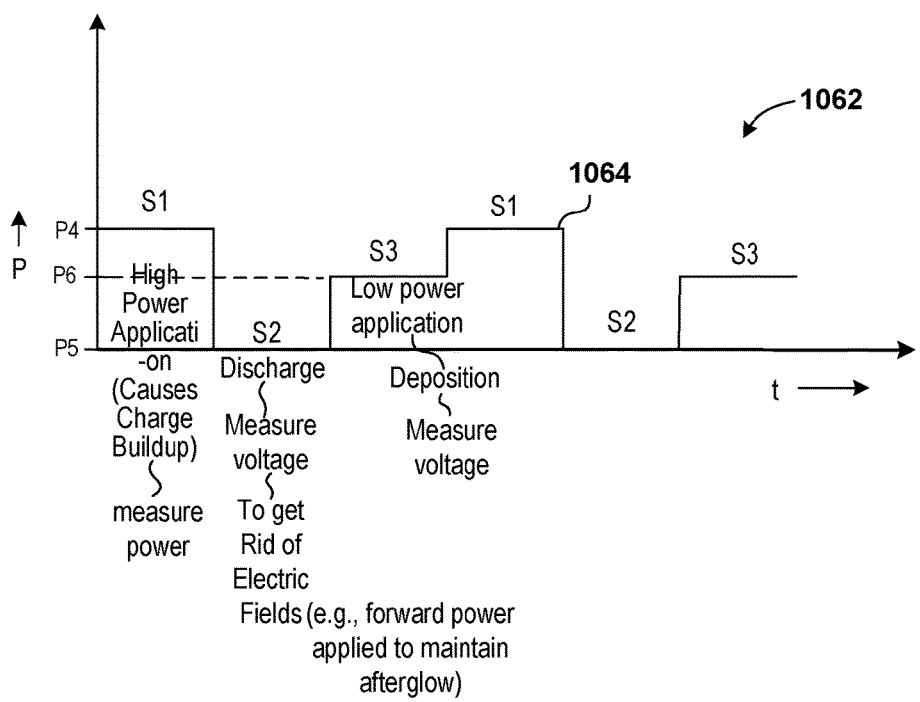
FIG. 10H is an embodiment of a graph to illustrate a pulsed RF signal having the three states.

FIG. 10H is an embodiment of a graph 1062 to illustrate a pulsed RF signal 1064 having the three states S1 through S3. The pulsed RF signal 1064 is generated by an RF generator. For example, the pulsed RF signal 1064 is an example of the RF signal 1024 (FIG. 10A). The graph 1062 plots power levels of the pulsed RF signal 1064 versus time t. During the state S1, an RF generator that generates the pulsed RF signal 1064 maintains a power level P4 of the pulsed RF signal 1064. The power level P4 is maintained based on power that is calculated from a complex voltage and current measured by a VI probe and the power level P4 matches a pre-determined threshold value of power. During the state S1, a high power application, e.g., etching, causes a charge build up on a surface of the work piece 119 (FIG. 10A).

Moreover, during the state S2, voltage is measured, e.g., by using a VI probe, and based on the voltage, it is determined whether to maintain or change power that is supplied by the RF generator. For example, during the state S2, the RF generator that generates the pulsed RF signal 1064 maintains a power level P5 of the pulsed RF signal 1064. The power level P5 is maintained when the measured voltage is the same as a pre-determined threshold value for the state S2. The maintenance of the power level P5 facilitates a discharge of electric fields generated by the charge build up during the state S1.

Furthermore, during the state S3, again voltage is measured, e.g., by using a VI probe, and based on the voltage, it is determined whether to maintain or change power that is supplied by the RF generator. For example, during the state S3, the RF generator that generates the pulsed RF signal 1064 maintains a power level P6 of the pulsed RF signal 1064. The power level P6 is maintained when the measured voltage is the same as a pre-determined threshold value for the state S3. The maintenance of the power level P6 facilitates a deposition of materials, e.g., oxides, on the work piece 119 during the state S3. The power level P4 is greater than the power level P6, which is greater than the power level P5.

Figure 10I:
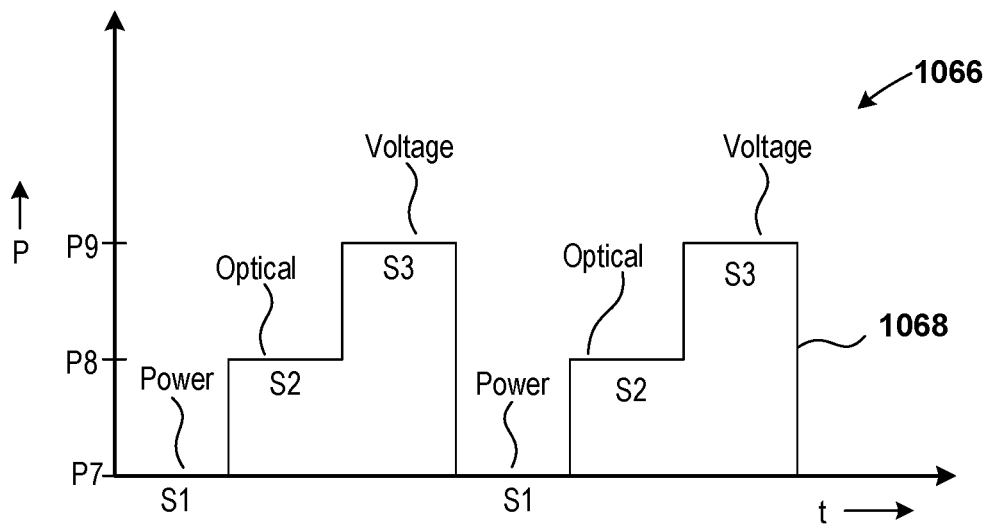
FIG. 10I is an embodiment of a graph to illustrate use of an optical sensor signal during a state to determine whether to change or maintain a parameter during the state.

FIG. 10I is an embodiment of a graph 1066 to illustrate use of the optical sensor signal during the state S2 to determine whether to change or maintain a parameter during the state S2. The graph 1066 plots power of an RF signal 1068 that is supplied by an RF generator of the plasma system 1000 (FIG. 10A) versus time t. The pulsed RF signal 1068 is generated by an RF generator. For example, the pulsed RF signal 1068 is an example of the RF signal 1024 (FIG. 10A). During the state S1, complex power is calculated or measured and is applied to control power of the RF signal 1068 generated by the RF generator. The power during the state S1 is maintained at a power level P7, which is the same as that of a pre-determined threshold value for the state S1.

Furthermore, during the state S2, the optical sensor signal is analyzed by the processor of the host computer system 180 to determine an intensity or a voltage of the optical sensor signal. For example, the optical sensor signal provides an intensity value or a voltage value of plasma within the plasma chamber 114 (FIG. 10A) for the state S2. The host system 180 determines from the intensity or voltage value, whether the intensity or voltage value matches a pre-determined threshold value. Upon determining that the intensity or voltage value does not match the pre-determined threshold value, the processor of the host system 180 determines to change an amount of power supplied at an output of the RF generator and provides the amount to a DSP of the RF generator. The DSP provides the amount to a parameter control for the state of the RF generator to generate the RF signal 1068 having a power level P8 for which the intensity or voltage value matches the pre-determined threshold value. During the state S3, power of the RF signal 1068 is controlled so that a power level P9 is maintained or achieved based on a measurement of a voltage and a comparison of the measurement with a pre-determined threshold value. The power level P9 is greater than the power level P8, which is greater than the power level P7.

Figure 10J:
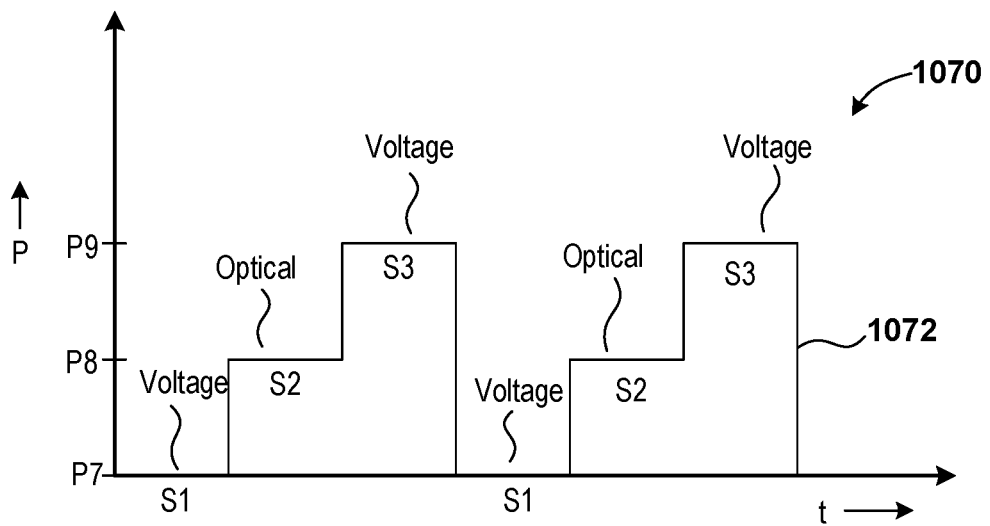
FIG. 10J is an embodiment of a graph to illustrate use of the optical sensor signal during a state to determine whether to change or maintain a parameter during the state and to illustrate use of another variable during the remaining two states to control power of an RF signal.

FIG. 10J is an embodiment of a graph 1070 to illustrate use of the optical sensor signal during the state S2 to determine whether to change or maintain a parameter during the state S2 and to illustrate use of another variable during the remaining two states S1 and S3 to control power of a pulsed RF signal 1072. The pulsed RF signal 1072 is generated by an RF generator. For example, the pulsed RF signal 1072 is an example of the RF signal 1024 (FIG. 10A). The graph 1070 plots power of the pulsed RF signal 1072 that is supplied by the RF generator of the plasma system 1000 (FIG. 10A) versus time t. During the states S1 and S3, voltage is measured by a VI probe to control power of the RF signal 1072. During the state S2, the optical sensor signal is analyzed to determine voltage or intensity to control power of the RF signal 1072.

Figure 11:
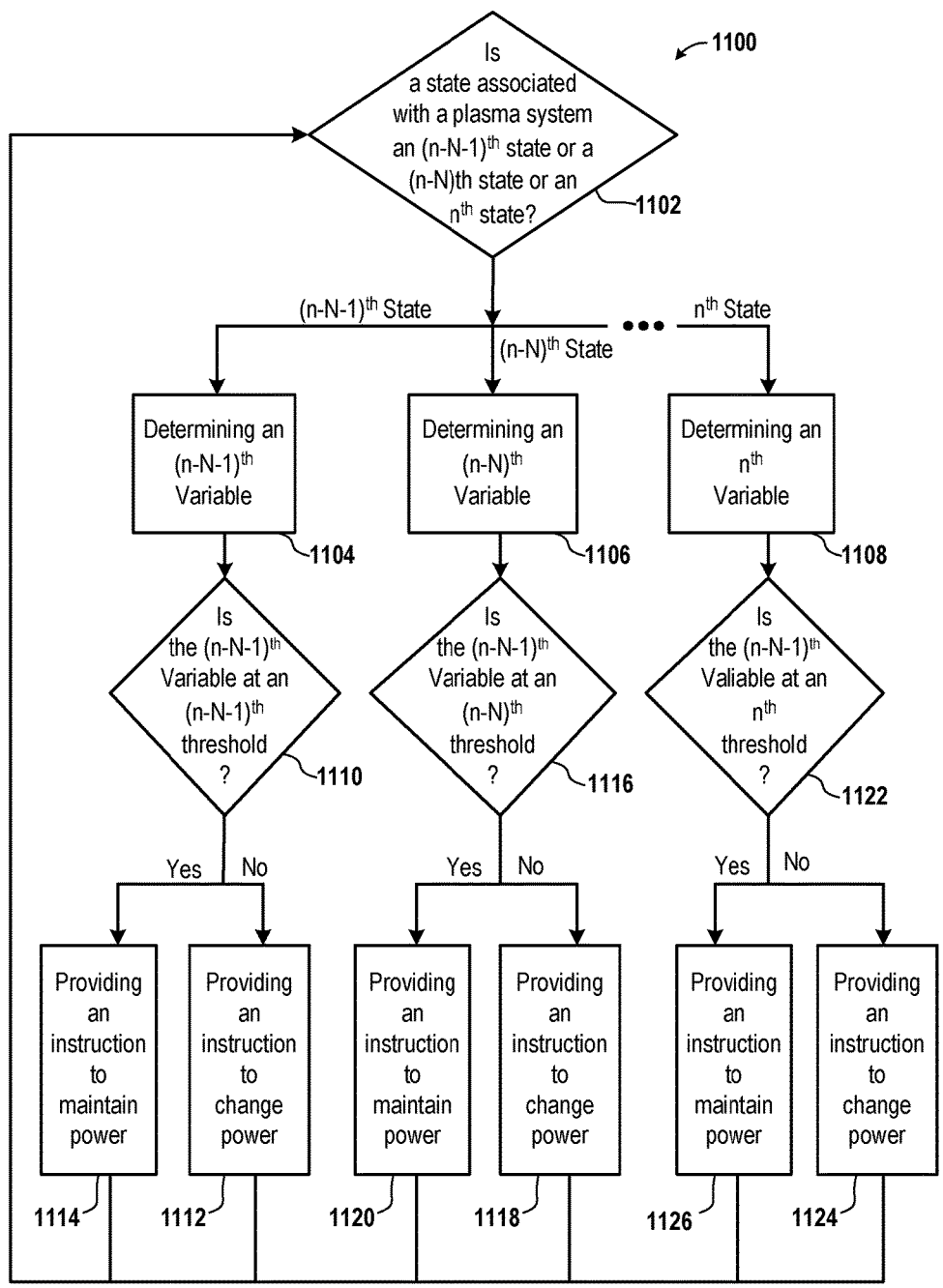
FIG. 11 is an embodiment of a flowchart to illustrate a method for using different variables during three or more states associated with the plasma system of FIG. 10A.

FIG. 11 is an embodiment of a flowchart to illustrate a method 1100 for using different variables during three or more states associated with the plasma system 1000 (FIG. 10A). The method 1100 is executed by one or more processors, e.g., the processor of the host system 180 (FIG. 10A), the DSP 166, the DSP 178 (FIG. 10A), a combination of the processor of the host system 180 and the DSP 166, a combination of the processor of the host system 180 and the DSP 178, etc.

In an operation 1102, it is determined whether a state associated with the plasma system 1000 is the state S(n−N−1), or the state S(n−N), or the state Sn. For example, as described above, the plasma system 1000 is associated with the state S(n−N−1) when the digital pulsing signal 1002 (FIG. 10A) has the state S(n−N−1). As another example, as described above, the plasma system 1000 is associated with the state S(n−N) when the digital pulsing signal 1002 has the state S(n−N). As yet another example, as described above, the plasma system 1000 is associated with the state Sn when the digital pulsing signal 1002 has the state Sn.

Upon determining that the state associated with the plasma system 1000 is the state S(n−N−1), in an operation 1104, the (n−N−1)th variable is determined, e.g., calculated or measured. The (n−N−1)th variable is determined based on a measurement at the communication medium 110 (FIG. 10A) when the communication medium 110 is transferring the RF signal 1026 during the state S(n−N−1). For example, the voltage and current probe 152 measures the complex voltage and current at the communication medium 110 when the communication medium 110 is transferring the RF signal 1026 during the state S(n−N−1), and provides the measured complex voltage and current to the processor of the host system 180 and/or to the DSP 166 (FIG. 10A) of the x MHz RF generator. Upon receiving the measured complex voltage and current, the processor of the host system 180 identifies complex voltage or complex current from the measured complex voltage and current.

In an operation 1110, it is determined whether the (n−N−1)th variable, e.g., a value of the (n−N−1)th variable, meets an (n−N−1)th threshold. For example, it is determined whether the (n−N−1)th variable exceeds the (n−N−1)th threshold of the variable or is lower than the (n−N−1)th threshold of the variable. The (n−N−1)th threshold is stored within the storage device of the host system 180. Upon determining that the (n−N−1)th variable exceeds the (n−N−1)th threshold, in an operation 1112, an instruction is provided to change power of the RF signal 1026 (FIG. 10A). For example, upon determining that the (n−N−1)th variable exceeds the (n−N−1)th threshold, in the operation 1112, an instruction is provided to reduce power of the RF signal 1026. As an illustration, the processor of the host system 180 provides an instruction to the DSP 166 (FIG. 2) to reduce power from the power value Px(n−N−1) to a power value at which the (n−N−1)th variable does not exceed the (n−N−1)th threshold. Upon receiving an instruction to reduce power, the DSP 166 decreases the power value Px(n−N−1) to a power value Px(n−N−1)−1, which is lower than the power value Px(n−N−1) and provides the lowered power value to the parameter control 1004A (FIG. 10A).

The parameter control 1004A generates a drive power value based on the lowered power value Px(n−N−1)−1 in a manner similar to that described above of generating a drive power value from the parameter value Px(n−N−1). For example, the parameter control 1004A accesses the drive power value corresponding to the lowered power value Px(n−N−1)−1 based on a correspondence between the lowered power value Px(n−N−1)−1 and the drive power value stored in a memory device of the x MHz RF generator. The parameter control 1004A provides the drive power value generated based on the lowered power value Px(n−N−1)−1 to the DAS 1016. The DAS 1016 and the RF power supply 1020 of the x MHz RF generator generate an RF signal based on the drive power value that is based on the lowered power value Px(n−N−1)−1 in a similar manner to that described above for generating the RF signal 1026 from a drive power value that is based on the power value Px(n−N−1) and provides the RF signal having the lowered power value Px(n−N−1)−1 via the output 1012, the communication medium 110 to the impedance matching network 112. The impedance matching network 112 generates a modified RF signal based on the RF signal having the lowered power value Px(n−N−1)−1 and provides the modified RF signal via the RF transmission line 150 to the ESC 146 (FIG. 10A).

The operations 1102, 1104, 1110, and 1112 are iteratively repeated until the power value Px(n−N−1) is reduced to a value at which the (n−N−1)th variable does not exceed the (n−N−1)th threshold. To illustrate, after reducing the power value from Px(n−N−1) to the power value Px(n−N−1)−1, the (n−N−1)th variable is determined in the operation 1104. It is further determined whether the (n−N−1)th variable corresponding to the power value Px(n−N−1)−1 exceeds the (n−N−1)th threshold. Upon determining that the (n−N−1)th variable corresponding to the power value Px(n−N−1)−1 exceeds the (n−N−1)th threshold, the power value Px(n−N−1)−1 is further reduced to a power value Px(n−N−1)−2 and the operations 1102, 1104, and 1110 are repeated.

On the other hand, upon determining that the (n−N−1)th variable does not exceed the (n−N−1)th threshold, in the operation 1112, an instruction is provided by the processor of the host system 180 to change, e.g., increase, the power value Px(n−N−1). For example, the processor of the host system 180 provides an instruction to the DSP 166 to increase power from the power value Px(n−N−1) and the DSP 166 increases the power value Px(n−N−1) to a power value Px(n−N−1)+1. In one embodiment, the processor of the host system 180 increases the power value Px(n−N−1) to the power value Px(n−N−1)+1 and provides the power value Px(n−N−1)+1 to the DSP 166.

The DSP 166 provides the power value Px(n−N−1)+1 to the parameter control 1004A. The parameter control 1004A generates a drive power value based on the power value Px(n−N−1)+1 in a manner similar to that described above of generating the drive power value from the power value Px(n−N−1). The parameter control 1004A provides the drive power value to the DAS 1016. Upon receiving the drive power value the DAS 1016 and the RF power supply 1020 of the x MHz RF generator generate an RF signal based on the drive power value in a manner similar to that described above of generating the RF signal 1026 from the drive power value that is based on the power value Px(n−N−1) and provides the RF signal with the increased power value Px(n−N−1)+1 via the output 1012, the communication medium 110 to the impedance matching network 112. The impedance matching network 112 generates a modified RF signal based on the RF signal having the increased power value Px(n−N−1)+1 and provides the modified RF signal via the RF transmission line 150 to the ESC 146.

The operations 1102, 1104, 1110, and 1112 are iteratively repeated until the power value Px(n−N−1) is increased to a value at which the (n−N−1) variable is not lower than the (n−N−1)th threshold. To illustrate, after increasing the power value from Px(n−N−1) to the power value Px(n−N−1)+1, the (n−N−1)th variable is determined in the operation 1104. It is determined whether the (n−N−1)th variable corresponding to the power value Px(n−N−1) is less than the (n−N−1)th threshold. Upon determining that the (n−N−1)th variable corresponding to the power value Px(n−N−1)+1 is less than the (n−N−1)th threshold, the power value Px(n−N−1)+1 is further increased to a power value Px(n−N−1)+2 and the operations 1102, 1104, and 1110 are repeated.

On the other hand, upon determining that the (n−N−1)th variable matches the (n−N−1)th threshold, e.g., is not less than the (n−N−1)th threshold and does not exceed the (n−N−1)th threshold, in an operation 1114, an instruction is provided to maintain the power value Px(n−N−1). For example, the processor of the host system 180 provides an instruction to the DSP 166 to continue to provide the power value Px(n−N−1) to the parameter control 1004A and an RF signal having the power value Px(n−N−1) is generated by the RF power supply 1020 (FIG. 10A). The method 1100 repeats after the operation 1114.

Moreover, in response to the operation 1102, upon determining that the state associated with the plasma system 1000 is the state S(n−N), in an operation 1106, the (n−N)th variable is determined, e.g., calculated or measured. For example, when the RF signal 1026 is transferred to the plasma chamber 114, the voltage and current probe 152 measures the complex voltage and current at the communication medium 110 and provides the measured complex voltage and current to the processor of the host system 180 or to the DSP 166. Upon receiving the measured complex voltage and current, the processor of the host system 180 or the DSP 166 determines a complex impedance for the state S(n−N).

In an operation 1116, it is determined whether the (n−N)th variable, e.g., a value of the (n−N)th variable, meets an (n−N)th threshold. For example, it is determined whether the (n−N)th variable exceeds the (n−N)th threshold of the variable or is lower than the (n−N)th threshold of the variable. The (n−N)th threshold is stored within the storage device of the host system 180. Upon determining that the (n−N)th variable exceeds the (n−N)th threshold, in an operation 1118, an instruction is provided to change power of the RF signal 1026 (FIG. 10A). For example, upon determining that the (n−N)th variable exceeds the (n−N)th threshold, in the operation 1118, an instruction is provided to reduce power of the RF signal 1026. As an illustration, the processor of the host system 180 provides an instruction to the DSP 166 (FIG. 2) to reduce power from the power value Px(n−N) to a power value at which the (n−N)th variable does not exceed the (n−N)th threshold. Upon receiving an instruction to reduce power, the DSP 166 decreases the power value Px(n−N) to a power value Px(n−N)−1, which is lower than the power value Px(n−N) and provides the lowered power value to the parameter control 1004B (FIG. 10A).

The parameter control 1004B generates a drive power value based on the lowered power value Px(n−N)−1 in a manner similar to that described above of generating a drive power value from the parameter value Px(n−N). For example, the parameter control 1004B accesses the drive power value corresponding to the lowered power value Px(n−N)−1 based on a correspondence between the lowered power value Px(n−N)−1 and the drive power value stored in a memory device of the x MHz RF generator. The parameter control 1004B provides the drive power value generated based on the lowered power value Px(n−N)−1 to the DAS 1016. The DAS 1016 and the RF power supply 1020 of the x MHz RF generator generate an RF signal based on the drive power value that is based on the lowered power value Px(n−N)−1 in a similar manner to that described above for generating the RF signal 1026 from a drive power value that is based on the power value Px(n−N) and provides the RF signal having the lowered power value Px(n−N)−1 via the output 1012, the communication medium 110 to the impedance matching network 112. The impedance matching network 112 generates a modified RF signal based on the RF signal having the lowered power value Px(n−N)−1 and provides the modified RF signal via the RF transmission line 150 to the ESC 146 (FIG. 10A).

The operations 1102, 1106, 1116, and 1118 are iteratively repeated until the power value Px(n−N) is reduced to a value at which the (n−N)th variable does not exceed the (n−N)th threshold. To illustrate, after reducing the power value from Px(n−N) to the power value Px(n−N)−1, the (n−N)th variable is determined in the operation 1106. It is further determined whether the (n−N)th variable corresponding to the power value Px(n−N)−1 exceeds the (n−N)th threshold. Upon determining that the (n−N)th variable corresponding to the power value Px(n−N)−1 exceeds the (n−N)th threshold, the power value Px(n−N)−1 is further reduced to a power value Px(n−N)−2 and the operations 1102, 1106, and 1116 are repeated.

On the other hand, upon determining that the (n−N)th variable does not exceed the (n−N)th threshold, in the operation 1118, an instruction is provided by the processor of the host system 180 to change, e.g., increase, the power value Px(n−N). For example, the processor of the host system 180 provides an instruction to the DSP 166 to increase power from the power value Px(n−N) and the DSP 166 increases the power value Px(n−N) to a power value Px(n−N)+1. In one embodiment, the processor of the host system 180 increases the power value Px(n−N) to the power value Px(n−N)+1 and provides the power value Px(n−N)+1 to the DSP 166.

The DSP 166 provides the power value Px(n−N)+1 to the parameter control 1004B. The parameter control 1004B generates a drive power value based on the power value Px(n−N)+1 in a manner similar to that described above of generating the drive power value from the power value Px(n−N). The parameter control 1004B provides the drive power value to the DAS 1016. Upon receiving the drive power value, the DAS 1016 and the power supply 1020 generate an RF signal based on the drive power value in a manner similar to that described above of generating the RF signal 1026 from the drive power value that is based on the power value Px(n−N) and provides the RF signal with the increased power value Px(n−N)+1 via the output 1012, the communication medium 110 to the impedance matching network 112. The impedance matching network 112 generates a modified RF signal based on the RF signal having the increased power value Px(n−N)+1 and provides the modified RF signal via the RF transmission line 150 to the ESC 146.

The operations 1102, 1106, 1116, and 1118 are iteratively repeated until the power value Px(n−N) is increased to a value at which the (n−N) variable is not lower than the (n−N)th threshold. To illustrate, after increasing the power value from Px(n−N) to the power value Px(n−N)+1, the (n−N)th variable is determined in the operation 1106. It is determined whether the (n−N)th variable corresponding to the power value Px(n−N) is less than the (n−N)th threshold. Upon determining that the (n−N)th variable corresponding to the power value Px(n−N)+1 is less than the (n−N)th threshold, the power value Px(n−N)+1 is further increased to a power value Px(n−N)+2 and the operations 1102, 1106, and 1116 are repeated.

On the other hand, upon determining that the (n−N)th variable matches the (n−N)th threshold, e.g., is not less than the (n−N)th threshold and does not exceed the (n−N)th threshold, in an operation 1120, an instruction is provided to maintain the power value Px(n−N). For example, the processor of the host system 180 provides an instruction to the DSP 166 to continue to provide the power value Px(n−N) to the parameter control 1004B. The method 1100 repeats after the operation 1120.

Furthermore, in response to the operation 1102, upon determining that the state associated with the plasma system 1000 is the state Sn, in an operation 1108, the nth variable is determined, e.g., calculated or measured. For example, when the RF signal 1026 is transferred to the plasma chamber 114, the voltage and current probe 152 measures the complex voltage and current at the communication medium 110 and provides the measured complex voltage and current to the processor of the host system 180 or to the DSP 166. Upon receiving the measured complex voltage and current, the processor of the host system 180 or the DSP 166 identifies a complex current from the measured complex voltage and current for the state n.

In an operation 1122, it is determined whether the nth variable, e.g., a value of the nth variable, meets an nth threshold. For example, it is determined whether the nth variable exceeds the nth threshold of the variable or is lower than the nth threshold of the variable. The nth threshold is stored within the storage device of the host system 180. Upon determining that the nth variable exceeds the nth threshold, in an operation 1124, an instruction is provided to change power of the RF signal 1026 (FIG. 10A). For example, upon determining that the nth variable exceeds the nth threshold, in the operation 1124, an instruction is provided to reduce power of the RF signal 1026. As an illustration, the processor of the host system 180 provides an instruction to the DSP 166 (FIG. 2) to reduce power from the power value Pxn to a power value at which the nth variable does not exceed the nth threshold. Upon receiving an instruction to reduce power, the DSP 166 decreases the power value Pxn to a power value Pxn−1, which is lower than the power value Pxn and provides the lowered power value to the parameter control 1004C (FIG. 10A).

The parameter control 1004C generates a drive power value based on the lowered power value Pxn−1 in a manner similar to that described above of generating a drive power value from the parameter value Pxn. For example, the parameter control 1004C accesses the drive power value corresponding to the lowered power value Pxn−1 based on a correspondence between the lowered power value Pxn−1 and the drive power value stored in a memory device of the x MHz RF generator. The parameter control 1004C provides the drive power value generated based on the lowered power value Pxn−1 to the DAS 1016. The DAS 1016 and the RF power supply 1020 generate an RF signal based on the drive power value that is based on the lowered power value Pxn−1 in a similar manner to that described above for generating the RF signal 1026 from a drive power value that is based on the power value Pxn and provides the RF signal having the lowered power value Pxn−1 via the output 1012, the communication medium 110 to the impedance matching network 112. The impedance matching network 112 generates a modified RF signal based on the RF signal having the lowered power value Pxn−1 and provides the modified RF signal via the RF transmission line 150 to the ESC 146 (FIG. 10A).

The operations 1102, 1108, 1122, and 1124 are iteratively repeated until the power value Pxn is reduced to a value at which the nth variable does not exceed the nth threshold. To illustrate, after reducing the power value from Px(n−N−1) to the power value Pxn−1, the nth variable is determined in the operation 1108. It is further determined whether the nth variable corresponding to the power value Pxn−1 exceeds the nth threshold. Upon determining that the nth variable corresponding to the power value Pxn−1 exceeds the nth threshold, the power value Pxn−1 is further reduced to a power value Pxn−2 and the operations 1102, 1108, and 1122 are repeated.

On the other hand, upon determining that the nth variable does not exceed the nth threshold, in the operation 1124, an instruction is provided by the processor of the host system 180 to change, e.g., increase, the power value Pxn. For example, the processor of the host system 180 provides an instruction to the DSP 166 to increase power from the power value Pxn and the DSP 166 increases the power value Pxn to a power value Pxn+1. In one embodiment, the processor of the host system 180 increases the power value Pxn to the power value Pxn+1 and provides the power value Pxn+1 to the DSP 166.

The DSP 166 provides the power value Pxn+1 to the parameter control 1004C. The parameter control 1004C generates a drive power value based on the power value Pxn+1 in a manner similar to that described above of generating the drive power value from the power value Pxn. The parameter control 1004C provides the drive power value to the DAS 1016. Upon receiving the drive power value the DAS 1016 and the RF power supply 1020 generate an RF signal based on the drive power value in a manner similar to that described above of generating the RF signal 1026 from the drive power value that is based on the power value Pxn and provides the RF signal with the increased power value Pxn+1 via the output 1012, the communication medium 110 to the impedance matching network 112. The impedance matching network 112 generates a modified RF signal based on the RF signal having the increased power value Pxn+1 and provides the modified RF signal via the RF transmission line 150 to the ESC 146.

The operations 1102, 1108, 1122, and 1124 are iteratively repeated until the power value Pxn is increased to a value at which the nth variable is not lower than the nth threshold. To illustrate, after increasing the power value from Pxn to the power value Pxn+1, the nth variable is determined in the operation 1108. It is determined whether the nth variable corresponding to the power value Pxn is less than the nth threshold. Upon determining that the nth variable corresponding to the power value Pxn+1 is less than the nth threshold, the power value Pxn+1 is further increased to a power value Pxn+2 and the operations 1102, 1108, and 1122 are repeated.

On the other hand, upon determining that the nth variable matches the nth threshold, e.g., is not less than the nth threshold and does not exceed the nth threshold, in an operation 1126, an instruction is provided to maintain the power value Pxn. For example, the processor of the host system 180 provides an instruction to the DSP 166 to continue to provide the power value Pxn to the parameter control 1004C. The method 1100 repeats after the operation 1126.

It should be noted that in some embodiments, the (n−N−1)th state is associated with use of the plasma system 1000 (FIG. 10A), the (n−N)th state is associated with another use of the plasma system 1000, and the nth state is associated with yet another user of the plasma system 1000. For example, when the substrate 119 is to be etched, the operations 1102, 1104, 1110, and 1112 or the operations 1102, 1104, 1110, and 1114 are performed during the state S(n−N−1) to facilitate etching of the substrate 119. A decision whether the substrate 119 is to be etched may be provided as an input by a user via the input device of the host system 180. Also, when the substrate 119 is to be etched at a second rate different from a first rate at which the substrate 119 is to be etched during the state S(n−N−1), the operations 1102, 1106, 1116, and 1118 or the operations 1102, 1106, 1118, and 1120 are performed during the state S(n−N) to facilitate etching of the substrate 119 at the second rate. When the substrate 119 is to be etched at a third rate different from the second rate at which the substrate 119 is to be etched during the state S(n−N), the operations 1102, 1108, 1122, and 1124 or the operations 1102, 1108, 1122, and 1126 are performed during the state Sn to facilitate etching of the substrate 119 at the third rate. In some embodiments, the second rate of etching is higher than the first rate of etching and the third rate of etching is higher than the second rate of etching. In various embodiments, the second rate of etching is lower than the first rate of etching and the third rate of etching is lower than the second rate of etching. As another example, when a material, e.g., a polymer, a semiconductor, a conductor, etc., is to be deposited on the substrate 119 at a first rate, the operations 1102, 1104, 1110, and 1112 or the operations 1102, 1104, 1110, and 1114 are performed during the state S(n−N−1) to facilitate deposition at the first rate on the substrate 119. When the material is to be deposited on the substrate 119 at a second rate different from the first rate at which material is to be deposited on the substrate 119 during the state S(n−N−1), the operations 1102, 1106, 1116, and 1118 or the operations 1102, 1106, 1118, and 1120 are performed during the state S(n−N) to facilitate deposition on the substrate 119 at the second rate. Similarly, when the material is to be deposited on the substrate 119 at a third rate different from the second rate at which material is to be deposited on the substrate 119 during the state S(n−N), the operations 1102, 1108, 1122, and 1124 or the operations 1102, 1108, 1122, and 1126 are performed during the state Sn to facilitate deposition on the substrate 119 at the third rate. In some embodiments, the second rate of deposition is higher than the first rate of deposition and the third rate of deposition is higher than the second rate of deposition. In various embodiments, the second rate of deposition is lower than the first rate of deposition and the third rate of deposition is lower than the second rate of deposition.

In some embodiments, in the operation 1110, it is determined whether the (n−N−1)th variable, e.g., a value of the (n−N−1)th variable, is within a pre-determined range from the (n−N−1)th threshold of the (n−N−1)th variable. The pre-determined range from the (n−N−1)th threshold includes the (n−N−1)th threshold. Upon determining that the (n−N−1) the variable is within the pre-determined range from the (n−N−1)th threshold of the (n−N−1)th variable, the operation 1114 is performed. On the other hand, upon determining that the (n−N−1)th variable is outside, e.g., lower than, greater than, etc., the pre-determined range from the (n−N−1)th threshold of the (n−N−1)th variable, the operation 1112 is performed. For example, power of an RF signal generated by the x MHz RF generator is increased upon determining that the (n−N−1)th variable is lower than the pre-determined range from (n−N−1)th threshold. As another example, power of an RF signal generated by the x MHz RF generator is decreased upon determining that the (n−N−1)th variable is greater than the pre-determined range from the (n−N−1)th threshold.

Similarly, in these embodiments, in the operation 1116, it is determined whether the (n−N)th variable, e.g., a value of the (n−N)th variable, is within a pre-determined range from the (n−N)th threshold of the (n−N)th variable. The pre-determined range from the (n−N)th threshold includes the (n−N)th threshold. Upon determining that the (n−N)th variable is within the pre-determined range from the (n−N)th threshold of the (n−N)th variable, the operation 1120 is performed. On the other hand, upon determining that the (n−N)th variable is outside the pre-determined range from the (n−N)th threshold of the (n−N)th variable, the operation 1118 is performed. For example, power of an RF signal generated by the x MHz RF generator is increased upon determining that the (n−N)th variable is lower than the pre-determined range from (n−N)th threshold. As another example, power of an RF signal generated by the x MHz RF generator is decreased upon determining that the (n−N)th variable is greater than the pre-determined range from the (n−N)th threshold.

Moreover, in these embodiments, in the operation 1122, it is determined whether the nth variable, e.g., a value of the nth variable, is within a pre-determined range from the nth threshold of the nth variable. The pre-determined range from the nth threshold includes the nth threshold. Upon determining that the nth variable is within the pre-determined range from the nth threshold of the nth variable, the operation 1126 is performed. On the other hand, upon determining that the nth variable is outside the pre-determined range from the nth threshold of the nth variable, the operation 1124 is performed. For example, power of an RF signal generated by the x MHz RF generator is increased upon determining that the nth variable is lower than the pre-determined range from nth threshold. As another example, power of an RF signal generated by the x MHz RF generator is decreased upon determining that the nth variable is greater than the pre-determined range from the nth threshold.

In various embodiments in which the (n−N−1)th variable is of the same type as the (n−N)th variable, the (n−N−1)th threshold is the same, e.g., has the same value, as the (n−N)th threshold. In several embodiments, in which the (n−N−1)th variable is the same type as the (n−N)th variable, the (n−N−1)th threshold is different from the (n−N)th threshold.

In some embodiments in which the (n−N)th variable is of the same type as the nth variable, the (n−N)th threshold is the same, e.g., has the same value, as the nth threshold. In various embodiments, in which the (n−N)th variable is the same type as the nth variable, the (n−N)th threshold is different from the nth threshold.

In several embodiments in which the (n−N−1)th variable is of the same type as the nth variable, the (n−N−1)th threshold is the same, e.g., has the same value, as the nth threshold. In various embodiments, in which the (n−N−1)th variable is the same type as the nth variable, the (n−N−1)th threshold is different from the nth threshold.

In various embodiments, the pre-determined range from the (n−N−1)th threshold is a different value than the pre-determined range from the (n−N)th threshold and/or the pre-determined range from the nth threshold. For example, when the (n−N−1)th variable is voltage and the (n−N)th variable is current, the pre-determined range from the (n−N−1)th threshold is m volts and the pre-determined range from the (n−N)th threshold is n amperes, where each of m and n is a real number, and m is not equal to n.

In some embodiments, the pre-determined range from the (n−N−1)th threshold has the same value than the pre-determined range from the (n−N)th threshold and the pre-determined range from the nth threshold. For example, when the (n−N−1)th variable is voltage and the (n−N)th variable is current, the pre-determined range from the (n−N−1)th threshold is m volts and the pre-determined range from the (n−N)th threshold is m amperes, where m is a real number.

In some embodiments, the (n−N−1)th threshold has a different value from the (n−N)th threshold and/or the nth threshold. For example, the (n−N−1)th threshold is p volts and the (n−N)th threshold is q amperes, where each of p and q is a real number, and p is not equal to q. As another example, the (n−N)th threshold is p watts and the nth threshold is q amperes, where each of p and q is a real number, and p is not equal to q.

In various embodiments, the (n−N−1)th threshold has the same value as the (n−N)th threshold and the nth threshold. For example, the (n−N−1)th threshold is p volts, the (n−N)th threshold is p amperes, and the nth threshold is p watts, where p is a real number.

Figure 12A:
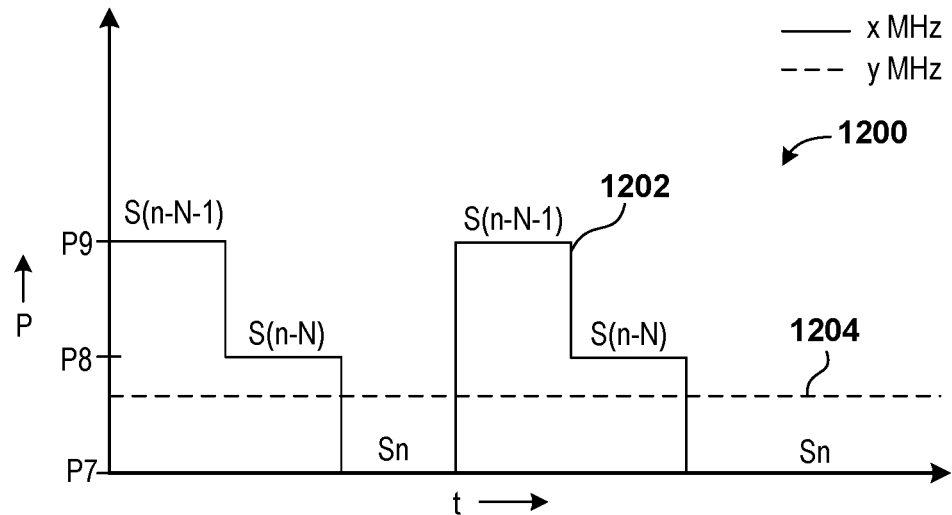
FIG. 12A is an embodiment of a graph to illustrate that an RF signal generated by an RF generator has states S(n−N−1), S(n−N), and Sn when an RF signal generated by another RF generator is a continuous wave.

FIG. 12A is an embodiment of a graph 1200 to illustrate that an RF signal 1202 generated by the x MHz RF generator (FIG. 10A) has the states S(n−N−1), S(n−N), and Sn when an RF signal 1204 generated by the y MHz RF generator (FIG. 10A) is a continuous wave. The graph 1200 plots power versus time t. The RF signal 1202 is an example of the RF signal 1026 (FIG. 10A) generated by the x MHz RF generator and the RF signal 1204 is an example of the RF signal 1028 (FIG. 10A) generated by the y MHz RF generator.

To illustrate, different variables are determined during the states S(n−N−1), S(n−N), and Sn of the RF signal 1202 but the same variable is determined during a state of the RF signal 1204. The RF signal 1202 is controlled based on the same variable instead of being controlled by different variables for the states S(n−N−1), S(n−N), and Sn.

Figure 12B:
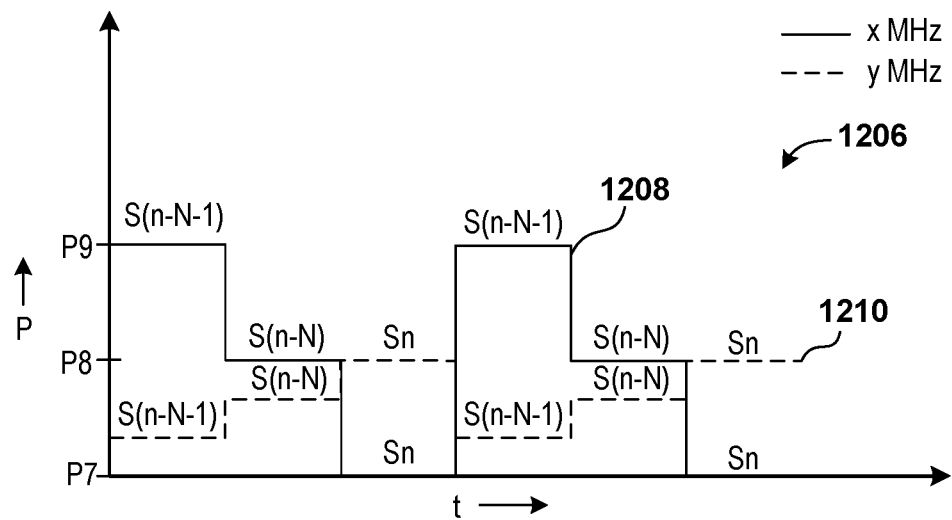
FIG. 12B is an embodiment of a graph to illustrate that an RF signal generated by an RF generator has the states S(n−N−1), S(n−N), and Sn and an RF signal generated by the another generator has the states.

FIG. 12B is an embodiment of a graph 1206 to illustrate that an RF signal 1208 generated by the x MHz RF generator (FIG. 10A) has the states S(n−N−1), S(n−N), and Sn and an RF signal 1210 generated by the y MHz RF generator has the states S(n−N−1), S(n−N), and Sn. The graph 1206 plots power versus time t. The RF signal 1206 is an example of the RF signal 1026 (FIG. 10A) generated by the x MHz RF generator and the RF signal 1210 is an example of the RF signal 1028 (FIG. 10A) generated by the y MHz RF generator.

To illustrate, different variables are determined during the states S(n−N−1), S(n−N), and Sn of the RF signal 1208 and different variables are determined during the states S(n−N−1), S(n−N), and Sn of the RF signal 1210. The RF signal 1208 is controlled based on different variables, e.g., (n−N−

1)th variable, (n−N)th variable, nth variable, for the states S(n−N−1), S(n−N), and Sn. Similarly, the RF signal 1210 is controlled based on different variables, e.g., (n−N−1)th variable, (n−N)th variable, nth variable, for the states S(n−N−1), S(n−N), and Sn.

In various embodiments, the RF signal 1208 has two states, e.g., S(n−N), and Sn, instead of three during the clock cycle and the RF signal 1210 has the three states during the clock cycle. Similarly, in some embodiments, the RF signal 1210 has two states during the clock cycle and the RF signal 1208 has the three states during the clock cycle.

Figure 12C:
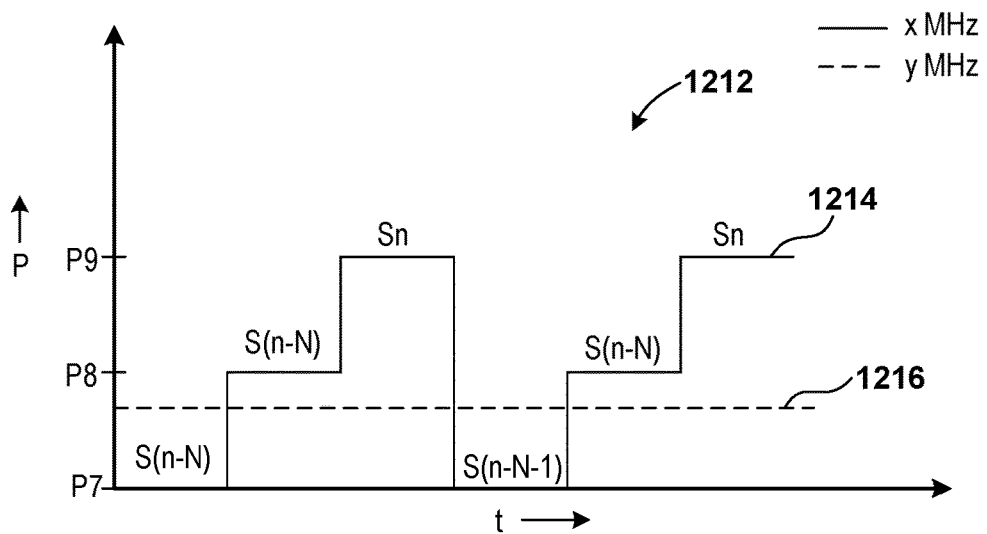
FIG. 12C is an embodiment of a graph to illustrate an increase in power levels of an RF signal with a change in states.

FIG. 12C is an embodiment of a graph 1212 to illustrate an increase in power levels of an RF signal 1214 with a change in states. The RF signal 1214 is generated by the x MHz RF generator and an RF signal 1216, plotted on the graph 1212, is generated by the y MHz RF generator. The RF signal 1214 is an example of the RF signal 1026 (FIG. 10A) generated by the x MHz RF generator and the RF signal 1216 is an example of the RF signal 1028 (FIG. 10A) generated by the y MHz RF generator.

Power levels of the RF signal 1214 increase from P7 to P8 to P9 when the RF signal 1216 is a continuous wave, e.g., has the same power level. The increase in power levels is opposite to a decrease in the power levels, e.g., from P9 to P8 further to P7, as illustrated in FIG. 12A.

Figure 12D:
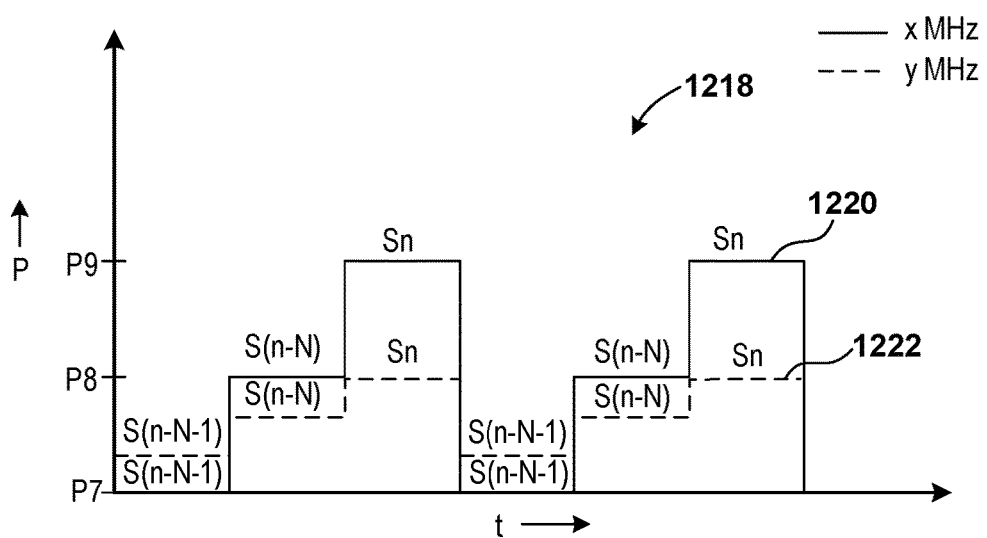
FIG. 12D is an embodiment of a graph to illustrate the increase in power levels of an RF signal generated by an RF generator while an RF signal generated by another RF generator has the states S(n−N−1), S(n−N), and Sn.

FIG. 12D is an embodiment of a graph 1218 to illustrate the increase in power levels of an RF signal 1220 generated by the x MHz RF generator while an RF signal 1222 generated by the y MHz RF generator has the states S(n−N−1), S(n−N), and Sn. The increase in the power levels of the RF signal 1220 is opposite to a decrease in the power levels of the RF signal 1208 of FIG. 12B. The RF signal 1220 is an example of the RF signal 1026 (FIG. 10A) generated by the x MHz RF generator and the RF signal 1222 is an example of the RF signal 1028 (FIG. 10A) generated by the y MHz RF generator.

Figure 13:
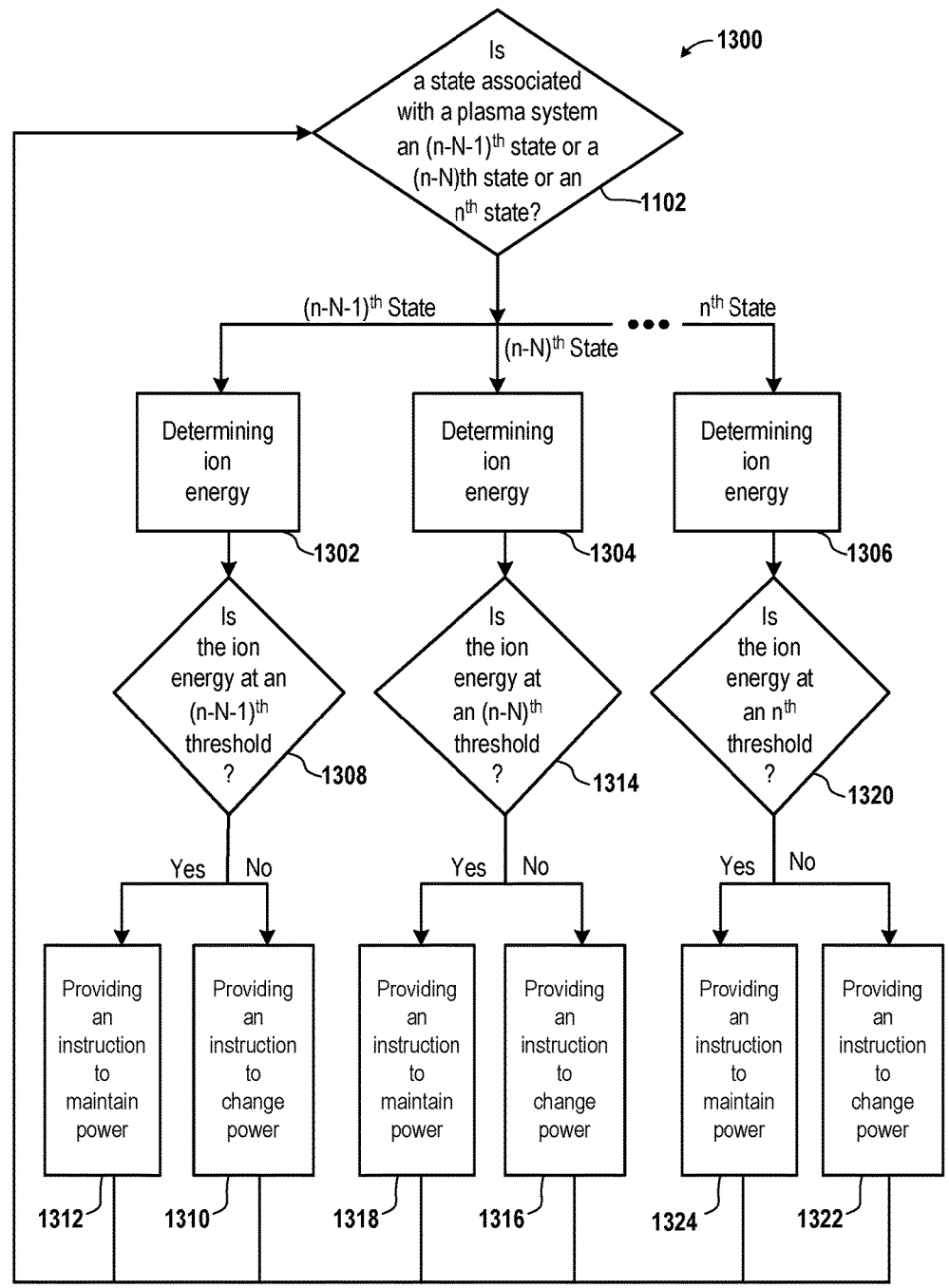
FIG. 13 is a flowchart of an embodiment of a method for using ion energy for states associated with the plasma system of FIG. 10A.

FIG. 13 is a flowchart of an embodiment of a method 1300 for using ion energy for states associated with the plasma system 1000 (FIG. 10A). The method 1300 is described with reference to FIG. 10A. The method 1300 is executed by one or more processors, e.g., a processor of the host system 180 (FIG. 10A), or the DSP 166, or the DSP 178 (FIG. 10A), or a combination of the processor of the host system 180 and the DSP 166, or a combination of the processor of the host system 180 and the DSP 178, etc.

The operation 1102 is performed. Upon determining that the state associated with the plasma system 1000 is the state S(n−N−1), in an operation 1302, ion energy is determined, e.g., calculated. For example, when the RF signal 1026 (FIG. 10A) is transferred to the plasma chamber 114, the voltage and current probe 152 (FIG. 10A) measures the complex voltage and current at the communication medium 110 and provides the measured complex voltage and current to the processor of the host system 180 (FIG. 10A). The complex voltage and current is propagated via one or more models of one or more parts of the plasma system 1000 to calculate a complex voltage and current at the model node. Based on the complex voltage and current at the model node, the processor of the host system 180 determines an ion energy. In this example, the processor of the host system 180 determines the ion energy using the equation (1).

Moreover, in an operation 1308, it is determined whether the ion energy determined during the operation 1302 meets an (n−N−1)th ion energy threshold. For example, it is determined whether the ion energy determined during the operation 1302 exceeds the (n−N−1)th ion energy threshold. The operation 1308 is similar to the operation 1110 (FIG. 11) except that the (n−N−1)th variable is ion energy and the (n−N−1)th threshold of the operation 1110 is the (n−N−1)th ion energy threshold. The (n−N−1)th ion energy threshold is stored within a storage device, e.g., the storage device of the host system 180 or any other storage device of the plasma system 1000.

Upon determining that the ion energy determined during the operation 1302 exceeds the (n−N−1)th ion energy threshold, in an operation 1310, an instruction is provided to change power of the RF signal 1026 (FIG. 10A). The operation 1310 is similar to the operation 1112 of the method 1100 of FIG. 11 except that the operation 1310 applies specifically to ion energy. For example, upon determining that the ion energy determined during the operation 1302 exceeds the (n−N−1)th ion energy threshold, in the operation 1310, an instruction is provided to reduce power of the RF signal 1026. The operation 1310 is similar to the operation 1112 (FIG. 10A) except that the operation 1310 is performed with respect to ion energy and the (n−N−1)th ion energy threshold. For example, the processor of the host system 180 provides an instruction to the DSP 166 (FIG. 2) to reduce power from the power value Px(n−N−1) to a power value at which the ion energy determined during the operation 1302 does not exceed the (n−N−1)th ion energy threshold. As another example, the operations 1102, 1302, 1308, and 1310 are iteratively repeated until the power value Px(n−N−1) is reduced to a value at which the ion energy determined during the operation 1302 does not exceed the (n−N−1)th ion energy threshold.

On the other hand, upon determining that the ion energy determined during the operation 1302 does not exceed the (n−N−1)th ion energy threshold, in the operation 1308, it is determined whether the ion energy determined during the operation 1302 is less than the (n−N−1)th ion energy threshold. Upon determining that the ion energy determined during the operation 1302 is less than the (n−N−1)th ion energy threshold, in the operation 1310, an instruction is provided by the processor of the host system 180 to increase the power value Px(n−N−1). For example, the processor of the host system 180 provides an instruction to the DSP 166 to increase power from the power value Px(n−N−1) and the DSP 166 increases the power value Px(n−N−1) to the power value Px(n−N−1)+1. As another example, the operations 1102, 1302, 1308, and 1310 are iteratively repeated until the power value Px(n−N−1) is increased to a value at which the ion energy determined during the operation 1302 is not lower than the (n−N−1)th ion energy threshold. The method 1300 is repeated after the operation 1310.

On the other hand, upon determining that the ion energy determined during the operation 1302 is not less than the (n−N−1)th ion energy threshold and does not exceed the (n−N−1)th ion energy threshold, in an operation 1312, an instruction is provided to maintain the power value Px(n−N−1) in a manner similar to that described above with reference to the operation 1114 (FIG. 11). The method 1300 repeats after the operation 1312.

Upon determining in the operation 1302 that the state associated with the plasma system 1000 is the state S(n−N), in an operation 1304, ion energy is determined. The ion energy is determined in the operation 1304 in a manner similar to determining the (n−N)th variable during the operation 1106 (FIG. 11) except that the (n−N)th variable is ion energy. For example, the equation (1) is used to determine the ion energy.

In an operation 1314, it is determined whether the ion energy determined during the operation 1304 meets an (n−N)th ion energy threshold. For example, it is determined whether the ion energy determined during the operation 1304 exceeds the (n–N)th ion energy threshold. The (n–N)th ion energy threshold is stored within a storage device, e.g., the storage device of the host system 180 or any other storage device of the plasma system 1000.

Upon determining that the ion energy determined during the operation 1304 exceeds the (n–N)th ion energy threshold, in an operation 1316, an instruction is provided to change power of the RF signal 1026 (FIG. 10A). For example, upon determining that the ion energy determined during the operation 1304 exceeds the (n–Nth) ion energy threshold, in the operation 1316, an instruction is provided to reduce power of the RF signal 1026 (FIG. 10A). The operation 1316 is similar to the operation 1118 (FIG. 11) except that the operation 1316 is performed with respect to the (n–N)th ion energy threshold and is performed with respect to the determined ion energy of operation 1304. For example, the processor of the host system 180 provides an instruction to the DSP 166 (FIG. 2) to reduce power from the power value Px(n–N) to a power value at which the ion energy determined during the operation 1304 does not exceed the (n–N)th ion energy threshold. As another example, the operations 1102, 1304, 1314, and 1316 are iteratively repeated until the power value Px(n–N) is reduced to a value at which the ion energy determined during the operation 1304 does not exceed the (n–N)th ion energy threshold.

On the other hand, upon determining that the ion energy determined during the operation 1304 does not exceed the (n–N)th ion energy threshold, in the operation 1316, it is determined whether the ion energy determined during the operation 1304 is less than the (n–N)th ion energy threshold. Upon determining that the ion energy determined during the operation 1304 is less than the (n–N)th ion energy threshold, in the operation 1316, an instruction is provided by the processor of the host system 180 to increase the power value Px(n–N). The operation 1316 is similar to the operation 1118 (FIG. 11) except that the operation 1316 is performed with respect to the (n–N)th ion energy threshold and with respect to the determined ion energy of operation 1304. For example, the processor of the host system 180 provides an instruction to the DSP 166 to increase power from the power value Px(n–N) and the DSP 166 increases the power value Px(n–N) to the power value Px(n–N)+1. As another example, the operations 1102, 1304, 1314, and 1316 are iteratively repeated until the power value Px(n–N) is increased to a value at which the ion energy determined during the operation 1304 is not lower than the (n–N)th ion energy threshold.

On the other hand, upon determining that the ion energy determined during the operation 1304 is not less than the (n–N)th ion energy threshold and does not exceed the (n–N)th ion energy threshold, in an operation 1318, an instruction is provided to maintain the power value Px(n–N). For example, the processor of the host system 180 provides an instruction to the DSP 166 to continue to provide the power value Px(n–N) to the parameter control 1004B (FIG. 10A). In one embodiment, the processor of the host system 180 provides the power value Px(n–N) to the DSP 166 and the DSP 166 provides the power value Px(n–N) to the parameter control 1004B. The method 1300 repeats after the operation 1318.

Upon determining in the operation 1102 that the state associated with the plasma system 1000 is the state Sn, in an operation 1306, ion energy is determined. The ion energy is determined in the operation 1306 in a manner similar to determining the (n–N)th variable during the operation 1108 (FIG. 11) except that the nth variable is ion energy. For example, the equation (1) is used to determine the ion energy.

In an operation 1320, it is determined whether the ion energy determined during the operation 1306 meets an nth ion energy threshold. For example, it is determined whether the ion energy determined during the operation 1306 exceeds the nth ion energy threshold. The nth ion energy threshold is stored within a storage device, e.g., the storage device of the host system 180 or any other storage device of the plasma system 1000.

Upon determining that the ion energy determined during the operation 1306 exceeds the (n–N)th ion energy threshold, in an operation 1322, an instruction is provided to change power of the RF signal 1026 (FIG. 10A). For example, upon determining that the ion energy determined during the operation 1306 exceeds the nth ion energy threshold, in the operation 1322, an instruction is provided to reduce power of the RF signal 1026 (FIG. 10A) generated and supplied by the x MHz RF generator. The operation 1322 is similar to the operation 1124 (FIG. 11) except that the operation 1322 is performed with respect to the nth ion energy threshold and is performed with respect to the determined ion energy of operation 1306. For example, the processor of the host system 180 provides an instruction to the DSP 166 (FIG. 2) to reduce power from the power value Pxn to a power value at which the ion energy determined during the operation 1306 does not exceed the nth ion energy threshold. As another example, the operations 1102, 1306, 1320, and 1322 are iteratively repeated until the power value Pxn is reduced to a value at which the ion energy determined during the operation 1306 does not exceed the nth ion energy threshold.

On the other hand, upon determining that the ion energy determined during the operation 1306 does not exceed the nth ion energy threshold, in the operation 1320, it is determined whether the ion energy determined during the operation 1306 is less than the nth ion energy threshold. Upon determining that the ion energy determined during the operation 1306 is less than the nth ion energy threshold, in the operation 1322, an instruction is provided by the processor of the host system 180 to increase the power value Pxn. The operation 1322 is similar to the operation 1124 (FIG. 11) except that the operation 1322 is performed with respect to the nth ion energy threshold and with respect to the determined ion energy of operation 1306. For example, the processor of the host system 180 provides an instruction to the DSP 166 to increase power from the power value Pxn and the DSP 166 increases the power value Pxn to the power value Pxn+1. As another example, the operations 1102, 1306, 1320, and 1322 are iteratively repeated until the power value Pxn is increased to a value at which the ion energy determined during the operation 1306 is not lower than the nth ion energy threshold.

On the other hand, upon determining that the ion energy determined during the operation 1306 is not less than the nth ion energy threshold and does not exceed the nth ion energy threshold, in an operation 1324, an instruction is provided to maintain the power value Pxn. For example, the processor of the host system 180 provides an instruction to the DSP 166 to continue to provide the power value Pxn to the parameter control 1004C (FIG. 10A). In one embodiment, the processor of the host system 180 provides the power value Pxn to the DSP 166 and the DSP 166 provides the power value Pxn to the parameter control 1004C. The method 1300 repeats after the operation 1324.

Figure 14:
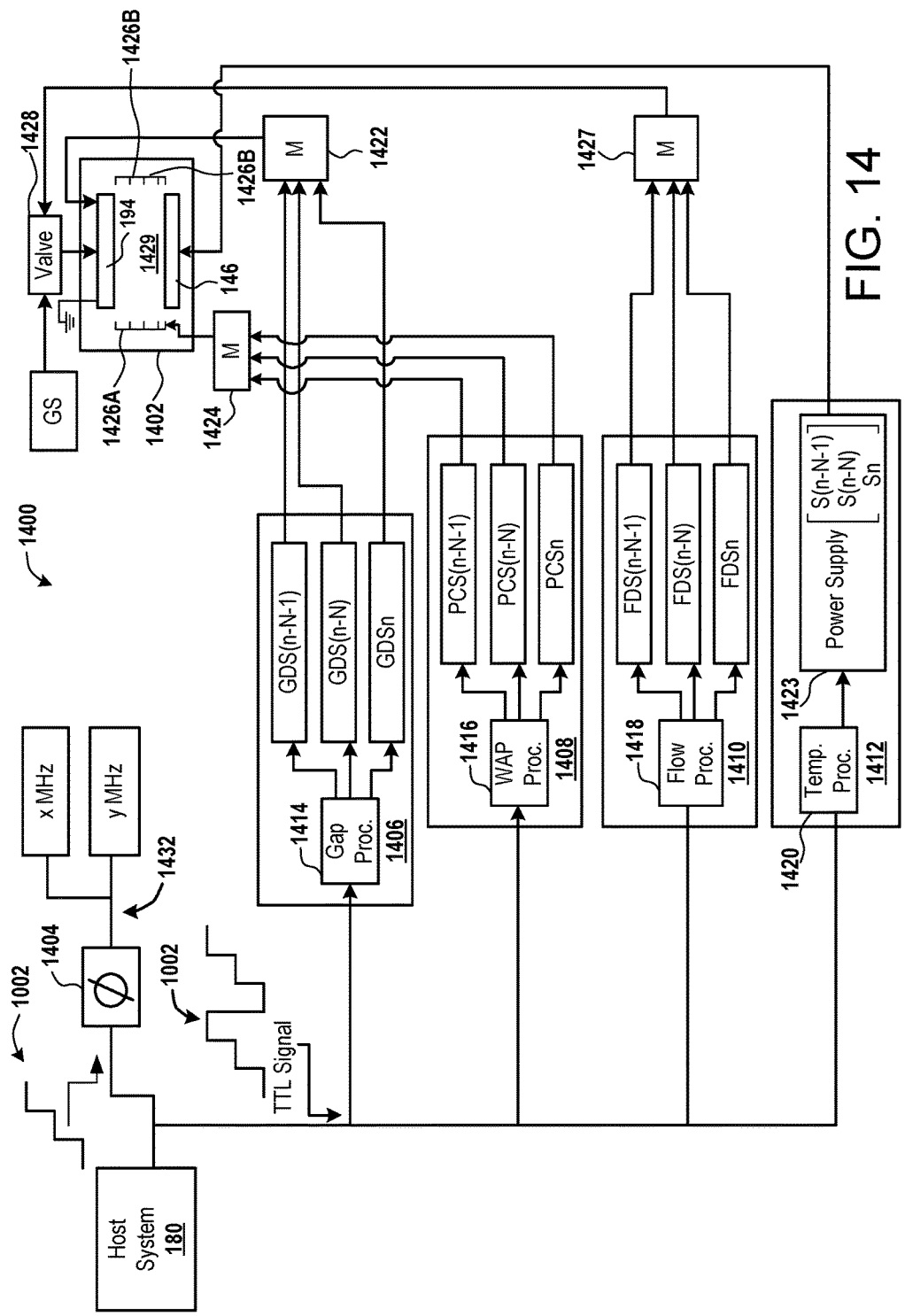
FIG. 14 is a diagram of an embodiment of a plasma system for illustrating an application of multi-state pulsing based on (n−N−1)th, (n−N)th, and nth variables.

FIG. 14 is a diagram of an embodiment of a plasma system 1400 for illustrating an application of multi-state pulsing based on the (n–N–1)th, (n–N)th, and nth variables. The plasma system 1400 includes the plasma system 1000 (FIG. 10A) except that a plasma chamber 1402 is used. The plasma chamber 1402 is an example of the plasma chamber 114 (FIG. 10A). For example, the plasma chamber 114 includes a C-shroud or a confinement ring assembly that surrounds a gap 1429 between the upper electrode 194 and the ESC 146. Plasma is formed within the gap 1429.

The plasma system 1400 further includes a phase delay circuit 1404, a gap control system 1406, a pressure control system 1408, a flow control system 1410, and a temperature control system 1412. The phase delay circuit 1404 is coupled to the DSP 166 (FIG. 10A) of the x MHz RF generator and to the DSP 178 (FIG. 10A) of the y MHz RF generator. The phase delay circuit 1404 is also coupled to the processor of the host system 180.

In some embodiments, instead of the phase delay circuit 1404, a processor, e.g., a processor of the host system 180, etc., generates a phase delay of the digital pulsed signal 1002.

The gap control system 1406 includes a gap processor 1414, a gap driver GDS(n–N–1) for the state S(n–N–1), and a gap driver GDS(n–N) for the state S(n–N), and a gap driver GDSn for the state Sn. The gap processor 1414 is coupled to the processor of the host system 180 and is further coupled to the gap drivers GDS(n–N–1), GDS(n–N), and GDSn. Moreover, the pressure control system 1408 includes a pressure processor 1416, a pressure control PCS(n–N–1) for the state S(n–N–1), a pressure control PCS(n–N) for the state S(n–N), and a pressure control PCSn for the state Sn. The pressure processor 1416 is coupled to the processor of the host system 180 and is also coupled to the pressure control PCS(n–N–1), the pressure control PCS(n–N), and the pressure control PCSn. Also, the flow control system 1410 includes a flow processor 1418, a flow driver FDS(n–N–1) for the state S(n–N–1), a flow driver FDS(n–N) for the state S(n–N), and a flow driver FDSn for the state Sn. The flow processor 1418 is coupled to the processor of the host system 180 and is coupled to the flow drivers FDS(n–N–1), FDS(n–N), and FDSn. The temperature control system 1412 includes a temperature processor 1420 and a power supply 1423 that is coupled to the temperature processor 1420. The power supply 1423 is coupled to the ESC 146, e.g., to a heater, e.g., a resistor, embedded with the ESC 146. The temperature processor 1420 is coupled to the processor of the host system 180.

In some embodiments, a driver or a pressure control includes one or more transistors to generate a current signal.

The plasma system 1400 also includes a motor 1422 that is connected to the gap drivers GDS(n–N–1), GDS(n–N), and GDSn, and to the upper electrode 194, a motor 1424 that is connected to confinement ring portions 1426A and 1426B of the plasma chamber 1402 and to the pressure controls PCS(n–N–1), PCS(n–N), and PCSn, and a motor 1427 that is connected to a valve 1428 and the flow drivers FDS(n–N–1), FDS(n–N), and FDSn. It should be noted that the confinement ring portion 1426A and the confinement ring portion 1426B form the confinement ring assembly. In various embodiments, the confinement ring portions 1426A and 1426B are made of a conductive material, such as, for example, silicon, polysilicon, silicon carbide, boron carbide, ceramic, aluminum, and the like. In various embodiments, in addition to the confinement ring assembly, the gap 1429 is defined by the upper electrode 194, the ESC 146, one or more insulator rings, e.g., dielectric rings, etc., that lie between an electrode and an electrode extension, and the upper and lower electrode extensions.

The motor 1422, the upper electrode 194, and/or the ESC 146 are sometimes referred to herein as gap control mechanical components. Moreover, the motor 1424 and/or the confinement ring assembly are sometimes referred to herein as pressure control mechanical components. Also, the motor 1427, a gas source GS, and/or the valve 1428 are sometimes referred to herein as flow control mechanical components.

In some embodiments, the motor 1422 is connected to the ESC 146 instead of the upper electrode 194 to move the ESC 146 instead of the upper electrode 194. In various embodiments, a motor is connected to the ESC 146 and another motor is connected to the upper electrode 194 and both motors are connected to the gap control system 1406.

Examples of a motor include an electric machine that converts electrical energy into mechanical energy. Other examples of a motor include an alternating current (AC) motor. Yet other examples of a motor include a machine that includes a moving part, such as, a rotor, and a stationary part, such as a stator. There is an air gap between the stator and the rotor.

Examples of a valve include a device that regulates, directs or controls a flow of a gas or a liquid by opening, closing, or partially obstructing a passage way, e.g., a passage of a casing. Other examples of a valve include a hydraulic valve, a manual value, a solenoid valve, a motor valve, and a pneumatic valve.

The digital pulsed signal 1002 is generated by the processor of the host system 180 and provided to the phase delay circuit 1404. The phase delay circuit 1404 receives the digital pulsed signal 1002 and delays the digital pulsed signal 1002 by a pre-determined phase to generate a modified pulsed signal 1432. The phase delay is provided to the digital pulsed signal 1002 to allow time for mechanical components, e.g., the upper electrode 194, the ESC 146, the valve 1428, the motor 1422, the motor 1424, the motor 1427, the confinement ring assembly, etc., of the plasma system 1400 to respond to the digital pulsed signal 1002. The phase delay circuit 1404 delays a phase of the digital pulsed signal 1002 to generate the modified pulsed signal 1432 to further allow the mechanical components of the plasma system 1400 more time compared to the electrical components, e.g., the DSPs, RF power supplies, parameter controls, etc., to respond to the digital pulsed signal 1002.

In various embodiments, a phase delay is added by the phase delay circuit 1404 to shift the digital pulsed signal 1002 to the right on the time t axis to generate the modified pulsed signal 1432 to further allow the mechanical components more time to control a flow of a process gas into the plasma chamber 1402, to control the gap 1428 between the upper electrode 194 and the ESC 146, to control pressure within the plasma chamber 1402, and/or to control temperature within the plasma chamber 1402.

In several embodiments, the digital pulsed signal 1002 is lagging in time compared the modified pulsed signal 1432 to allow more time to the mechanical components than that allowed to the electrical components of the x MHz RF generator and the y MHz RF generator, the communication mediums 110 and 196, the IMC 112, and the RF transmission line 150 to respond to the digital pulsed signal 1002.

The modified pulsed signal 1432 is provided to the DSPs 166 and 178 of the x and y MHz RF generators. Upon receiving the modified pulsed signal 1432, the DSPs 166 and 178 of the x and y MHz RF generators process the modified pulsed signal 1432 in the same manner in which the digital pulsed signal 1002 is processed, which is described above.

In some embodiments, an electrical component responds to a pulsed signal when the electrical component generates an output electrical signal based on the pulsed signal input to the electrical component. In various embodiments, a mechanical component responds to a pulsed signal when the mechanical component performs mechanical movement, e.g., rotates, moves, slides, shifts, closes, opens, etc., in response to the pulsed signal.

When the modified pulsed signal 1432 is received by the DSP 166, the x MHz RF generator generates an RF signal in synchronization with the modified pulsed signal 1432. For example, an envelope of an RF signal generated by an RF generator changes from a first power level to a second power level at a time a state of the modified pulsed signal 1432 transitions from the state S(n−N−1) the state S(n−N) and the envelope changes from the second power level to a third power level at a time the state of the modified pulsed signal 1432 transitions from the state S(n−N) to the state Sn. Similarly, when the modified pulsed signal 1432 is received by the DSP 178, the y MHz RF generator generates an RF signal in synchronization with the modified pulsed signal 1432.

The gap processor 1414 receives the digital pulsed signal 1002 to identify the states S(n−N−1), S(n−N), and Sn from the digital pulsed signal 1002. For example, the gap processor 1414 identifies the S(n−N−1), S(n−N), and Sn from the digital pulsed signal 1002 in a manner similar to that described above in which the DSP 166 and 178 identify the states S(n−N−1), S(n−N), and Sn from the digital pulsed signal 1002.

During the state S(n−N−1), the gap processor 1414 receives a determination whether the (n−N−1)th variable is at the (n−N−1)th threshold of the (n−N−1)th variable from the processor of the host system 180. Upon receiving the determination that the (n−N−1)th variable is not at the (n−N−1)th threshold of the (n−N−1)th variable from the processor of the host system 180, the gap processor 1414 sends a signal to the gap driver GDS(n−N−1) to change, e.g., increase, decrease, etc., the gap 1429 between the upper electrode 194 and the ESC 146 until the (n−N−1)th variable is at the (n−N−1)th threshold. Upon receiving the signal from the gap processor 1414, the gap driver GDS(n−N−1) generates a drive current to send to the motor 1422. Upon receiving the drive current, the motor 1422 rotates to change a vertical position of the upper electrode 194 with respect to the plasma chamber 1402. The vertical position of the upper electrode 194 changes, e.g., increases, decreases, etc., an amount of the gap 1429 to achieve the (n−N−1)th variable for the state S(n−N−1). On the other hand, upon receiving the determination that the (n−N−1)th variable is at the (n−N−1)th threshold of the (n−N−1)th variable from the processor of the host system 180, the gap processor 1414 stops sending a signal to the gap driver GDS(n−N−1) to maintain, e.g., to not increase, to not decrease, etc., an amount of the gap 1429. Upon not receiving the signal from the gap processor 1414, the gap driver GDS(n−N−1) stops generating a drive current to send to the motor 1422. Upon not receiving the drive current, the motor 1422 stops rotating and the vertical position of the upper electrode 194 stops changing to maintain the amount of the gap 1429 at which the (n−N−1)th threshold is achieved.

Similarly, upon receiving the determination that the (n−N)th variable is not at the (n−N)th threshold of the (n−N)th variable from the processor of the host system 180, the gap processor 1414 sends a signal to the gap driver GDS(n−N) to change, e.g., increase, decrease, etc., the gap 1429 between the upper electrode 194 and the ESC 146 until the (n−N)th variable is at the (n−N)th threshold. Upon receiving the signal from the gap processor 1414, the gap driver GDS(n−N) generates a drive current to send to the motor 1422. Upon receiving the drive current, the motor 1422 rotates to change a vertical position of the upper electrode 194 with respect to the plasma chamber 1402. The vertical position of the upper electrode 194 changes, e.g., increases, decreases, etc., an amount of the gap 1429 to achieve the (n−N)th variable for the state S(n−N). On the other hand, upon receiving the determination that the (n−N)th variable is at the (n−N)th threshold of the (n−N)th variable from the processor of the host system 180, the gap processor 1414 stops sending a signal to the gap driver GDS(n−N) to maintain, e.g., to not increase, to not decrease, etc., an amount of the gap 1429. Upon not receiving the signal from the gap processor 1414, the gap driver GDS(n−N) stops generating a drive current to send to the motor 1422. Upon not receiving the drive current, the motor 1422 stops rotating and the vertical position of the upper electrode 194 stops changing to maintain the amount of the gap 1429 at which the (n−N)th threshold is achieved.

Moreover, receiving the determination that the nth variable is not at the nth threshold of the nth variable from the processor of the host system 180, the gap processor 1414 sends a signal to the gap driver GDSn to change, e.g., increase, decrease, etc., the gap 1429 between the upper electrode 194 and the ESC 146 until the nth variable is at the nth threshold. Upon receiving the signal from the gap processor 1414, the gap driver GDSn generates a drive current to send to the motor 1422. Upon receiving the drive current, the motor 1422 rotates to change a vertical position of the upper electrode 194 with respect to the plasma chamber 1402. The vertical position of the upper electrode 194 changes, e.g., increases, decreases, etc., an amount of the gap 1429 to achieve the nth variable for the state Sn. On the other hand, upon receiving the determination that the nth variable is at the nth threshold of the nth variable from the processor of the host system 180, the gap processor 1414 stops sending a signal to the gap driver GDSn to maintain, e.g., to not increase, to not decrease, etc., an amount of the gap 1429. Upon not receiving the signal from the gap processor 1414, the gap driver GDSn stops generating a drive current to send to the motor 1422. Upon not receiving the drive current, the motor 1422 stops rotating and the vertical position of the upper electrode 194 stops changing to maintain the amount of the gap 1429 at which the nth threshold is achieved.

In a manner similar to that described above with respect to the gap processor 1414, the pressure processor 1416 receives the digital pulsed signal 1002 to identify the states S(n−N−1), S(n−N), and Sn from the digital pulsed signal 1002. During the state S(n−N−1), the pressure processor 1416 receives a determination whether the (n−N−1)th variable is at the (n−N−1)th threshold of the (n−N−1)th variable from the processor of the host system 180. Upon receiving the determination that the (n−N−1)th variable is not at the (n−N−1)th threshold of the (n−N−1)th variable from the processor of the host system 180, the pressure processor 1416 sends a signal to the pressure control PCS(n−N−1) to change, e.g., increase, decrease, etc., an amount of pressure in the gap 1429 of the plasma chamber 1402 until the (n−N−1)th variable is at the (n−N−1)th threshold. Upon receiving the signal from the pressure processor 1416, the pressure control PCS(n−N−1) generates a drive current to send to the motor 1424. Upon receiving the drive current, the motor 1424 rotates to change a vertical position of the confinement ring assembly with respect to the gap 1429. The vertical position of the confinement ring assembly changes, e.g., increases, decreases, etc., an amount of pressure within the gap 1429 to achieve the (n−N−1)th variable for the state S(n−N−1). On the other hand, upon receiving the determination that the (n−N−1)th variable is at the (n−N−1)th threshold of the (n−N−1)th variable from the processor of the host system 180, the pressure processor 1416 stops sending a signal to the pressure control PCS(n−N−1) to maintain, e.g., to not increase, to not decrease, etc., an amount of pressure within the gap 1429. Upon not receiving the signal from the pressure processor 1416, the pressure control PCS(n−N−1) stops generating a drive current to send to the motor 1424. Upon not receiving the drive current, the motor 1424 stops rotating and the vertical position of the confinement ring assembly stops changing to maintain the amount of the pressure, in the gap 1429, at which the (n−N−1)th threshold is achieved.

Moreover, during the state S(n−N), the pressure processor 1416 receives a determination whether the (n−N)th variable is at the (n−N)th threshold of the (n−N)th variable from the processor of the host system 180. Upon receiving the determination that the (n−N)th variable is not at the (n−N)th threshold of the (n−N)th variable from the processor of the host system 180, the pressure processor 1416 sends a signal to the pressure control PCS(n−N) to change, e.g., increase, decrease, etc., an amount of pressure in the gap 1429 of the plasma chamber 1402 until the (n−N)th variable is at the (n−N)th threshold. Upon receiving the signal from the pressure processor 1416, the pressure control PCS(n−N) generates a drive current to send to the motor 1424. Upon receiving the drive current, the motor 1424 rotates to change a vertical position of the confinement ring assembly with respect to the gap 1429. The vertical position of the confinement ring assembly changes, e.g., increases, decreases, etc., an amount of pressure within the gap 1429 to achieve the (n−N)th variable for the state S(n−N). On the other hand, upon receiving the determination that the (n−N)th variable is at the (n−N)th threshold of the (n−N)th variable from the processor of the host system 180, the pressure processor 1416 stops sending a signal to the pressure control PCS(n−N) to maintain, e.g., to not increase, to not decrease, etc., an amount of pressure within the gap 1429. Upon not receiving the signal from the pressure processor 1416, the pressure control PCS(n−N) stops generating a drive current to send to the motor 1424. Upon not receiving the drive current, the motor 1424 stops rotating and the vertical position of the confinement ring assembly stops changing to maintain the amount of the pressure, in the gap 1429, at which the (n−N)th threshold is achieved.

Also, during the state Sn, the pressure processor 1416 receives a determination whether the nth variable is at the nth threshold of the nth variable from the processor of the host system 180. Upon receiving the determination that the nth variable is not at the nth threshold of the nth variable from the processor of the host system 180, the pressure processor 1416 sends a signal to the pressure control PCSn to change, e.g., increase, decrease, etc., an amount of pressure in the gap 1429 of the plasma chamber 1402 until the nth variable is at the nth threshold. Upon receiving the signal from the pressure processor 1416, the pressure control PCSn generates a drive current to send to the motor 1424. Upon receiving the drive current, the motor 1424 rotates to change a vertical position of the confinement ring assembly with respect to the gap 1429. The vertical position of the confinement ring assembly changes, e.g., increases, decreases, etc., an amount of pressure within the gap 1429 to achieve the nth variable for the state Sn. On the other hand, upon receiving the determination that the nth variable is at the nth threshold of the nth variable from the processor of the host system 180, the pressure processor 1416 stops sending a signal to the pressure control PCSn to maintain, e.g., to not increase, to not decrease, etc., an amount of pressure within the gap 1429. Upon not receiving the signal from the pressure processor 1416, the pressure control PCSn stops generating a drive current to send to the motor 1424. Upon not receiving the drive current, the motor 1424 stops rotating and the vertical position of the confinement ring assembly stops changing to maintain the amount of the pressure, in the gap 1429, at which the nth threshold is achieved.

In various embodiments in which the motor 1424 is connected to the confinement ring assembly from a bottom side of the confinement ring assembly, the vertical position of the confinement ring assembly is changed to move the confinement rings up or down within the plasma chamber 1402. The confinement ring assembly moves up to cover a greater amount of the gap 1429 and moves down to cover a less amount of the gap 1429.

In several embodiments, the motor 1424 is connected to the confinement rings from a top side of the confinement ring assembly. The confinement ring assembly moves down to cover a greater amount of the gap 1429 and moves up to cover a less amount of the gap 1429.

In some embodiments, the motor 1424 is connected to the confinement ring assembly via a rod and confinement rings of the confinement ring assembly are spaced between and connected to grooves of the rod. As the rotor of the motor 1424 rotates, the rod protrudes or recesses from the motor to change a vertical position of the confinement ring assembly.

Moreover, the flow processor 1418 receives the digital pulsed signal 1002 and identifies the states S(n−N−1), S(n−N), and Sn of the digital pulsed signal 1002 in a manner similar to that of a DSP identifying the states S(n−N−1), S(n−N), and Sn of the digital pulsed signal 1002. During the state S(n−N−1), the flow processor 1418 receives a determination whether the (n−N−1)th variable is at the (n−N−1)th threshold of the (n−N−1)th variable from the processor of the host system 180. Upon receiving the determination that the (n−N−1)th variable is not at the (n−N−1)th threshold of the (n−N−1)th variable from the processor of the host system 180, the flow processor 1418 sends a signal to the flow driver FDS(n−N−1) to change, e.g., increase, decrease, etc., a flow rate of one or more process gases to the plasma chamber 1402 until the (n−N−1)th variable is at the (n−N−1)th threshold. Upon receiving the signal from the flow processor 1418, the flow driver FDS(n−N−1) generates a drive current to send to the motor 1427. Upon receiving the drive current, the motor 1427 rotates to change a position of the valve 1428 within a casing, e.g., enclosure, tube, pipe, etc., in which the valve 1428 is situated to open or close a passage of the casing. The position of the valve 1428 changes, e.g., increases, decreases, etc., the flow rate of one or more process gases into the gap 1429 to achieve the (n−N−1)th variable for the state S(n−N−1). On the other hand, upon receiving the determination that the (n−N−1)th variable is at the (n−N−1)th threshold of the (n−N−1)th variable from the processor of the host system 180, the flow processor 1418 stops sending a signal to the flow driver FDS(n−N−1) to maintain, e.g., to not increase, to not decrease, etc., a flow rate of one or more process gases to the plasma chamber 1402. Upon not receiving the signal from the flow processor 1418, the flow driver FDS(n−N−1) stops generating a drive current to send to the motor 1427. Upon not receiving the drive current, the motor 1427 stops rotating and a position of the valve 1428 within the casing in which the valve 1428 is situated stops changing to maintain the flow rate of one or more process gases into the gap 1429 at which the (n−N−1)th threshold is achieved.

A process gas or a mixture of process gases is stored in the gas source GS and supplied via the passage of the casing to the plasma chamber 1402. The gas source GS is coupled to the plasma chamber 1402 via the valve 1428. When one or more process gases are supplied to the gap 1429 and a modified RF signal is received by the ESC 146 via the RF transmission line 150 (FIG. 10A), plasma is generated or maintained in the plasma chamber 1402. In some embodiments, the motor 1427 is connected to the valve 1428 via a rod to change a position of the valve with a rotation of a rotor of the motor 1427.

Similarly, during the state S(n−N), the flow processor 1418 receives a determination whether the (n−N)th variable is at the (n−N)th threshold of the (n−N)th variable from the processor of the host system 180. Upon receiving the determination that the (n−N)th variable is not at the (n−N)th threshold of the (n−N)th variable from the processor of the host system 180, the flow processor 1418 sends a signal to the flow driver FDS(n−N) to change, e.g., increase, decrease, etc., a flow rate of one or more process gases to the plasma chamber 1402 until the (n−N)th variable is at the (n−N)th threshold. Upon receiving the signal from the flow processor 1418, the flow driver FDS(n−N) generates a drive current to send to the motor 1427. Upon receiving the drive current, the motor 1427 rotates to change a position of the valve 1428 within the casing in which the valve 1428 is situated to open or close a passage of the casing. The position of the valve 1428 changes, e.g., increases, decreases, etc., the flow rate of one or more process gases into the gap 1429 to achieve the (n−N)th variable for the state S(n−N). On the other hand, upon receiving the determination that the (n−N)th variable is at the (n−N)th threshold of the (n−N)th variable from the processor of the host system 180, the flow processor 1418 stops sending a signal to the flow driver FDS(n−N) to maintain, e.g., to not increase, to not decrease, etc., a flow rate of one or more process gases to the plasma chamber 1402. Upon not receiving the signal from the flow processor 1418, the flow driver FDS(n−N) stops generating a drive current to send to the motor 1427. Upon not receiving the drive current, the motor 1427 stops rotating and a position of the valve 1428 within the casing in which the valve 1428 is situated stops changing to maintain the flow rate of one or more process gases into the gap 1429 at which the (n−N)th threshold is achieved.

Moreover, during the state Sn, the flow processor 1418 receives a determination whether the nth variable is at the nth threshold of the nth variable from the processor of the host system 180. Upon receiving the determination that the nth variable is not at the nth threshold of the nth variable from the processor of the host system 180, the flow processor 1418 sends a signal to the flow driver FDSn to change, e.g., increase, decrease, etc., a flow rate of one or more process gases to the plasma chamber 1402 until the nth variable is at the nth threshold. Upon receiving the signal from the flow processor 1418, the flow driver FDSn generates a drive current to send to the motor 1427. Upon receiving the drive current, the motor 1427 rotates to change a position of the valve 1428 within a casing, e.g., enclosure, tube, pipe, etc., in which the valve 1428 is situated to open or close a passage of the casing. The position of the valve 1428 changes, e.g., increases, decreases, etc., the flow rate of one or more process gases into the gap 1429 to achieve the nth variable for the state Sn. On the other hand, upon receiving the determination that the nth variable is at the nth threshold of the nth variable from the processor of the host system 180, the flow processor 1418 stops sending a signal to the flow driver FDSn to maintain, e.g., to not increase, to not decrease, etc., a flow rate of one or more process gases to the plasma chamber 1402. Upon not receiving the signal from the flow processor 1418, the flow driver FDSn does not generate a drive current to send to the motor 1427. Upon not receiving the drive current, the motor 1427 stops rotating and a position of the valve 1428 within the casing in which the valve 1428 is situated stops changing to maintain the flow rate of one or more process gases into the gap 1429 at which the nth threshold is achieved.

In some embodiments, any number of gas sources is used in the plasma system 1400. Each gas source stores a different process gas. For example, one gas source stores a fluorine-containing gas and another gas source stores an oxygen-containing gas. Each gas source is connected via a corresponding valve to the plasma chamber 1402 to supply a gas, e.g., a process gas, an inert gas, etc., to the plasma chamber 1402. A casing includes a valve that is connected to and controlled by a motor, which is further connected to and controlled by the flow drivers FDS(n−N−1), FDS(n−N), and FDSn.

Moreover, the temperature processor 1420 receives the digital pulsed signal 1002 and identifies the states S(n−N−1), S(n−N), and Sn of the digital pulsed signal 1002 in a manner similar to that of a DSP identifying the states S(n−N−1), S(n−N), and Sn of the digital pulsed signal 1002. During the state S(n−N−1), the temperature processor 1420 receives a determination whether the (n−N−1)th variable is at the (n−N−1)th threshold of the (n−N−1)th variable from the processor of the host system 180. Upon receiving the determination that the (n−N−1)th variable is not at the (n−N−1)th threshold of the (n−N−1)th variable from the processor of the host system 180, the temperature processor 1420 sends a signal to the power supply 1423 to change, e.g., increase, decrease, etc., a temperature within the gap 1429 of the plasma chamber 1402 until the (n−N−1)th variable is at the (n−N−1)th threshold. Upon receiving the signal from the temperature processor 1420, the power supply 1423 generates a power signal to send to the heater of the ESC 146. Upon receiving the power signal, the heater of the ESC 146 heats or cools. The heating or cooling of the heater changes, e.g., increases, decreases, etc., a temperature within the gap 1429 to achieve the (n−N−1)th variable for the state S(n−N−1). On the other hand, upon receiving the determination that the (n−N−1)th variable is at the (n−N−1)th threshold of the (n−N−1)th variable from the processor of the host system 180, the temperature processor 1420 sends a signal to the power supply 1423 to maintain, e.g., to not increase, to not decrease, etc., a temperature within the gap 1429 of the plasma chamber 1402. Upon receiving the signal from the temperature processor 1420, the power supply 1423 generates a power signal to send to the heater of the ESC 146. Upon receiving the power signal, the heater of the ESC 146 stays heated or cooled at a level so that the temperature in the gap 1429 facilitates maintaining the (n−N−1)th threshold.

Similarly, during the state S(n−N), the temperature processor 1420 receives a determination whether the (n−N)th variable is at the (n−N)th threshold of the (n−N)th variable from the processor of the host system 180. Upon receiving the determination that the (n−N)th variable is not at the (n−N)th threshold of the (n−N)th variable from the processor of the host system 180, the temperature processor 1420 sends a signal to the power supply 1423 to change, e.g., increase, decrease, etc., a temperature within the gap 1429 of the plasma chamber 1402 until the (n–N)th variable is at the (n–N)th threshold. Upon receiving the signal from the temperature processor 1420, the power supply 1423 generates a power signal to send to the heater of the ESC 146. Upon receiving the power signal, the heater of the ESC 146 heats or cools. The heating or cooling of the heater changes, e.g., increases, decreases, etc., a temperature within the gap 1429 to achieve the (n–N)th variable for the state S(n–N). On the other hand, upon receiving the determination that the (n–N–1)th variable is at the (n–N)th threshold of the (n–N)th variable from the processor of the host system 180, the temperature processor 1420 sends a signal to the power supply 1423 to maintain, e.g., to not increase, to not decrease, etc., a temperature within the gap 1429 of the plasma chamber 1402. Upon receiving the signal from the temperature processor 1420, the power supply 1423 generates a power signal to send to the heater of the ESC 146. Upon receiving the power signal, the heater of the ESC 146 stays heated or cooled at a level so that the temperature in the gap 1429 facilitates maintaining the (n–N)th threshold.

Also, during the state Sn, the temperature processor 1420 receives a determination whether the nth variable is at the nth threshold of the nth variable from the processor of the host system 180. Upon receiving the determination that the nth variable is not at the nth threshold of the nth variable from the processor of the host system 180, the temperature processor 1420 sends a signal to the power supply 1423 to change, e.g., increase, decrease, etc., a temperature within the gap 1429 of the plasma chamber 1402 until the nth variable is at the nth threshold. Upon receiving the signal from the temperature processor 1420, the power supply 1423 generates a power signal to send to the heater of the ESC 146. Upon receiving the power signal, the heater of the ESC 146 heats or cools. The heating or cooling of the heater changes, e.g., increases, decreases, etc., a temperature within the gap 1429 to achieve the nth variable for the state Sn. On the other hand, upon receiving the determination that the nth variable is at the nth threshold of the nth variable from the processor of the host system 180, the temperature processor 1420 sends a signal to the power supply 1423 to maintain, e.g., to not increase, to not decrease, etc., a temperature within the gap 1429 of the plasma chamber 1402. Upon receiving the signal from the temperature processor 1420, the power supply 1423 generates a power signal to send to the heater of the ESC 146. Upon receiving the power signal, the heater of the ESC 146 stays heated or cooled at a level so that the temperature in the gap 1429 facilitates maintaining the nth threshold.

In some embodiments, instead of receiving the determination whether the (n–N–1)th variable is at the (n–N–1)th threshold of the (n–N–1)th variable from the processor of the host system 180, the determination whether the (n–N–1)th variable, e.g., a value of the (n–N–1)th variable, is within a pre-determined range from the (n–N–1)th threshold of the (n–N–1)th variable is received by the gap processor 1414, the pressure processor 1416, the flow processor 1418, and the temperature processor 1420 from the processor of the host system 180. Moreover, the operations described herein as being performed by the gap processor 1414, the gap driver GDS(n–N–1), the motor 1422, and the upper electrode 194 in response to whether the (n–N–1)th variable is at the (n–N–1)th threshold of the (n–N–1)th variable are performed in response to the determination whether the (n–N–1)th variable is within the pre-determined range from the (n–N–1)th threshold of the (n–N–1)th variable. For example, in response to receiving the determination that the (n–N–1)th variable is outside the pre-determined range from the (n–N–1)th threshold of the (n–N–1)th variable, the gap processor 1414 sends a signal to the gap driver GDS(n–N–1) to change, e.g., increase, decrease, etc., the gap 1429 between the upper electrode 194 and the ESC 146 until the (n–N–1)th variable is within the pre-determined range from the (n–N–1)th threshold. On the other hand, in response to receiving the determination that the (n–N–1)th variable is within the pre-determined range from the (n–N–1)th threshold of the (n–N–1)th variable from the processor of the host system 180, the gap processor 1414 stops sending a signal to the gap driver GDS(n–N–1) to maintain, e.g., to not increase, to not decrease, etc., an amount of the gap 1429. Similarly, the operations described herein as being performed by the pressure processor 1416, the pressure control PCS(n–N–1), the motor 1424, and the confinement ring assembly in response to whether the (n–N–1)th variable is at the (n–N–1)th threshold of the (n–N–1)th variable are performed in response to the determination whether the (n–N–1)th variable is within the pre-determined range from the (n–N–1)th threshold of the (n–N–1)th variable. Also, the operations described herein as being performed by the flow processor 1418, the flow driver FDS(n–N–1), the motor 1427, and the valve 1428 in response to whether the (n–N–1)th variable is at the (n–N–1)th threshold of the (n–N–1)th variable are performed in response to the determination whether the (n–N–1)th variable is within the pre-determined range from the (n–N–1)th threshold of the (n–N–1)th variable. The operations described herein as being performed by the temperature processor 1420, the power supply 1423, and the heater of the ESC 146 in response to whether the (n–N–1)th variable is at the (n–N–1)th threshold of the (n–N–1)th variable are performed in response to the determination whether the (n–N–1)th variable is within the pre-determined range from the (n–N–1)th threshold of the (n–N–1)th variable.

Similarly, in these embodiments, instead of receiving the determination whether the (n–N)th variable is at the (n–N)th threshold of the (n–N)th variable from the processor of the host system 180, the determination whether the (n–N)th variable, e.g., a value of the (n–N)th variable, is within a pre-determined range from the (n–N)th threshold of the (n–N)th variable is received by the gap processor 1414, the pressure processor 1416, the flow processor 1418, and the temperature processor 1420 from the processor of the host system 180. Moreover, the operations described herein as being performed by the gap processor 1414, the gap driver GDS(n–N), the motor 1422, and the upper electrode 194 in response to whether the (n–N)th variable is at the (n–N)th threshold of the (n–N)th variable are performed in response to the determination whether the (n–N)th variable is within the pre-determined range from the (n–N)th threshold of the (n–N)th variable. For example, in response to receiving the determination that the (n–N)th variable is outside the pre-determined range from the (n–N)th threshold of the (n–N)th variable, the gap processor 1414 sends a signal to the gap driver GDS(n–N) to change, e.g., increase, decrease, etc., the gap 1429 between the upper electrode 194 and the ESC 146 until the (n–N)th variable is within the pre-determined range from the (n–N)th threshold. On the other hand, in response to receiving the determination that the (n–N)th variable is within the pre-determined range from the (n–N–1)th threshold of the (n–N)th variable from the processor of the host system 180, the gap processor 1414 stops sending a signal to the gap driver GDS(n–N) to maintain, e.g., to not increase, to not decrease, etc., an amount of the gap 1429. Similarly, the operations described herein as being performed by the pressure processor 1416, the pressure control PCS(n–N), the motor 1424, and the confinement ring assembly in response to whether the (n–N)th variable is at the (n–N)th threshold of the (n–N)th variable are performed in response to the determination whether the (n–N)th variable is within the pre-determined range from the (n–N)th threshold of the (n–N)th variable. Also, the operations described herein as being performed by the flow processor 1418, the flow driver FDS(n–N), the motor 1427, and the valve 1428 in response to whether the (n–N)th variable is at the (n–N)th threshold of the (n–N)th variable are performed in response to the determination whether the (n–N)th variable is within the pre-determined range from the (n–N)th threshold of the (n–N)th variable. The operations described herein as being performed by the temperature processor 1420, the power supply 1423, and the heater of the ESC 146 in response to whether the (n–N)th variable is at the (n–N)th threshold of the (n–N)th variable are performed in response to the determination whether the (n–N)th variable is within the pre-determined range from the (n–N)th threshold of the (n–N)th variable.

Similarly, in these embodiments, instead of receiving the determination whether the nth variable is at the nth threshold of the nth variable from the processor of the host system 180, the determination whether the nth variable, e.g., a value of the nth variable, is within a pre-determined range from the nth threshold of the nth variable is received by the gap processor 1414, the pressure processor 1416, the flow processor 1418, and the temperature processor 1420 from the processor of the host system 180. Moreover, the operations described herein as being performed by the gap processor 1414, the gap driver GDSn, the motor 1422, and the upper electrode 194 in response to whether the nth variable is at the nth threshold of the nth variable are performed in response to the determination whether the nth variable is within the pre-determined range from the nth threshold of the nth variable. For example, in response to receiving the determination that the nth variable is outside the pre-determined range from the nth threshold of the nth variable, the gap processor 1414 sends a signal to the gap driver GDSn to change, e.g., increase, decrease, etc., the gap 1429 between the upper electrode 194 and the ESC 146 until the nth variable is within the pre-determined range from the nth threshold. On the other hand, in response to receiving the determination that the nth variable is within the pre-determined range from the nth threshold of the nth variable from the processor of the host system 180, the gap processor 1414 stops sending a signal to the gap driver GDSn to maintain, e.g., to not increase, to not decrease, etc., an amount of the gap 1429. Similarly, the operations described herein as being performed by the pressure processor 1416, the pressure control PCSn, the motor 1424, and the confinement ring assembly in response to whether the nth variable is at the nth threshold of the nth variable are performed in response to the determination whether the nth variable is within the pre-determined range from the nth threshold of the nth variable. Also, the operations described herein as being performed by the flow processor 1418, the flow driver FDSn, the motor 1427, and the valve 1428 in response to whether the nth variable is at the nth threshold of the nth variable are performed in response to the determination whether the nth variable is within the pre-determined range from the nth threshold of the nth variable. The operations described herein as being performed by the temperature processor 1420, the power supply 1423, and the heater of the ESC 146 in response to whether the nth variable is at the nth threshold of the nth variable are performed in response to the determination whether the nth variable is within the pre-determined range from the nth threshold of the nth variable.

It should be noted that although the above-described embodiments relate to providing an RF signal to the lower electrode of the ESC 146 (FIGS. 2 and 10A) and grounding the upper electrode 194 (FIGS. 2 and 10A), in several embodiments, the RF signal is provided to the upper electrode 194 while the lower electrode of the ESC 146 is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller, described herein, is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, a plasma-enhanced chemical vapor deposition (PECVD) chamber or module, a clean type chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for applying different variables during different states, comprising:
   determining whether a state associated with a plasma system is a first state, a second state, or a third state;
   determining a first variable for the first state in response to determining that the state associated with the plasma system is the first state;
   determining a second variable for the second state in response to determining that the state associated with the plasma system is the second state;
   determining a third variable for the third state in response to determining that the state associated with the plasma system is the third state, wherein said determining the first variable for the first state, the second variable for the second state, and the third variable for the third state facilitates achieving an increased control of a radio frequency (RF) generator of the plasma system compared to that achieved for the first and second states;
determining whether the first variable is within a range from a threshold value of the first variable;
determining whether the second variable is within a range from a threshold value of the second variable;
determining whether the third variable is within a range from a threshold value of the third variable;
providing an instruction to maintain power supplied by the RF generator upon determining that the first variable is within the range from the threshold value of the first variable; and
providing an instruction to change the power supplied by the RF generator upon determining that the first variable is outside the range from the threshold value of the first variable.

2. The method of claim 1, further comprising:
providing an instruction to maintain the power supplied by the RF generator of the plasma system upon determining that the second variable is within the range from the threshold value of the second variable;
providing an instruction to change the power supplied by the RF generator upon determining that the second variable is outside the range from the threshold value of the second variable.

3. The method of claim 2, further comprising:
providing an instruction to maintain the power supplied by the RF generator of the plasma system upon determining that the third variable is within the range from the threshold value of the third variable;
providing an instruction to change the power supplied by the RF generator upon determining that the third variable is outside the range from the threshold value of the third variable.

4. The method of claim 1, further comprising:
providing an instruction to maintain a flow rate of gas provided to a plasma chamber of the plasma system in response to determining that the first variable is within the range from the threshold value of the first variable or the second variable is within the range from the threshold value of the second variable or the third variable is within the range from the threshold value of the third variable;
providing an instruction to change the flow rate of gas provided to the plasma chamber in response to determining that the first variable is outside the range from the threshold value of the first variable or the second variable is outside the range from the threshold value of the second variable or the third variable is outside the range from the threshold value of the third variable.

5. The method of claim 1, further comprising:
providing an instruction to maintain an amount of pressure within a plasma chamber of the plasma system in response to determining that the first variable is within the range from the threshold value of the first variable or the second variable is within the range from the threshold value of the second variable or the third variable is within the range from the threshold value of the third variable;
providing instruction to change the amount of pressure within the plasma chamber in response to determining that the first variable is outside the range from the threshold value of the first variable or the second variable is outside the range from the threshold value of the second variable or the third variable is outside the range from the threshold value of the third variable.

6. The method of claim 1, further comprising:
providing an instruction to maintain an amount of gap between an upper electrode within a plasma chamber of the plasma system and a chuck of the plasma chamber in response to determining that the first variable is within the range from the threshold value of the first variable or the second variable is within the range from the threshold value of the second variable or the third variable is within the range from the threshold value of the third variable;
providing an instruction to change the amount of gap within the plasma chamber in response to determining that the first variable is outside the range from the threshold value of the first variable or the second variable is outside the range from the threshold value of the second variable or the third variable is outside the range from the threshold value of the third variable.

7. The method of claim 1, further comprising:
providing an instruction to maintain an amount of temperature within a plasma chamber of the plasma system in response to determining that the first variable is within the range from the threshold value of the first variable or the second variable is within the range from the threshold value of the second variable or the third variable is within the range from the threshold value of the third variable;
providing an instruction to change the amount of temperature within the plasma chamber in response to determining that the first variable is outside the range from the threshold value of the first variable or the second variable is outside the range from the threshold value of the second variable or the third variable is outside the range from the threshold value of the third variable.

8. The method of claim 1, wherein said determining the first variable comprises:
receiving a measurement of the first variable from an output of the RF generator;
propagating the measurement via a computer-generated model of a portion of the plasma system to calculate a value of the first variable at a model node of the computer generated model.

9. The method of claim 1, wherein said determining the first variable is performed based on an electrical signal received from an optical sensor directed towards a plasma chamber of the plasma system.

10. The method of claim 1, wherein the first, second, and third states occur during a clock cycle of a clock signal.

11. The method of claim 1, wherein the first state is associated with a first process for processing a substrate, wherein the second state is associated with a second process for processing the substrate, and the third state is associated with a third process for processing the substrate.

12. The method of claim 1, further comprising:
determining whether the first variable changes to be less than a predetermined limit over multiple clock cycles of a clock signal;
providing an instruction to change the power upon determining that the first variable changes to be less than the predetermined limit.

13. A non-transitory computer readable medium containing program instructions, wherein execution of the program instructions by one or more processors of a computer system causes the one or more processors to carry out a plurality of operations of:

determining whether a state associated with a plasma system is a first state, a second state, or a third state;

determining a first variable for the first state in response to determining that the state associated with the plasma system is the first state;

determining a second variable for the second state in response to determining that the state associated with the plasma system is the second state;

determining a third variable for the third state in response to determining that the state associated with the plasma system is the third state, wherein said determining the first variable for the first state, the second variable for the second state, and the third variable for the third state facilitates achieving an increased control of a radio frequency (RF) generator of the plasma system compared to that achieved for the first and second states;

determining whether the first variable is within a range from a threshold value of the first variable;

determining whether the second variable is within a range from a threshold value of the second variable;

determining whether the third variable is within a range from a threshold value of the third variable;

providing an instruction to maintain power supplied by the RF generator upon determining that the first variable is within the range from the threshold value of the first variable; and providing an instruction to change the power supplied by the RF generator upon determining that the first variable is outside the range from the threshold value of the first variable.

14. The non-transitory computer readable medium of claim 13, wherein the operations further comprise:

providing an instruction to maintain the power supplied by the RF generator of the plasma system upon determining that the second variable is within the range from the threshold value of the second variable;

providing an instruction to change the power supplied by the RF generator upon determining that the second variable is outside the range from the threshold value of the second variable.

15. The non-transitory computer readable medium of claim 13, wherein the operations further comprise:

providing an instruction to maintain the power supplied by the RF generator of the plasma system upon determining that the third variable is within the range from the threshold value of the third variable;

providing an instruction to change the power supplied by the RF generator upon determining that the third variable is outside the range from the threshold value of the third variable.

* * * * *